(12) United States Patent  
Hollenberg et al.

(10) Patent No.: US 8,148,715 B2  
(45) Date of Patent: *Apr. 3, 2012

(54) SOLID STATE CHARGE QUBIT DEVICE

(75) Inventors: Lloyd Christopher Leonard Hollenberg, Richmond (AU); Andrew Steven Dzurak, Darlinghurst (AU); Cameron Wellard, Nth. Carlton (AU); Alexander Rudolf Hamilton, Forestville (AU); David J. Reilly, Allawah (AU); Gerard J. Milburn, St. Lucia (AU); Robert Graham Clark, Balgowah Heights (AU)

(73) Assignee: Quocor Pty. Ltd., New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/660,085

(22) Filed: Feb. 19, 2010

(65) Prior Publication Data

US 2011/0049475 A1    Mar. 3, 2011

Related U.S. Application Data

(63) Continuation of application No. 10/524,951, filed on Dec. 8, 2005, now Pat. No. 7,732,804.

(51) Int. Cl.  
*H01L 31/00* (2006.01)

(52) U.S. Cl. ............... 257/14; 257/9; 257/24; 257/288; 257/E29.168; 257/E45.005; 257/E49.003; 977/933

(58) Field of Classification Search ............... 257/9, 14, 257/24, 288, E29.168, E45.005, E49.003; 977/933  
See application file for complete search history.

(56) References Cited

U.S. PATENT DOCUMENTS

| 6,369,404 | B1 * | 4/2002 | Kane ............................ 257/14 |
| 7,732,804 | B2 * | 6/2010 | Hollenberg et al. ............ 257/14 |

* cited by examiner

*Primary Examiner* — Jay C Kim  
(74) *Attorney, Agent, or Firm* — Wood, Phillips, Katz, Clark & Mortimer

(57) ABSTRACT

This invention concerns a quantum device, suitable for quantum computing, based on dopant atoms located in a solid semiconductor or insulator substrate. In further aspects the device is scaled up. The invention also concerns methods of reading out from the devices, initializing them, using them to perform logic operations and making them.

17 Claims, 18 Drawing Sheets

SOLID STATE CHARGE QUBIT DEVICE

CROSS REFERENCE TO RELATED APPLICATION

This application is a continuation of Utility application Ser. No. 10/524,951, filed Dec. 8, 2005 now U.S. Pat. No. 7,732,804.

TECHNICAL FIELD

This invention concerns a quantum device, suitable for quantum computing, based on dopant atoms located in a solid semiconductor or insulator substrate. In further aspects the device is scaled up. The invention also concerns methods of reading out from the devices, initializing them, using them to perform logic operations and making them.

BACKGROUND ART

There are a number of existing proposals for quantum computing (QC) based on charge qubits in the solid-state. There is also the Kane proposal for a real spin quantum device based upon phosphorus donor atoms in silicon. Proposals relevant to this invention are now presented in chronological order:
Logical devices implemented using quantum cellular automata,
P. D. Tougaw and C. S. Lent, J. Appl. Phys. 75, 1818 (1994).
Conditional quantum dynamics and logic gates,
A. Barenco, D. Deutsch, Ekert and Joszа, *Phys. Rev. Lett.* 74, 4083 (1995).
Minimal energy requirements in communication,
R. Landauer, *Science* 272, 1914 (1996).
Coupled quantum dots as quantum XOR gate,
J. A. Brum and P. Hawrylak, *Superlattices and Microstr.* 22, 431 (1997).
Quantum information in semiconductors: Noiseless encoding in a quantum-dot array,
P. Zanardi and F. Rossi, *Phys. Rev. Lett.* 81, 4752 (1998).
Quantum computation with quantum dots,
D. Loss and D. P. DiVincenzo, *Phys. Rev. A* 57, 120 (1998).
A silicon-based nuclear spin quantum computer,
B. E. Kane, *Nature* 393, 133 (1998).
Microwave spectroscopy of a quantum-dot molecule,
T. H. Oosterkamp, T. Fujisawa, W. G. van der Wiel, K. Ishibashi, R. V. Hijman, S. Tarucha and L. P. Kouwenhoven, *Nature* 395, 873 (1998).
Dephasing in open quantum dots,
A. G. Huibers, M. Switkes, C. M. Marcus, K. Campman and A. C. Gossard, *Phys. Rev. Lett.* 81, 200 (1998).
Coupled quantum dots as quantum gates,
G. Burkard, D. Loss and D. P. DiVincenzo, *Phys. Rev. B* 59, 2070 (1999).
Quantum gates by coupled asymmetric quantum dots and CNOT-gate operation,
T. Tanamoto, *Phys. Rev. A* 61, 022305 (2000).
Coherent properties of a two-level system based on a quantum-dot photodiode,
A. Zrenner, E. Beham, S. Stufler, F. Findeis, M. Bichler and G. Abstrieter, *Nature* 418, 612 (2002).
High coherent solid-state qubit from a pair of quantum dots,
Xin-Qi Li and YiJing Yan, quant-ph/0204027 (2002).
Two-electron quantum dots as scalable qubits,
J. H. Jefferson, M. Feam, D. L. J. Tipton and T. P. Spiller, quant-ph/0206075 (2002).

The potential of quantum information processing relies on one of the most fragile resources in nature—quantum entanglement. Even without the destructive influence of environmental decoherence a practical quantum computer requires hundreds, if not thousands of gates to perform useful tasks. Since a system of qubits can never be totally isolated from the environment, error-correcting schemes must be incorporated in the design and encoding of the qubits, further increasing the number of qubits required.

The real challenge is to prove the principle of QC in a technology which is inherently scalable. This does not simply mean the ability to make a large number of interconnected qubits. The concept of scalability requires that the error probability per qubit be kept below some threshold determined by fault tolerant implementations. What that threshold actually is depends on the particular implementation and the physical origin of decoherence.

DISCLOSURE OF THE INVENTION

The invention is a quantum device comprising a pair of dopant atoms located in an otherwise electrically inert solid substrate, such as a semiconductor or insulator, in which it is possible to ionise the dopant atoms. The dopant may be an electron donor or an electron acceptor. The two dopants produce a double-well electric potential and a charge qubit is realised by the location of one or more electrons or holes within this potential.

In one example a pair of phosphorus (P) atoms are located in a silicon (Si) substrate. Ionisation of one of the donor electrons creates a P—P$^+$ system, equivalent to an artificial $H_2^+$ molecule. The logical states of the charge qubit is formed by either the location of a single electron in one or other well of the double-well potential, or by the lowest symmetric and antisymmetric molecular states. The spacing between the P atoms may be up to 200 nm. More specifically it may be in the range 20 to 80 nm. The basic qubit and definition of logical states can be expressed in terms of left and right localized states with respect to the double-well potential, or in terms of delocalized molecular states.

The two P atoms may be buried up to 200 nm below the surface of the device. More specifically they may be buried in the range 5 to 50 nm.

The silicon substrate may be coated with an insulating layer, such as $SiO_2$, to isolate the donor electrons from any surface electrodes.

Gate electrodes may be placed on the surface of the substrate above the donor atoms to allow for external control of the charge wavefunctions. A first gate may be located over the potential barrier, between the two wells, to control the barrier height, this gate is known as the 'barrier' gate or B-gate. Another gate, or more than one gate, may be provided for elsewhere to control the relative shapes and sizes of the two wells, this gate is known as the 'potential off-set', 'symmetry' or S-gate. Suitable biasing of these gate electrodes may allow one qubit logic operations, such as the quantum NOT operation, to be performed.

One or more charge detection devices may also be provided on the surface of the substrate for qubit readout and to confirm initialization of qubits. The charge detection device may be a sensitive field-effect transistor, or it may be a single electron transistor (SET).

The configuration described, comprising two P atoms, surface gates and read-out SETs may be repeated many times on a single silicon chip, allowing for scale-up to a many qubit processor.

The entire device may be cooled well-below room temperature to ensure that the donors are not thermally ionised and to minimise coupling of the charge qubits to the environment. More specifically it may be cooled to liquid helium temperatures of 4K or below.

In contrast with real spin qubits, a charge qubit can couple strongly to fluctuating local charge environments. This kind of coupling leads to fluctuations in the relative energies of the charge qubits and thus will be largely responsible for dephasing errors.

In comparison with existing charge qubit proposals based upon quantum dots (listed above) the P—P$^+$ charge qubit is the lowest filling quantum dot possible, with the simplest quantum-substructure. In particular, the potential wells that confine the electrons are created by single ionic potentials, rather than by lithographically patterned electrodes or clusters of atoms. For these reasons we expect the P—P$^+$ system to suffer less from decoherence than the larger quantum dot charge qubits.

It is interesting to compare directly the real-spin Kane proposal [B. E. Kane, Nature 393, 133 (1998)] with this pseudo-spin P—P$^+$ proposal. In the charge qubit case we sensibly want the system to be cooled as far as is possible to minimize environmental coupling, but we do not necessarily require a magnetic field. The decoherence of the charge qubit system will be much faster than the real-spin qubit, however, the intrinsic "clock speed" of the charge qubit is also much faster. In the case of the Kane design the CNOT gate is implemented adiabatically—the clock speed is therefore restricted to the nuclear flipping frequency, of order kHz. In the P—P$^+$ case the barrier gate may be used to tune the natural clock speed down to the level of fast pulse technology, of order GHz or faster.

Since we are no longer dealing with nuclear spin states, isotopic impurities (e.g. $Si^{29}$) will not affect the charge qubit. Therefore, one can use standard Si wafers in the fabrication process. Although we will use the P-doped Si model throughout this proposal, there is no intrinsic restriction to the P:Si system. Alternatives such as Si-doped GaAs would also be possible.

Furthermore, since the Coulomb interaction acts over a longer range than spin-spin interactions, the charge qubit devices can be made larger than their spin-based counterparts. In particular, P donors in the Kane architecture are ideally placed 20 nm apart, while the donor separation for charge qubits could be as large as 200 nm with the appropriate choice of substrate and gate potentials. This increased scale makes nanofabrication considerably easier.

Given that the fabrication process is very similar, the main advantage of the real-spin over the charge qubit is the long decoherence times. However, the trade-off is in the measurement process: measurement of the charge state qubit is considerably easier to perform than the single-spin measurement scheme as envisaged by Kane.

In another aspect, the invention is a quantum device comprising two pairs of dopant atoms, each located in a solid substrate such that two double-well potentials are created, and two charge qubits are formed by the location of one or more electrons within the double-well potentials. And where, one or more gates above the substrate control electron tunneling between the two qubits. And where, by suitable biasing of these and other gate electrodes, two-qubit logic operations, such as the quantum SWAP operation, may be performed.

In another aspect, the invention is a quantum device comprising two pairs of dopant atoms, each located in a solid substrate such that two double-well potentials are created, and two charge qubits are formed by the location of one or more electrons within the double-well potentials. And where, one or more gates above the substrate controls the Coulomb interaction between the two qubits. And where, by suitable biasing of these and other gate electrodes, two-qubit logic operations, such as the quantum CNOT or CPHASE operation, may be performed.

In another aspect, the invention is a quantum device comprising more than one of the devices comprising two pairs of donor atoms, arranged adjacent each other, and having gates to enable interaction between each adjacent pair.

In a further aspect the invention is a method of reading out the logic state of a qubit (defined in the localized logic basis) from such a quantum device, comprising the steps of:
  (i) Biasing the S-gate to a non-zero value to define a known relaxed state, for which the SET has been previously calibrated;
  (ii) Turning on the SET;
  (iii) Waiting for a period of time for the system to relax to the relaxed state;
  (iv) Monitoring SET current during the waiting period to determine whether a change of state occurs, or not;
  (v) Inferring the state before step (i) from the behaviour of the SET current monitored during step (iv).

In a further aspect the invention is a method of initializing the logic state of each qubit in such a quantum device, comprising the steps of:
  (i) Biasing the S-gate to a non-zero value to define a known relaxed state;
  (ii) Waiting for a period of time for the system to relax to the relaxed state.

In a further aspect the invention is a method of using such a quantum device to perform quantum computations, comprising typical steps which include:
  (i) Initializing each qubit in the quantum device;
  (ii) Using a suitable quantum algorithm to carry out one-qubit and two-qubit operations on the qubits in the device via an appropriately timed sequence of control gate biasing;
  (iii) Reading out the logical states of the qubits.

In a further aspect the invention is a method of making such a quantum device, comprising the steps of:
  (i) creating a resist mask for implantation of an array of one or more pairs of dopant atoms into a semiconductor substrate;
  (ii) implanting one dopant ion through each hole in the mask to form an array of buried-atom qubits;
  (iii) fabricating conducting electrodes above each implanted pair of donor atoms to serve as a B gate, an S gate and a SET;
  (iv) annealing the device to a temperature sufficient to remove implant lattice damage and activate the dopant—this step may occur either immediately before or after step (iii);
  (v) pre-initializing each pair of donor atoms to remove one of the electrons.

In a further aspect the invention is a method of making such a quantum device, comprising the steps of:
  (i) passivating a clean semiconductor surface;
  (ii) patterning the passivated surface to open an array of holes;
  (iii) exposing the resulting surface to donor atoms, perhaps in the form of dopant-bearing molecules;
  (iv) overgrowing the dopant atom array with further layers of the semiconductor and annealing if necessary;
  (v) coating the surface with an insulating layer if necessary;

(vi) fabricating conducting electrodes above each implanted pair of donor atoms to serve as a B gate, an S gate and a SET;

(vii) pre-initializing each pair of donor atoms to remove one of the electrons.

BRIEF DESCRIPTION OF THE DRAWINGS

Some examples of the invention will now be described with reference to the accompanying drawings, in which:

FIG. 5 is a graph showing the ungated tunnelling rate, expressed as frequency f, against the separation R, in units of Bohr radius, a.

FIG. 7(a) is a logarithmic plot of the amount of non-logic state contamination in the ground and first excited states for a donor spacing R=6.5 a; FIG. 7(b) is a logarithmic plot of the amount of non-logic state contamination in the ground and first excited states for a donor spacing R=9 a.

BEST MODES OF THE INVENTION

The P—P$^+$ Charge Qubit

Figure 1A:
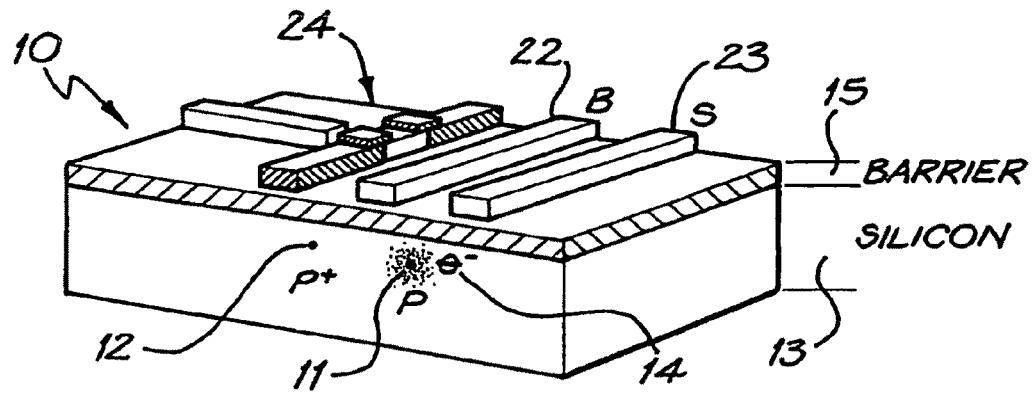
FIG. 1(a) is a pictorial view of a P—P$^+$ charge qubit.

Referring first to FIGS. 1 and 2, a charge qubit 10 is based on electrons localized by two donor P atoms 11 and 12 buried in a silicon substrate 13. Each qubit comprises an "artificial molecule" P—P$^+$ system in which a single electron 14 remains. The other donor electron must previously be removed from the system by an ionization process, such as electric field induced ionization produced by suitable gate biaising. Gates placed above the buried P—P$^+$ system, on a non-conducting barrier layer 15 allow for external control.

The remaining electron 14 exists in a double-well potential 16, in one or other of the wells. In the potential diagrams the double-well potential 16 has a left-hand well 17 and a right hand well 18. Between the wells is a potential barrier 19, and there are potential barriers 20 and 21 outside the wells. A basic qubit and definition of logical states in terms of left 17 and right 18 localized states with respect to the double-well potential 16 is shown in FIG. 2(b) and FIG. 2(c), respectively. In order to facilitate discussion of coupled qubit systems we also introduce the occupation number definition such as |L⟩=|0⟩=|L,0⟩ etc.

A barrier gate (B-gate) 22 placed between the two P atoms is used to exert control over the height of barrier 19. A potential off-set, or symmetry (S-gate) 23 is placed nearby. A SET 24 is provided for readout.

FIG. 3 illustrates the basic external control over the intra-qubit potential via the B and S gates. FIG. 3(a) shows the effect of a non-zero voltage on the B gate, note in particular that barrier 19 is raised. FIG. 3(b) shows the effect of a non-zero voltage on the S gate, note in particular the raised right-hand shoulder 21, the asymmetrical barrier 19 and the reduced left-hand shoulder 20.

The P—P$^+$ charge qubit is the lowest filling quantum dot possible, with the simplest quantum-substructure. For this reason we expect the P—P$^+$ system to suffer less from decoherence than the larger quantum dot qubits. On the other hand, a charge qubit can couple strongly to fluctuating local charge environments. This kind of coupling leads to fluctuations in the relative energies of the charge qubits and thus will be responsible for dephasing errors.

In the pseudo-spin P—P$^+$ proposal, the system should be cooled as far as is possible to minimize environmental coupling. The decoherence of the charge qubit system will be fast, however, the intrinsic "clock speed" of the charge qubit is much faster. The barrier gate will be required to tune the natural clock speed down to the level of fast pulse technology, of order GHz.

Since we are not dealing with nuclear spin states, isotropic impurities (e.g. Si$^{29}$) will not affect the charge qubit. Therefore, one can use standard wafers in the fabrication process.

Single Qubit Dynamics

Ungated Qubit

In this section we discuss control over single qubit dynamics via external gate biases. Essentially we need to be able to initialize the qubit and perform arbitrary rotations. The first problem is the fast natural tunneling rate of the system for typical donor separations. This is also a problem for two-qubit gates.

Figure 4A:
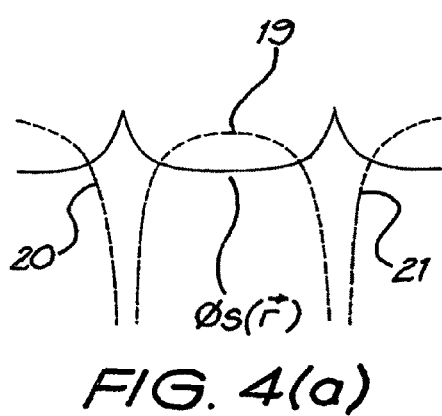
FIG. 4(a) is a potential diagram of a symmetric molecular orbital wave function.
Figure 5:
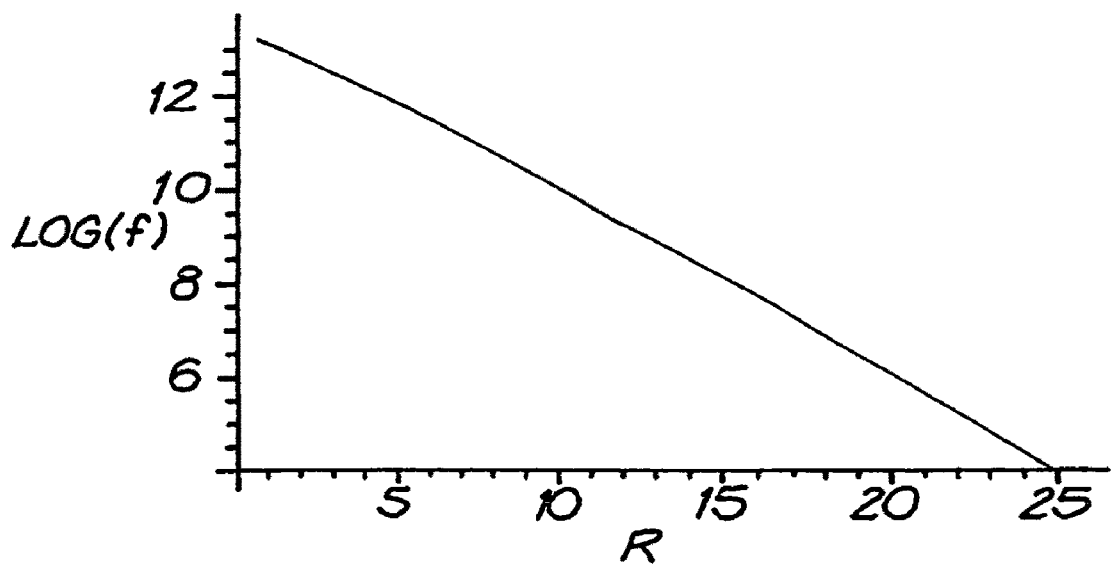

To get first order estimates of the tunneling rates and gate control over the dynamics for the single qubit system we consider the P—P$^+$ system using the usual effective Bohr radius of $a=a_B^*$ appropriate to P-donor electrons in silicon. In the case of zero gate potentials the Hamiltonian in this effective-mass approach is taken to be:

$$H_0 = \frac{-\hbar^2}{2m}\vec{\nabla}^2 - \frac{e^2}{|\vec{r} - R/2|} - \frac{e^2}{|\vec{r} + R/2|},$$

where the origin is placed mid-way between the donor nuclei along the x-axis. The eigenstates of this Hamiltonian are known exactly, so we have constructed the basis of states $\{\phi_i(\vec{r};R)\}$ with i=1 ... N (the dependence on separation distance is manifest). In FIGS. 4(a) and (b) shows the first two lowest energy states, $\phi_S(\vec{r};R)$ and $\phi_A(\vec{r};R)$, corresponding to symmetric and anti-symmetric configurations respectively. In the absence of external gate potentials the energy difference between these states $\Delta E(R)=E_S(R)-E_A(R)$ determines the tunneling rate. The dependence on the tunneling rate with donor separation for zero gate bias is shown in FIG. 5—normally this rate is very fast, but with appropriate gate bias this system can be controlled.

In terms of these two lowest zero-gate eigenstates the computational space is given by:)

$$|0\rangle \leftrightarrow \psi_L(\vec{r}),$$

$$|1\rangle \leftrightarrow \psi_R(\vec{r}).$$

At zero-gating, the logic states are given in terms of the eigenstates of the system as:

$$|0\rangle \leftrightarrow \psi_L(\vec{r}) = \frac{1}{\sqrt{2}}(\varphi_S(\vec{r}) + \varphi_A(\vec{r})),$$

$$|1\rangle \leftrightarrow \psi_R(\vec{r}) = \frac{1}{\sqrt{2}}(\varphi_S(\vec{r}) - \varphi_A(\vec{r})).$$

We note here that the logic states can also be defined in terms of the de-localised states $\phi_S(\vec{r};R)$ and $\phi_A(\vec{r};R)$.

Gated Qubit

Figure 1B:
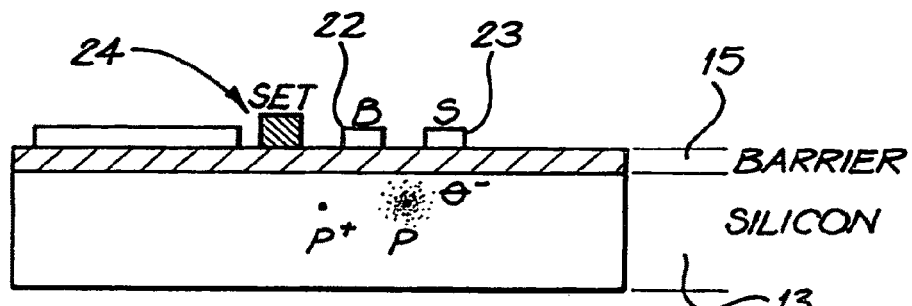
FIG. 1(b) is an elevational view of the charge qubit.
Figure 1C:
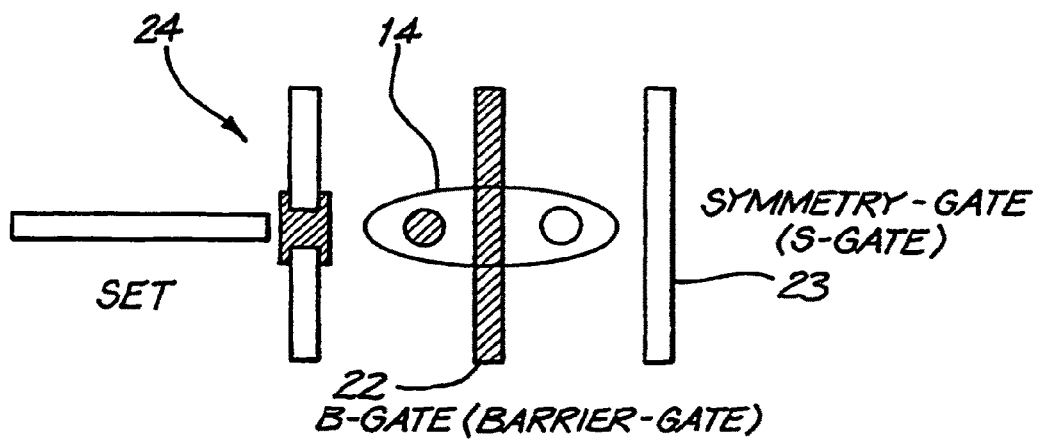
FIG. 1(c) is a plan view of the charge qubit.

Now we consider the placement of gates according to the single-gate configuration of FIG. 1(c): a B-gate 22 controlling the barrier height, and as S-gate 23 which allows us to raise and lower the potential asymmetrically. The spatial dependence of the gate potentials, $V_S(\vec{r})$ and $V_B(\vec{r})$, in the silicon substrate can be conveniently calculated using the TCAD Poisson solver (gate geometry, widths etc). In effect we add to the Hamiltonian terms of the form:

$$H_0 \rightarrow H = \frac{-\vec{\nabla}^2}{2m} - \frac{e^2}{|\vec{r} - R/2|} - \frac{e^2}{|\vec{r} + R/2|} + S(t)V_S(\vec{r}) + B(t)V_B(\vec{r}),$$

where the time-dependent pulse profiles S(t) and B(t) describe the time evolution (scaling) of the gate biases.

Figure 6:
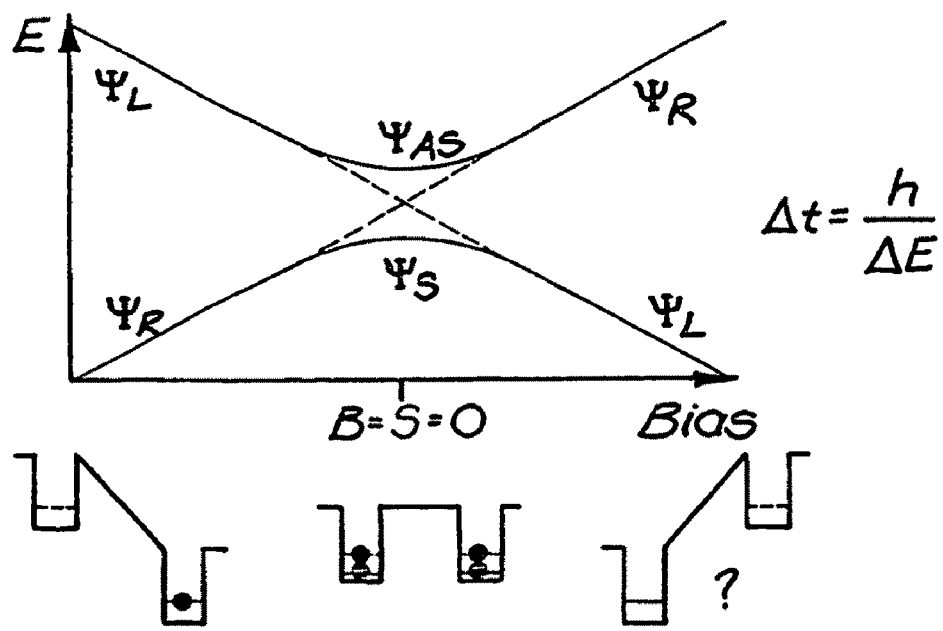
FIG. 6 is a graph of the wave functions energies (E) against bias on the S-gate, and includes associated diagrams of the effect on the double-well potential.

The structure of the lowest two states in B—S space is complicated. Around the zero-gate point, B=S=0, the situation is fairly clear, and is shown in FIG. 6 as the conditions for minimum energy gap between the first two states. The ground state is this symmetric state and the excited state is the anti-symmetric state. As we change the S-gate voltage adiabatically the states evolve to localized states as shown to the right and left.

Loss in fidelity due to "state-leakage" will occur if the logic states (localized states) are not exact eigenstates of the Hamiltonian. This effect should be minimized by positioning the P-donors far enough apart, and applying the appropriate S-gate voltage. At $S_0=0$ the first two states are equal combinations of the localized states. At $|S_0|=0.1$ volts or higher the qubits are quite accurately defined by the localized states.

In order to be able to describe the dynamics of the gated P—P$^+$ qubit we need the effective Hamiltonian in the computation sub-space. First, we consider the eigenstates of the system when the gate strengths B and S are non zero. From the exact treatment of the unperturbed system we construct the Hamiltonian matrix with respect to N basis states to obtain the matrix:

$$H_{\text{eff}}(R)|_{ij} = \langle \phi_i(\vec{r};R)|H|\phi_j(\vec{r};R)\rangle.$$

Diagonalization of this matrix for non-zero gate strengths gives a new energy gap between the lowest states $\Delta E(R,S,B)$. This is of course a non-trivial functional dependence given that the potentials are described by TCAD simulation in the first place. Nevertheless, we have solved the system for R=9.0 a for various gate potentials.

Effective Hamiltonians and Qubit Rotations

We need to find the regions in (B,S) space where single qubit operations in the lowest two states are feasible, that is the tunneling rate can be controlled and slowed down. To this end we compute the effective Hamiltonian for deviations $(\Delta B(t), \Delta S(t))$ about a given point $(B_0,S_0)$. In general this will be of the form:

$$H_Q = h_0(t) + h_x(t)\sigma_x + h_z(t)\sigma_z,$$

where $$h_0(t) = \epsilon_0(S_0, B_0) + \epsilon_S(S_0, B_0)\Delta S(t) + \epsilon_B(S_0, B_0)\Delta B(t)$$

$$h_x(t) = X_0(S_0, B_0) + X_S(S_0, B_0)\Delta S(t) + X_B(S_0, B_0)\Delta B(t).$$

$$h_z(t) = Z_0(S_0, B_0) + Z_S(S_0, B_0)\Delta S(t) + Z_B(S_0, B_0)\Delta B(t)$$

The all-pervading dependence on R has been suppressed. In Table 1 we list the values of the effective Hamiltonian coefficients calculated in the hydrogenic approximation.

This form for $H_Q$ makes it convenient to study the dynamics of the qubit using NMR type pulses, where the rise time of the pulses are very short in comparison to their duration. Clearly, we can see how the function $h_x(t)$ controls qubit rotations and its composition in terms of the S and B potentials. No matter how we define our computational basis, a $\pi/2$ rotation $\exp(-i\pi\sigma_x/2)$ is implemented by balancing the coefficient of $\sigma_z$ to zero and then allowing the system to evolve for a time $\tau_{op}$ with the $\sigma_x$ coefficient non-zero. Changing the basis from localized states to delocalized states induces the transformation $\sigma_x \leftrightarrow \sigma_z$ so care must be taken on this point.

The main question is the limitation on the operation time—the natural frequency of the un-gated system (FIG. 5) is very fast for donor separations up to R=10 a so we need to find gating operations to slow the tunnelling rate down. We can achieve the balance conditions by suitable control over $\Delta B(t)$ and $\Delta S(t)$ pulses: $h_z(\Delta B^*, \Delta S^*) \equiv 0$ and $h_x(\Delta B^*, \Delta S^*) \equiv 0$. This gives:

$$\Delta S^* = \frac{X_0 Z_B - X_B Z_0}{X_B Z_S - X_S Z_B}$$

and $$\Delta B^* = \frac{X_S Z_0 - X_0 Z_S}{X_B Z_S - X_S Z_B}.$$

The values of $\Delta B^*$ and $\Delta S^*$ for three gate configurations $(B_0, S_0)$ are given in Table 2. We examine first how a $\pi/2$ rotation $\exp(-i\pi\sigma_x/2)$ may be applied by B-gate control. This is carried out by maintaining $h_z = 0$ for $\Delta B(t) \neq \Delta B^*$ using:

$$\Delta S = \frac{-(Z_0 - Z_B \Delta B)}{Z_S},$$

which gives:

$$h_x(\Delta B) = \frac{1}{Z_S}[(X_0 Z_S - Z_0 X_S) + (X_B Z_S + Z_B X_S)\Delta B].$$

The timing of the $\Delta B$ pulse can now be read off from:

$$\tau_{op} = \frac{\hbar\pi}{2}[h_x(\Delta B)]^{-1}$$

$$= \frac{\hbar\pi}{2} Z_S [(X_0 Z_S - Z_0 X_S) + (X_B Z_S + Z_B X_S)\Delta B]^{-1},$$

(recall that $h_x$ is in units of 45 meV). In Table 3 the voltage pulse magnitudes required for the different gate configurations $(B_0, S_0)$ and donor separations (R=9 a) are given for pulse times: $\tau_{op} = 1$ ns and $\tau_{op} = 0.1$ ns. In each of the cases the voltages required are feasible, demonstrating that the single qubit operation time can be controlled.

Figure 8:
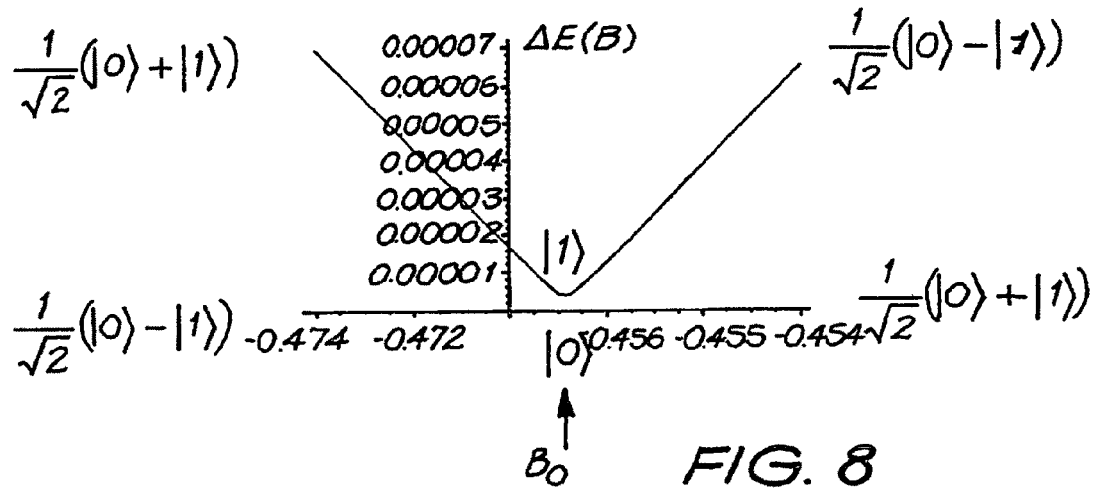
FIG. 8 is a graph showing Energy gap vs. ΔB around point $B_0=-0.46884$, $S_0=0$.

In FIG. 8 we show the situation around the configuration $B_0 = -0.46884$, $S_0 = 0$.

The non-zero B-gate case deserves some comment. First, in an ideally symmetric qubit/gate geometry, one does not expect a minimum to develop as the barrier height is increased when S=0. In fact as the barrier is raised, by making B(t) more negative, the response of the first two states will be different—the dependence of the energies of the first two states on B-gate voltage is to first order linear, but with different slopes. Hence, at some point the energy levels will cross. Any asymmetry in the system will effectively introduce a coupling between the states creating an avoided crossing. The calculations involve rounding errors, and so the cross-over becomes an avoided crossing, and we obtain the behaviour as seen in FIG. 8. A straightforward LCAO calculation using a symmetric barrier potential confirms this.

Indeed, in an actual device one does not expect to obtain the perfectly symmetric case, and a certain amount of device characterization will need to be carried out to determine the adjustment required on the gate potentials to facilitate operation, as per the estimates given above. The estimates given correspond to specific modelling of the surface gates using the TCAD simulation package. Modifications to the details of gate modelling will change the quantitative details of the numbers quoted in the Tables and Figures.

TABLE 1

Single qubit effective Hamiltonian coefficients for various gate configurations

| | R = 9.0 a |
|---|---|
| $B_0 = 0$ | |
| $S_0 = 0$ | |
| $\epsilon_0$ | −1.2228 |
| $\epsilon_S$ | −1.5414 |
| $\epsilon_B$ | −1.6282 |
| $X_0$ | 0 |
| $X_S$ | 0.4778 |
| $X_B$ | 0 |
| $Z_0$ | −0.0016 |
| $Z_S$ | −0.0044 |
| $Z_B$ | −0.0016 |
| $B_0 = -0.4688$ | |
| $S_0 = 0$ | |
| $\epsilon_0$ | −0.9671 |
| $\epsilon_S$ | −1.4906 |
| $\epsilon_B$ | −1.5947 |
| $X_0$ | 0 |
| $X_S$ | −0.2169 |
| $X_B$ | 0.0059 |
| $Z_0$ | 0 |
| $Z_S$ | 0.4193 |
| $Z_B$ | 0.0034 |
| $B_0 = 0$ | |
| $S_0 = -0.3$ | |
| $\epsilon_0$ | −0.7714 |
| $\epsilon_S$ | −1.4954 |
| $\epsilon_B$ | −1.6137 |
| $X_0$ | 0 |
| $X_S$ | 0.0069 |
| $X_B$ | 0.0039 |
| $Z_0$ | −0.1417 |
| $Z_S$ | 0.4663 |
| $Z_B$ | −0.0032 |

TABLE 2

Gate configurations and balance conditions for single qubit rotations.

| Gate configuration | R = 9.0a |
|---|---|
| $B_0 = 0, S_0 = 0$ $\varphi_1 = \frac{1}{\sqrt{2}}(\varphi_L + \varphi_R)$ $\varphi_2 = \frac{1}{\sqrt{2}}(\varphi_L - \varphi_R)$ | $\Delta B^* = -1.00585$ $\Delta S^* = -2.1 \times 10^{-6}$ |
| $B_0 = -0.46884, S_0 = 0$ $\varphi_1 = \varphi_L$ $\varphi_2 = \varphi_R$ | $\Delta B^* = +0.003683$ $\Delta S^* = +0.000101$ |
| $B_0 = 0, S_0 = -0.3$ $\varphi_1 = \varphi_L$ $\varphi_2 = \varphi_R$ | $\Delta B^* = -0.533922$ $\Delta S^* = +0.300349$ |

TABLE 3

Single qubit rotations: pulse timing

| Gate configuration | R = 9.0a |
|---|---|
| $B_0 = 0, S_0 = 0$ $\varphi_1 = \frac{1}{\sqrt{2}}(\varphi_L + \varphi_R)$ $\varphi_2 = \frac{1}{\sqrt{2}}(\varphi_L - \varphi_R)$ | $\tau_{op} = 0.1$ ns $\Delta B = -1.0060$ $\Delta S = +0.0005$ $\tau_{op} = 1$ ns $\Delta B = -1.00587$ $\Delta S = +4.59 \times 10^{-5}$ |
| $B_0 = -0.46884, S_0 = 0$ $\varphi_1 = \varphi_L$ $\varphi_2 = \varphi_R$ | $\tau_{op} = 0.1$ ns $\Delta B = +0.0336$ $\Delta S = -0.0001$ $\tau_{op} = 1$ ns $\Delta B = +0.00667$ $\Delta S = +7.66 \times 10^{-5}$ |
| $B_0 = 0, S_0 = -0.3$ $\varphi_1 = \varphi_L$ $\varphi_2 = \varphi_R$ | $\tau_{op} = 0.1$ ns $\Delta B = -0.4752$ $\Delta S = +0.3008$ $\tau_{op} = 1$ ns $\Delta B = -0.52805$ $\Delta S = +0.30039$ |

Two Qubit Gates

The coupling of qubits can proceed in a number of ways. Three basic coupling schemes, the first involving a direct external-gate controlled tunneling interaction—the "SWAP" configuration—and the other two an indirect qubit-controlled coupling based on the Coulomb interaction between neighbouring qubits—the "CNOT" and "CPHASE" configurations—are shown in FIGS. 9, 10 and 11 respectively.

SWAP Gate Operation

Figure 9:
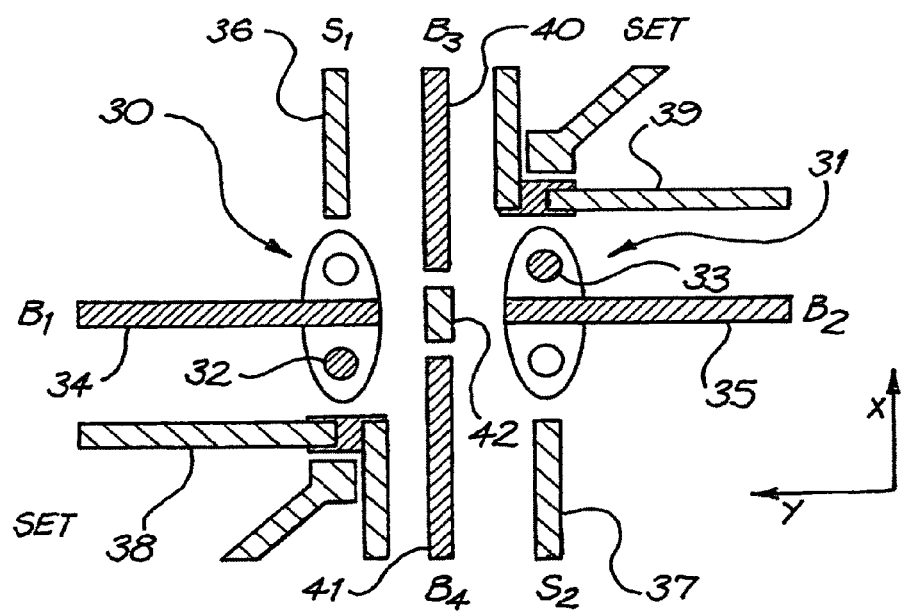
FIG. 9 is a plan view of coupled qubits in the SWAP configuration.

Referring to FIG. 9, two pairs of charge qubits 30, 31 in the SWAP configuration are located parallel to each other in a substrate. Each individual qubit 30, 31 is constructed as set out in the description of the P—P$^+$ charge qubit above, each having a single electron 32, 33 remaining in the P—P$^+$ system, a B-gate 34, 35, a S-gate 36, 37 and a SET 38, 39. The diagram shows the S-gates 36, 37 and the SETs 38, 39 in diagonally opposite ends, but they could equally both be on the same side.

Inter-qubit gates are also provided to control electrons tunnelling between the two qubits. Two further B-gates 40, 41 are provided between and parallel to the two qubits 30, 31. Together, these B-gates 40, 41 extend the length of the qubits 30, 31 and their associated gates, except for a via-gate 42 that separates them and lies directly between the two qubits 30, 31. The via-gate 42 prevents diagonal transitions between the two qubits 30, 31.

These gates are relatively straightforward to understand at the level of the single qubit dynamics described above (modulo the double |R⟩occupancy step). Essentially the swap occurs by controlling the inter-qubit barrier gates $B_3$ (40) and $B_4$ (41) while the intra-qubit dynamics are static by balance of $B_1$ (34) and $B_2$ (35). Assuming we are working in a left-right localization basis (w.r.t. the x-axis) the qubit computational states are labelled (interchangeably):

$$|0\rangle = |L\rangle = |L, 0\rangle$$

$$|1\rangle = |R\rangle = |0, R\rangle$$

The notation $|L, 0\rangle$ and $|0, R\rangle$ pave the way for a doubly occupied qubit $|L, R\rangle$, which will occur as an intermediate state in the SWAP process. Starting with an arbitrary state of the two qubit system, $|\Psi_i\rangle = |\psi\rangle_1 \otimes |\psi\rangle_2$, we wish to effect the SWAP operation on its components:

$$|0\rangle|0\rangle \to |0\rangle|0\rangle$$

$$|0\rangle|1\rangle \to |1\rangle|0\rangle$$

$$|1\rangle|0\rangle \to |0\rangle|1\rangle$$

$$|1\rangle|1\rangle \to |1\rangle|1\rangle$$

By appropriate gate control, the evolution of the initial the two qubit state, $|\Psi_i\rangle = |\psi\rangle_1 |\psi\rangle_2$, occurs in the following sequence (scheatic):

$$|\Psi_i\rangle = (\alpha_1 |L, 0\rangle_1 + \beta_1 |0, R\rangle_1) \otimes (\alpha_2 |L, 0\rangle_2 + \beta_2 |0, R\rangle_2)$$

$$\to \alpha_1 \alpha_2 |L, 0\rangle_1 |L, 0\rangle_2 + \alpha_1 \beta_2 |L, 0\rangle_1 |0, R\rangle_2 + \beta_1 \alpha_2 |0, R\rangle_1 |L, 0\rangle_2 + \beta_1 \beta_2 |0, R\rangle_1 |0, R\rangle_2$$

$$B_3 \downarrow \qquad B_3 \downarrow \qquad B_3 \downarrow \qquad B_3 \downarrow$$

$$\to \alpha_1 \alpha_2 |L, 0\rangle_1 |L, 0\rangle_2 + \alpha_1 \beta_2 |L, R\rangle_1 |0, 0\rangle_2 + \beta_1 \alpha_2 |0, 0\rangle_1 |L, R\rangle_2 + \beta_1 \beta_2 |0, R\rangle_1 |0, R\rangle_2$$

$$B_4 \downarrow \qquad B_4 \downarrow \qquad B_4 \downarrow \qquad B_4 \downarrow$$

$$\to \alpha_1 \alpha_2 |L, 0\rangle_1 |L, 0\rangle_2 + \alpha_1 \beta_2 |0, R\rangle_1 |L, 0\rangle_2 + \beta_1 \alpha_2 |L, 0\rangle_1 |0, R\rangle_2 + \beta_1 \beta_2 |0, R\rangle_1 |0, R\rangle_2$$

$$|\Psi f\rangle = \alpha_1 \alpha_2 |L, 0\rangle_1 |L, 0\rangle_2 + \alpha_1 \beta_2 |0, R\rangle_1 |L, 0\rangle_2 + \beta_1 \alpha_2 |L, 0\rangle_1 |0, R\rangle_2 + \beta_1 \beta_2 |0, R\rangle_1 |0, R\rangle_2$$

By symmetry one expects transitions such as $$|0, R\rangle_1 |0, R\rangle_2 \xrightarrow{B_3} |0, 0\rangle_1 |0, 2R\rangle_2$$

not to occur: although the actual electrons in this state will be exchanged when $B_3$ is switched on, the product state remains effectively the same. If there is some residual asymmetry which generates this transition, a background magnetic field could be used to polarize the electrons and stop this transition through Pauli blocking.

Coulomb-Coupled Gate Operations

FIG. 10 represents a configuration which is based on an indirect qubit-controlled coupling. In this CNOT configuration the two qubits $Q_1$, $Q_2$ are oriented perpendicular in a substrate. Again, each individual qubit has an associated electron, B-gate $B_1$, $B_2$, S-gate $S_1$, $S_2$ and SET that perform the same functions as previously described. The SETs are shown in diagonally opposite corners of the configuration but this is not a requirement. The B-gate $B_1$ of the first qubit $Q_1$, and the S-gate $S_2$ of the second qubit $Q_2$ occupy the remaining diagonally opposite corners, with the S-gate $S_1$ of the first qubit $Q_1$ and the B-gate $B_2$ of the second qubit $Q_2$ now in parallel. Note that the SET and S-gate $S_2$ of the right qubit $Q_2$ could be swapped without loss of generality.

FIG. 11 represents a further indirect qubit-controlled coupling configuration. In this CPHASE configuration the two qubits $Q_1$, $Q_2$ and their respective gates are arranged as described in FIG. 9, but there is no B-gate between the two qubits and the two qubits are offset (or staggered) vertically with respect to each other.

For both the CNOT gate (FIG. 10) and the CPHASE gate (FIG. 11) an additional barrier gate could also be located between the two qubits $Q_1$ and $Q_2$, running the full length of the device. In the case of the CNOT, the central barrier gate would be parallel with and between gates $B_1$ and $S_2$. In the case of the CPHASE, the central barrier gate would be parallel with and between gates $S_1$ and $S_2$. The purpose of this central barrier gate would be to inhibit direct electron tunneling between the two qubits $Q_1$ and $Q_2$, in a manner analogous with the barrier gates 40, 41 and 42 in the SWAP gate (FIG. 9).

The CNOT and CPHASE gates, as defined above, rely on the Coulomb interaction between electrons in the qubits. Understanding the gate operation quantitatively requires a lengthy computation of the four-donor, two-electron system. However, we can make good estimates based on some simple constructions.

First we take the qubit positions as defined in FIG. 12 (x-y plane only for clarity) below: in the ith qubit, the jth donor atom is located at $\vec{R}_{ij}=(x_{ij},y_{ij},z_{ij})$. The effective molecular Hamiltonian for the two electron system is then:

$$H = H_0^{(1)} + H_0^{(2)} + H_{int},$$

where $$H_0^{(1)} = \frac{-\hbar^2}{2m}\vec{\nabla}_1^2 - \frac{e^2}{|\vec{r}_1 - \vec{R}_{11}|} - \frac{e^2}{|\vec{r}_1 - \vec{R}_{12}|},$$

$$H_0^{(2)} = \frac{-\hbar^2}{2m}\vec{\nabla}_2^2 - \frac{e^2}{|\vec{r}_2 - \vec{R}_{21}|} - \frac{e^2}{|\vec{r}_2 - \vec{R}_{22}|},$$

$$H_{int} = \frac{e^2}{|\vec{r}_1 - \vec{r}_2|} - \frac{e^2}{|\vec{r}_1 - \vec{R}_{21}|} - \frac{e^2}{|\vec{r}_1 - \vec{R}_{22}|} - \frac{e^2}{|\vec{r}_2 - \vec{R}_{11}|} - \frac{e^2}{|\vec{r}_2 - \vec{R}_{12}|}.$$

In order to obtain gate operation characteristics, at least to the level of the effective hydrogenic approximation used in the single-gate case, we would need to diagonalize the Hamiltonian as given, with respect to a complete two-electron basis. An outline of these calculations is given below, however, we note here that such calculations, while a useful guide, are probably not going to give very much quantitative insight into the actual charge qubit coupling taking place in the solid-state environment. For that one needs the full Bloch-wave treatment, which is beyond the scope of this proposal.

The simple LCAO approach is to define a basis of states in which each electron is localized about one of the qubits (and is therefore distinguishable). Symmetric and anti-symmetric single electron qubit wavefunctions can be defined as:

$$\psi_\pm^{(i)}(\vec{r}_i) = \frac{1}{\sqrt{2(1\pm\Delta^{(i)})}}[\varphi_{1S}(\vec{r}_i-\vec{R}_{i1})\pm\varphi_{1S}(\vec{r}_i-\vec{R}_{i2})],$$

where the overlap integral, $\Delta^{(i)}$ is given by (1S orbitals real):

$$\Delta^{(i)}=\int d^3\vec{r}\, \phi_{1S}(\vec{r}_i-\vec{R}_{i1})\phi_{1S}(\vec{r}_i-\vec{R}_{i2}).$$

The basis for the two-qubit system $\{\Psi_\alpha:\alpha=1\ldots 4\}$ is then constructed from these single electron qubit states:

$$\Psi_\alpha(\vec{r}_1,\vec{r}_2)=\psi_\pm^{(1)}(\vec{r}_1)\otimes\psi_\pm^{(2)}(\vec{r}_2).$$

The two-electron molecular Hamiltonian, in the presence of B and S is then diagonalised with respect to this basis. Details of the gate operation, pulse timing and so forth can be computed in ever increasing levels of approximation.

In lieu of this lengthy exercise, we give an estimate of the coupling expected for various inter-qubit separations from a semi-classical calculation. In the localized basis $\{|L\rangle,|R\rangle\}$ a potential affecting the barrier height as a B-gate corresponds to $\sigma_x$ pseudo-spin operator, while S-gate type effects correspond to $\sigma_z$. Hence the effective interaction between qubits in the CNOT configuration of FIG. 12(b), and the CPHASE configuration of FIG. 12(c) will be dominated by $\Gamma_{CNOT}\sigma_z^{(1)}\sigma_x^{(2)}$ and $\Gamma_{CPHASE}\sigma_z^{(1)}\sigma_z^{(2)}$ interactions respectively. A preliminary calculation based on bringing a positive charge of 1e to $d_{12}$=10-20 a from the qubit gives a value of $\Gamma\approx 10^{-4}$-$10^{-5}$ (in 45 meV units). This in turn gives a coupled qubit operation time of $T_{12}\approx 0.1$-1 ns.

Scaleable N-Qubit Architectures

Based on the two gate configurations presented above, we generalize the SWAP and CPHASE gates to scaled up N-gate architectures.

N-SWAP Gate Architecture

Figure 13:
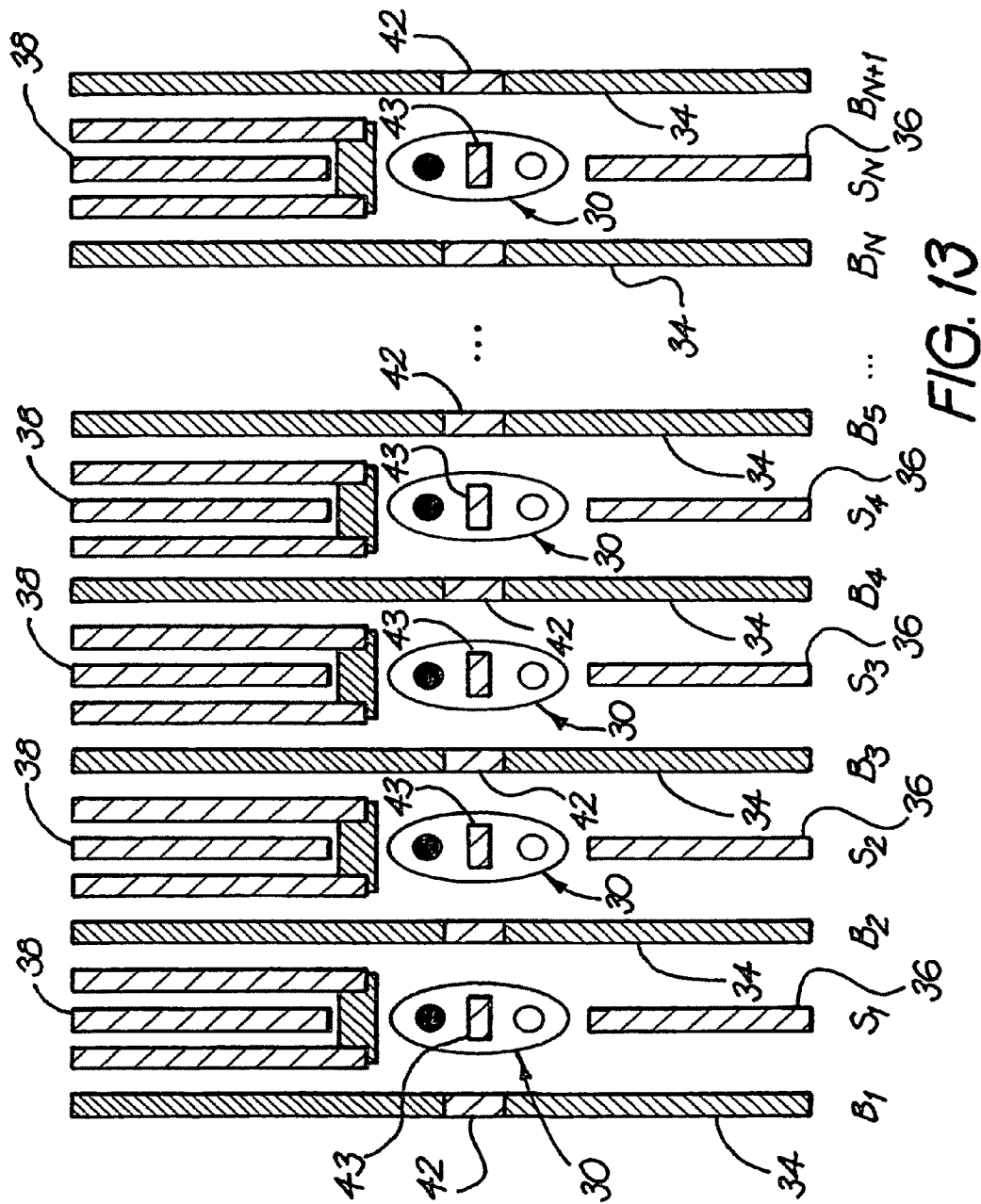
FIG. 13 is a plan view of N-qubit architecture based on the SWAP configuration.

FIG. 13 represents a N-qubit architecture, where the qubits 30 are in the N-SWAP configuration with each qubit 30 oriented parallel in a substrate to create a row of N qubits. Each individual qubit 30 is constructed substantially as set out in the description of the P—P$^+$ charge qubit above, with each qubit 30 having a single electron released from a P atom, a S-gate 36 and a SET 38. Each pair of S-gates 36 and SETs 38 extend out of opposite ends of one qubit 30 in parallel with it. Between each pair of adjacent qubits, and on the ends of the row, a B-gate 34 is provided that extends the length of the qubits and their respective gates. A via-gate 42 is provided in the centre of the B-gate 34 and is in line with the centres of the qubits 30. A further via-gate 43 is provided in the centre of each qubit 30.

N-CPHASE Gate Architecture

Figure 14:
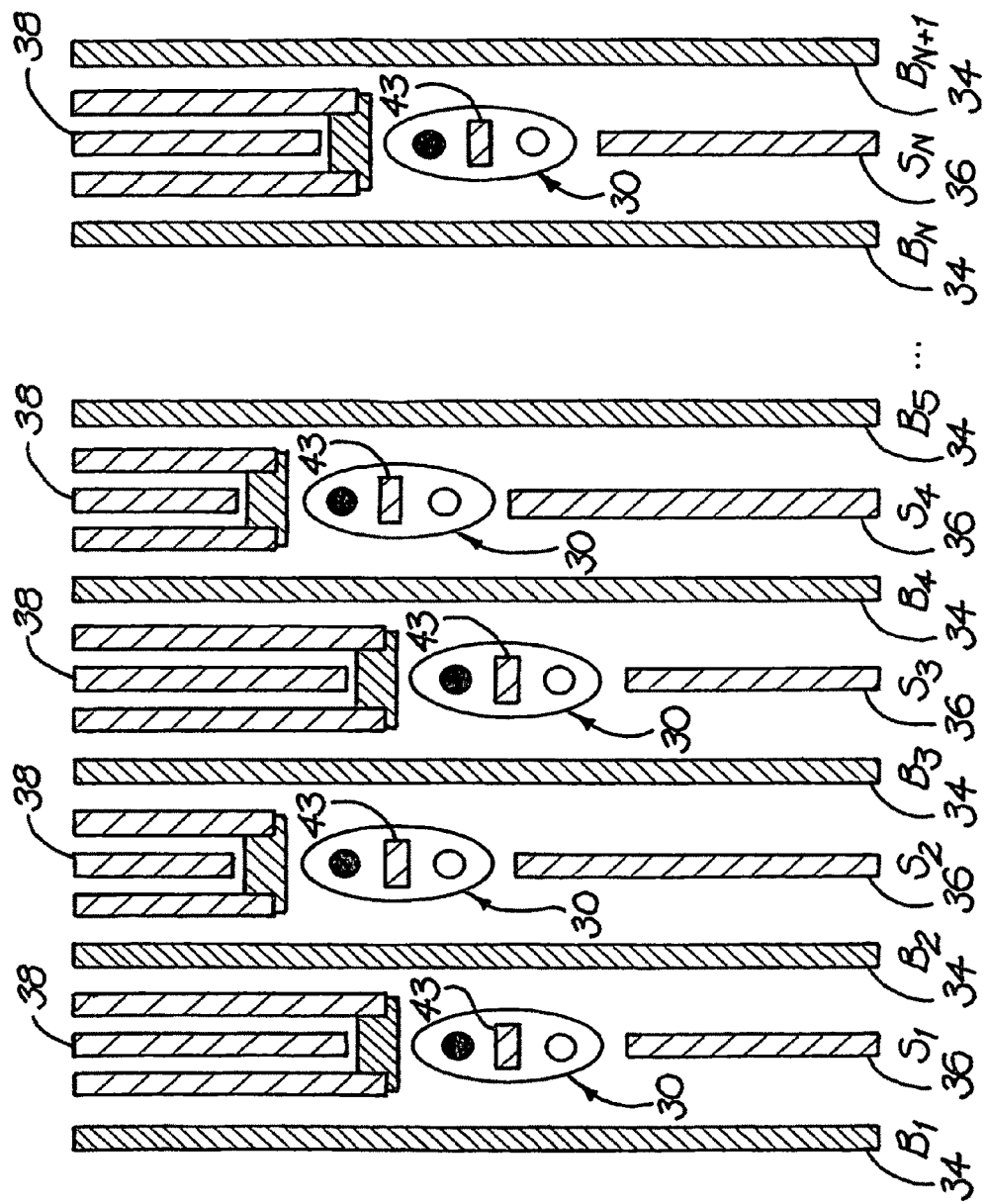
FIG. 14 is a plan view of N-qubit architecture based on the staggered CPHASE configuration.

FIG. 14 also represents a N-qubit architecture, but the qubits 30 are in an alternate staggered CPHASE configuration. This configuration is substantially identical to that described in FIG. 13, but with two differences. Firstly, the qubits 30, while still in parallel are now arranged on two different levels with the qubits 30 in the row now alternating between the two levels. Secondly, no via-gate is provided in the centre of the B-gates 34.

Quantum Cellular Automata Network

Figure 15:
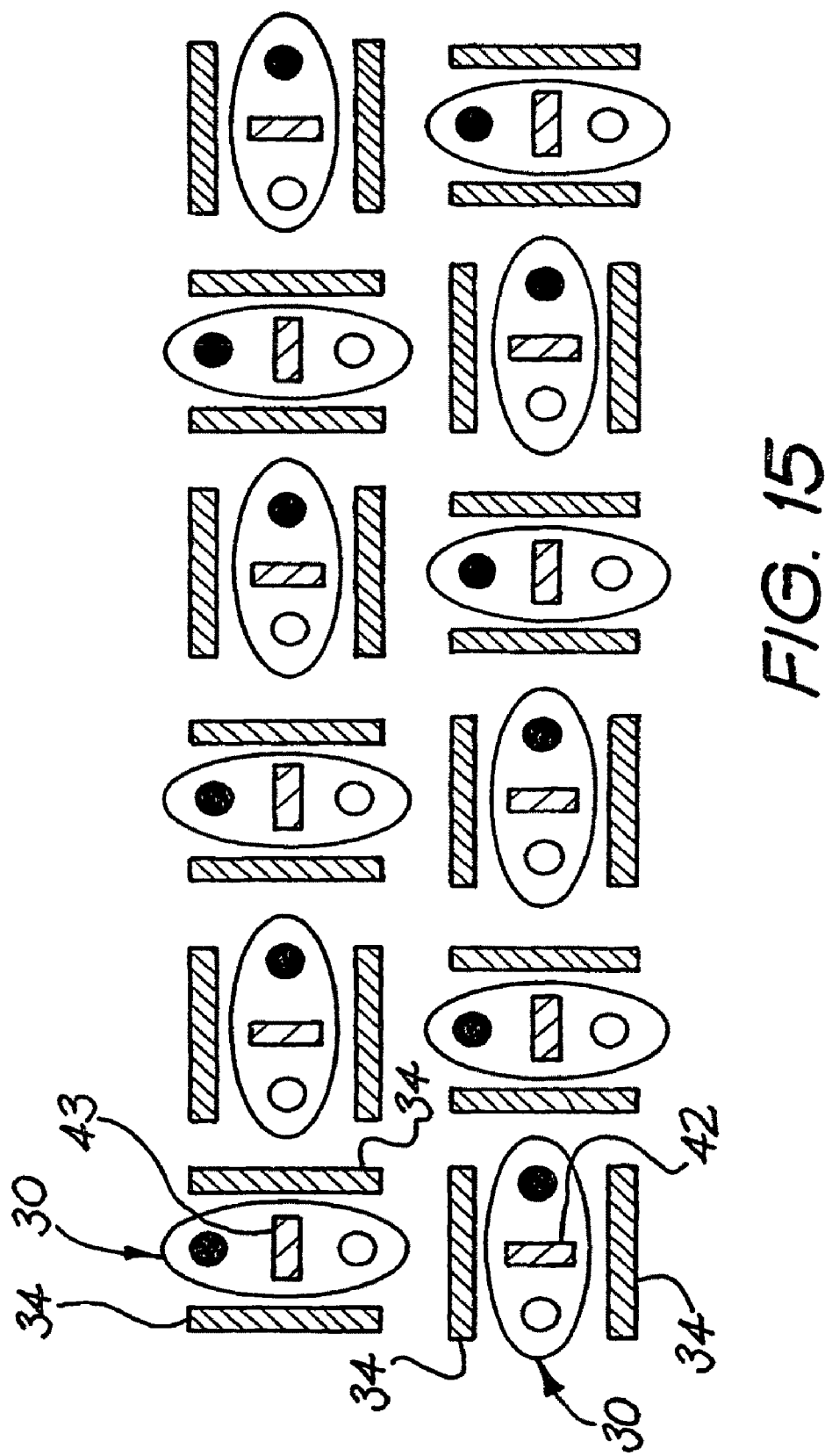
FIG. 15 a plan view of one of many possible N-node quantum cellular automata networks, which could be constructed using the P—P$^+$ qubit.

An example of a N-node quantum cellular automa network is depicted in FIG. 15. Each individual qubit 30 is constructed substantially as set out in the description of the P—P$^+$ charge qubit above, with the addition of a via-gate 43 provided in between the two P atoms of each qubit 30. The two rows of qubits 30 are placed on top of one another such that the qubits are also vertically aligned. In this formation, each qubit is placed in the substrate perpendicular to each qubit that it is adjacent to and is not diagonally adjacent. On either side of each qubit 30, a B-gate 34 is also provided.

The inherent scalability of the charge qubit (and indeed the spin qubit) allows one to define a N-qubit quantum cellular automata (NQCA) network, as shown in FIG. 15. The operation of such a device is, not as clear as the NCPHASE or NSWAP networks, however, the design permits general computation in terms of generation of entanglement followed by carefully defined measurement sequences. NQCAs might also be useful in defining heuristic quantum algorithms in local analogies to classical neural networks.

Decoherence: Dissipation and Dephasing

One of the advantages of spin qubits over the pseudo-spin charge qubits is the longer decoherence times expected of spin degrees of freedom in the solid-state. The charge qubit is expected to decohere much faster—however, as the analysis in this proposal have shown the inherent gate operation times are also commensurately faster. Below we give some estimates for times associated with various sources of decoherence, and show that the condition $T_{deco} \gg T_{op}$ for quantum computation can be feasibly maintained. This conclusion is supported by the measurement of the decoherence time in GaAs quantum dots of about 1 ns, which can be considered to be a strong lower bound on the decoherence in the P—P$^+$ case given the fact that the charge qubit is less exposed to environmental fluctuations than GaAs quantum dots.

Phonon Mechanisms:

For typical operational time scales (ns) the energy gap between the qubit states is about $10^{-2}$ meV, which is comparable to the ambient thermal energy of $k_B T=0.0086$ meV at T=100 mK. However, only phonon modes with wavelengths of the order of the electron orbit will couple appreciably. For intra-qubit donor distances (defining the electron orbit size) of R=10 a to 50 a, the corresponding phonon energies are about $10^4$ times larger: $E_{phonon}$=13-67 meV. The occupation of these modes at T=100 mK will be negligible, and so presumably will be their effect on dissipation.

An estimate of the effect of phonons on dephasing can be obtained based on the qubit interacting with an environment of acoustic phonons—represented by a bath of harmonic oscillators (Leggett et al, RMP 1987 etc). We follow the analysis of Tanamoto (PRA 61, (2000) p022305) for the case of quantum dots in a-SiO$_2$. The spectral function J(w) has contributions from Ohmic and super-Ohmic parts; the latter of which is probably the most relevant at T=100 mK, and is given in the Debye approximation by:

$$\frac{1}{4\pi} J_{so}(\omega) = \frac{\gamma^2}{4\pi \hbar \rho c^5} \omega^3.$$

For a tunneling frequency of $\omega_0$ an estimate for the fastest damping rate of the under-damped coherent oscillations with the bath at T=0 is:

$$\Gamma_{so} = \frac{1}{4\pi} J_{so}(\omega_0) = \frac{\gamma^2}{4\pi \hbar \rho c^5} \omega_0^3,$$

where the parameters for Si are $\gamma$=9.5 eV (deformation potential), $\rho$=2329 kg/m$^3$ (density), and c=9.04×10$^3$ m/s (speed of sound). The shortest decoherence time (i.e. not using the renormalized tunneling rate for lack of microscopic physics) is estimated from $T_{phonon}=1/\Gamma_{so}$. Taking a bare tunneling time of $T_{op}$=0.1 ns as our base operational time, we obtain $T_{phonon}$=324 ns, indicating that a large number of gate operations could be performed before phonon induced decoherence becomes an issue.

Gate Fluctuations and Johnson Noise:

The effect of gate fluctuations is expected to be another source of decoherence for the charge qubit. An analysis of Johnson noise can be carried out using the Master equation approach [C. Wellard and L. C. L. Hollenberg, *J. Phys. D* 35, 2499 (2002)]. Fluctuations in the S and B-gate voltages are introduced stochastically as:

$$\Delta V_S dt = \sqrt{\lambda_S} dW_S(t)$$

$$\Delta V_B dt = \sqrt{\lambda_B} dW_B(t)$$

The factors $\lambda_S$ and $\lambda_B$ scale the fluctuations and are given by the Johnson formula (assuming effective resistance and temperature of the gates are the same):

$$\lambda_{S,B} = \frac{R k_B T}{\pi}.$$

Taking a $\pi/2$ rotation (dominated by the S-gate voltage) as a typical example of a gate operation, the dominant off-diagonal contribution to the density matrix is $$\rho_{od}(t) \approx e^{-X_S^2 \lambda_S t / 2\hbar^2},$$

from which we obtain an estimate of the dephasing time due to Johnson noise in the gates:

$$T_{Johnson} = \frac{2\hbar^2}{R k_B T} \frac{\pi}{X_S^2} \approx \frac{4.3 \times 10^{-4}}{RT} s.$$

For typical operational parameters, T~10 K and R~50Ω, we obtain $T_{Johnson}$=O(μs). It should be noted that typically, a full-scale calculation of the decoherence, which does not rely on the Master equation approach would get a softer dependence for short time.

This analysis agrees with the more detailed approach taken by Barret and Milburn [S. Barrett and G. J. Milburn, cond-mat/0302238]

Charge Traps:

As a result of the fabrication process the inadvertent presence of charge traps is another possible source of unwanted environmental interaction. In particular, traps at the Si/SiO$_a$ interface may be problematic. In the top-down process, the implantation of the P donors will also create traps, however, annealing after P implantation is expected to reduce the density of crystal imperfections to a level where the mean distance between charge traps is much larger than the intra-qubit distance. In many cases, the presence of a charge-trap will give rise to a loss of fidelity rather than decoherence, since the trap is essentially a static modification of the crystal potential. Problems remain, however, if tunneling between traps, or between traps and gates or SETs, can occur on timescales commensurate with the qubit dynamics, since this dynamic process will lead to decoherence.

Readout and Initialization

A basic process for both readout and initialization is outlined below and summarized in FIG. 16. The S-gate 23 is biased to a non-zero value, to define a well known relaxed state 50. The SET 24 is then turned on 51, and the system will either fall in the left 17 or right 18 of the localised states of the double-well potential. While waiting a certain period 52 for the system to relax to a relaxed state, the current of the SET 24 is monitored to determine whether a change in state occurs or not (and compared to previously calibrated values). If the system had initially fallen into the right 18 localised state 53, it will eventually relax to the left 17 localised state 54. Since the state was actually in a localised state prior to this transition, the change in SET current will be detected. Based on whether or not a change of state is detected in the SET current, the initial state of the system can be inferred.

Readout

For definiteness we consider readout of localized qubit states with the S-gate 23 non-zero. A general state at time t will be of the form:

$$|\Psi(t)\rangle = C_L(t)|L\rangle + C_R(t)|R\rangle.$$

We wish to collapse the superposition to $|L\rangle$ or $|R\rangle$, with probabilities $|C_L(t)|^2$ and $|C_R(t)|^2$ respectively. By turning the SET 24 "on" the P—P$^+$ system will decohere strongly due to the fluctuating source-drain current and make a transition in time $T_{SET} \ll T_{dissipation}$ to a statistical mixture of the localized eigenstates. In general this initial change in charge density will not be detected in the SET because one of the amplitudes can be arbitrarily small. Leaving the SET "on" for a further period of order of $T_{dissipation}$ will allow the system to relax to the $|L\rangle$ state if it was in the $|R\rangle$ state after time $T_{SET}$. Since the state was actually in a localised state prior to this transition the change in SET current will be detectable.

Pakes et al have calculated SET sensitivity to a single electron moving over 20 nm in the vicinity of the SET giving rise to a 0.36% change in the single electron charging energy.

Initialization

Figure 16:
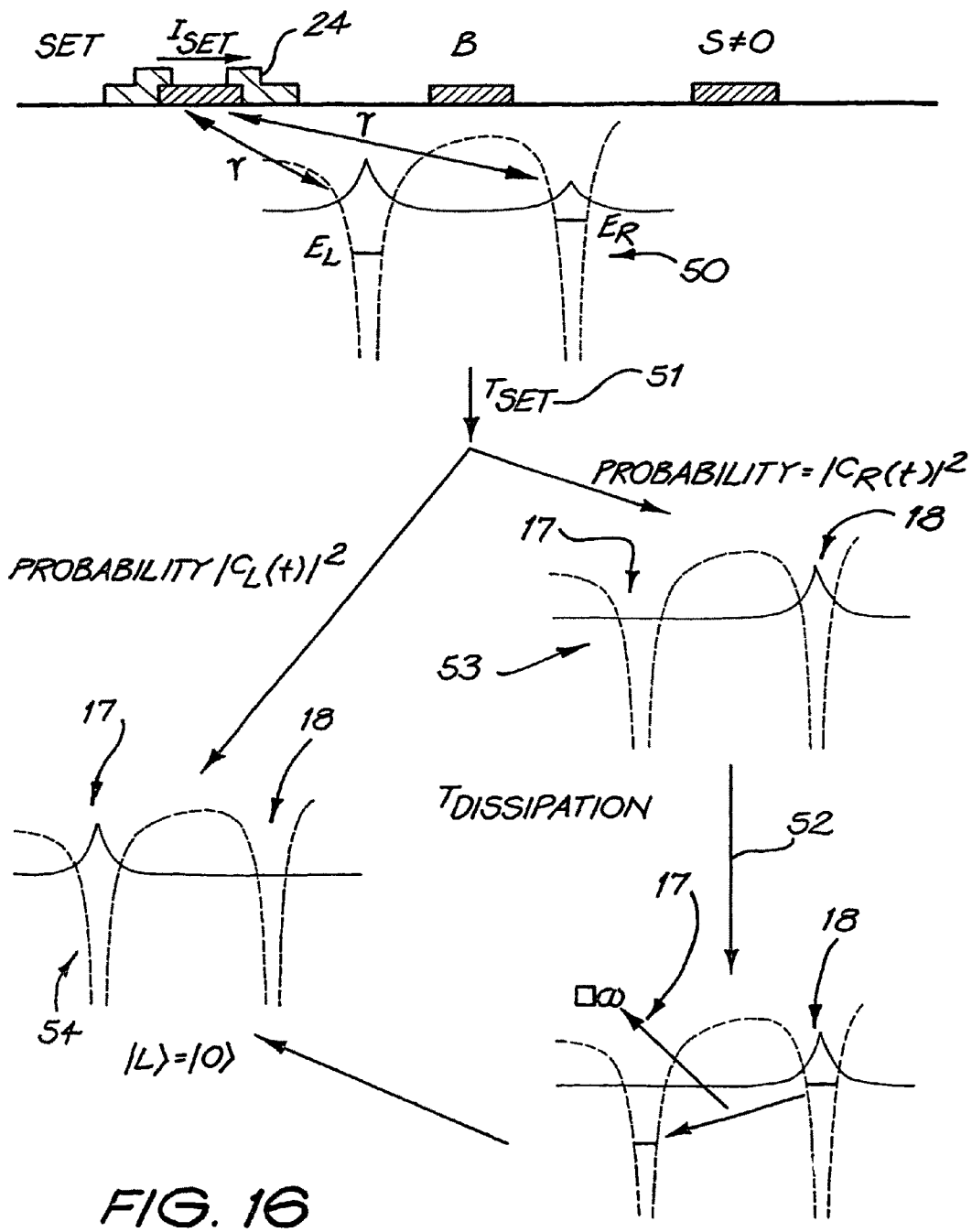
FIG. 16 is a schematic flow chart showing the readout/initialization process.

In the readout scheme as shown in FIG. 16 the S-gate is set such that the $|0\rangle = |L\rangle$ is the lower state into which the dissipative process moves the system. The process of initialization to the $|0\rangle$ state is then essentially the same as the readout process. By monitoring the SET current it would be possible to confirm that initialization had been successfully completed.

A similar process of pre-initialization of the charge qubit itself after fabrication of the two donor system would be required to remove one of the electrons. The S-gate voltage would have to be higher in order to ensure an ionization event to the continuum takes place.

Nanofabrication of Donor Arrays

While the use of phosphorus as an electron donor within a silicon substrate is standard in the microelectronics industry, controlled doping of a semiconductor device at the atomic level, as required for the charge qubit described here, is yet to be demonstrated, although recent developments in the fabrication of Si:P spin qubit devices indicate that such precision doping is close at hand. As with Si:P charge qubits, Si:P spin qubits require buried arrays of phosphorus donors with inter-donor spacings in the range 20-50 nm. Due to the weaker nature of the electron-mediated nuclear spin interaction, nuclear spin devices, require very small donor spacings of order 20 nm and may also require positioning accuracy of up to one atomic diameter (0.5 nm) In contrast, a P—P$^+$ charge qubit with an intra-qubit donor spacing R=60 nm still has a single-qubit operation time of 1 MHz and this can be made faster with the application of a positive B-gate voltage. Furthermore, due to the long-range nature of the Coulomb interaction, the inter-qubit donor spacing can be made large, possibly up to $d_Q \sim 100$ nm.

Fabrication of metallic and polymer resist features on the level 20-50 nm is achieveable using existing semiconductor lithographic approaches such as electron beam lithography and, more recently, extreme-ultra-violet (EUV) lithography. Such techniques, when combined with ion implantation, provide a top-down approach to array fabrication.

The primary limitation of top-down array fabrication is inaccuracy of P donor placement due to the statistical phenomenon of ion straggle. While such errors can probably be corrected by appropriate calibration of the control gate voltages a preferred option is to use a bottom-up fabrication approach, which offers atomic-level positional accuracy. Both the top-down and bottom-up approaches were developed for the fabrication of Si:P spin qubit devices and a review is given in A. S. Dzurak et al., Quantum Information and Computation 1, 82 (2001).

Although the discussion below refers to controlled doping of Si with P, it is applicable, with minor modifications, to the doping of Si with any atom capable of acting as a single electron donor, such as other group-V elements including arsenic and antiminum. It is also possible to envisage the use of an alternate charge neutral background matrix, such as gallium arsenide, with an appropriate single electron donor, such as silicon.

Top-Down Fabrication

Top-down fabrication approaches involve the patterning of larger structures using lithographic techniques. For the creation of P—P$^+$ donor arrays in Si we must fabricate a mask structure, capable of blocking the entry of P$^+$ ions of energy 1-20 keV, with appropriately spaced holes allowing entry of the P$^+$ ions at the desired array positions. Electron-beam sensitive organic resists (such as poly-methyl-methacrylate—PMMA) with thicknesses in the range 20-200 nm are capable of blocking keV ions. These organic resists may also be patterned using high-resolution electron beam lithography (EBL) to create via holes with diameters below 10 nm. Metallic surface gate structures of thickness 20-50 nm are also capable of blocking keV ions and can be combined with organic resists in composite mask structures. Such approaches are capable of producing 10 nm via holes with centre-to-centre spacings (R) down to around 30 nm. Larger spacings of R~100 nm are easily achievable. It is therefore possible to create masks for the implantation of any desired P—P$^+$ charge qubit array.

Once a mask structure with an appropriate array of small apertures has been created, one ion must be delivered to each cell in the array. It is therefore necessary to localise (or focus)

the ion beam to a diameter smaller than the required donor spacing R. The localised beam would be moved from one cell to the next after a single P ion had been delivered, in a step-and-repeat approach ["Method and system for introducing an ion into a substrate", PCT/AU02/01150].

One way to achieve such ion beam localisation is through the use of a phosphorus focused ion beam (FIB) system. The same FIB system used to deliver the P ions could also be used to image registration markers on the chip, so as to ensure that ions are delivered accurately at the array sites. Alternatively the $P^+$ beam may be localised by collimating it with a nanomachined aperture in a mask that can be moved accurately with respect to the sample. If the nanomachined aperture is machined from the cantilever of a scanned-probe atomic force microscope (AFM) system, the AFM could be used to locate the array sites and then offset appropriately to position its aperture at the relevant cell.

Once the ion beam has been positioned at the appropriate cell, using either a FIB or nanomachined cantilever, the beam flux must be controlled so that only one $P^+$ ion enters the substrate. Such single ion implantation control can be achieved by utilising on-chip ion impact detectors, capable of electrically registering the entry of a single ion into the Si substrate. When an ion passes through an aperture at an array site and enters the substrate, it will dissipate its energy partly through the creation of electron-hole pairs in the i-Si. The electrons and holes will drift in the applied electric field, resulting in a current pulse in a circuit connected to the detector electrodes. Once one of these pulses is detected, associated circuitry can be used to blank the ion beam, limiting the implantation to just one ion. $P^+$ ions of 10-20 keV, the energy range required to implant donors at depths of ~10 nm, will produce somewhat smaller pulses, due the increased nuclear stopping coefficient for heavier ions.

In order to create the ion-stopping mask containing a nanoscale aperture array, a variety of approaches may be employed. We will discuss these with reference to the construction of a very simple array, containing just two donors (ie. a single charge qubit). Here we consider three approaches, with an increasing degree of accuracy and corresponding process complexity.

The first approach is to form the aperture array (in this case comprising only two apertures) in a single layer of organic resist, such as PMMA, using electron beam lithography (EBL). On-chip detectors are used to register the entry of just two 15 keV $P^+$ ions into the substrate. Following ion implantation the sample is annealed to a temperature of 900 C or above, to remove lattice damage and activate the two P donors. Next, an array of metallic electrodes are fabricated above the donor positions, using EBL and standard metal lift-off. These electrodes serve as the S-gates and B-gates for the charge qubit. Any metal combination capable of lift-off may be used for the gates, such as a Ti/Au bilayer of thicknesses 20 nm/40 nm. Finally, two single electron transistor (SET) devices are fabricated close to the donor sites. These SETs will be used to detect the electron position. The SETs are made from Al, with $Al_2O_3$ tunnel barriers, and are fabricated using EBL with a standard bilayer resist (PMMA/Co-polymer) and double-angle shadow evaporation process.

Using the first approach, alignment of the S- & B-gates, and of the SETs, to the donor positions is achieved by registering each stage of EBL to a series of alignment markers deposited on the sample at the start of the process. The accuracy of EBL alignment is system specific and depends on the electron beam spot size and type of alignment marker. In practical terms accuracy better than 20 nm is challenging, however, there is no fundamental reason why accuracies as small as the spot size (below 2 nm on some systems) cannot be achieved. The fact that this approach requires two post-alignment steps means that it will have inherent misalignment accuracies. This will mean that the B- and S-gate voltages for charge qubit operation will need to be determined for each device, using an appropriate calibration procedure.

An example of a one qubit, two P donor device, fabricated by the above method, is shown in FIG. 21. The device has two SETs. By cross-correlating the current from both SETs it is possible to reject spurious signals and confirm true electron transfer between donors. The five gates at bottom are used as B and S-gates and the gate-width of 20 nm allows for an inter-donor spacing, R=60 nm. The alignment between control gates and SETs in this device is better than 20 nm in both x and y directions. This device has about 100 P donors implanted at each site, however, this number can be reduced to one donor per site. The device demonstrates that the architecture described here is physically realisable.

Another example of a one qubit, two P donor device, fabricated by a very similar method, is shown in FIG. 22 and is described further in A. S. Dzurak et al., cond-mat/0306265 (2003). In contrast with the device in FIG. 21, this device uses two coupling electrodes made of Ti/Au metal which are evaporated in the same step as the three control gates (S,B,S). These couplers then connect to the island electrodes of two $Al/Al_2O_3$ SETs in such a way as to provide maximal coupling between the buried P donors and the SETs. The device has registration between buried P donors and surface gates of 50 nm or better. The ends of the coupling electrodes are nominally positioned directly above the buried donors to maximise capacitive coupling. The two SETs on the device are made using a standard $Al/Al_2O_3$ technology. FIG. 22(*b*) is an expanded view of the central region. This device has two buried clusters of implanted P donors, each with 600 P atoms per cluster, separated by 80 nm. Quasi-periodic electron transfer between the two P-atom clusters, controlled by the surface S-gates, has been demonstrated in these devices, and these electron transfers has been detected by the two SETs on the surface in coincidence measurements. Similar devices have been constructed which have only two P atoms, one at each site, where the P atoms have been configured using electrically-registered single-ion implantation, as described above.

Increased donor positioning accuracy can be achieved using a second, self-alignment approach, as described in R. P. McKinnon et al., *Smart Materials and Structures* 11, 735 (2002). This approach uses the metal S- and B-gates themselves as part of the ion implant mask. Firstly, on-chip ion detectors are fabricated for implant registration. Following this the S- and B-gates are deposited, using EBL and metal lift-off. The sample is then coated with a layer of organic resist (such as PMMA) and a single cross-line is exposed in the PMMA using EBL. Following development of the cross-line, two apertures are produced for ion implantation. Once again, the on-chip detectors are used to limit implantation to only two ions, and then the sample must be annealed to remove damage. Because this anneal step occurs with the control gates in place it places a stringent requirement on the choice of gate-metal. The metal must have a very low diffusion rate through the thin (<5 nm) $SiO_2$ barrier layer at high temperatures of order 900 C. This issue is also of critical importance for the fabrication of MOSFETs with very thin gate oxides for VLSI applications and a number of candidate metals, including W and Ta, have been proposed which have low diffusivities at high temperature. Following the anneal step two SETs are fabricated on the device using an identical process to that described for approach 1. Here the SETs may suffer some misalignment, but this will only modify their charge detection sensitivities.

In a third approach, perfect self-alignment between implanted donors, control gates and readout SETs may be achieved using a trilayer resist process, described previously in T. M. Buehler et al., *Nanotechnology* 13, 686 (2002). Once again, the first step involves the fabrication of on-chip ion detectors. Next, a single line is exposed using EBL in a single layer non-organic resist, such as PMGI, and then developed. This line defines the locus of points where the implanted donors will lie. Following this, a standard bilayer resist (PMMA/Copolymer) is coated above the patterned PMGI, and a second pattern for the gates and SETs is exposed using EBL. The bilayer is then partially developed to open apertures for ion implantation only where the two patterns intersect. Following controlled implantation, limited to only two donors using the on-chip detectors, the bilayer is fully developed to open a cavity in the middle layer and the lower layer of PMGI is fully removed. The gates and SETs are then deposited by evaporating metal through the remaining resist structure from three-separate angles, using a shadow evaporation approach. In this way, the SETs are perfectly aligned to the control gates, and hence the donors. The most established way of fabricating SETs by shadow evaporation is using Al metal, and oxidizing this in a controlled way to form $Al_2O_3$ tunnel barriers. A drawback of this fully aligned approach is that the annealing step, required to remove implant damage, must be performed following the gate and SET deposition. High temperature anneals above 500 C are likely to result in damage of thin $Al_2O_3$ tunnel barriers, while anneals up to 900 C will lead to diffusion of Al through the $SiO_2$ barrier layer. The development of SETs using different metals, with much lower diffusion would therefore be required. Alternatively, a lower temperature annealing process would need to be established.

We note that the fabrication of a two donor device using the first or second approach is already possible. Although the localisation of the implanting ion beam to single sites has not yet been achieved, the use of a standard blanket (unfocused) implant will lead to a 50% yield of ideally-configured devices, with one P donor at each of the two sites. This yield is acceptable for demonstration purposes and makes possible immediately the demonstration of a single charge qubit.

Bottom-Up Fabrication

The bottom-up strategy utilises both scanning tunnelling microscopy (STM) and molecular beam epitaxy (MBE) to create a P qubit array in Si, and does not suffer from the problems of ion implantation straggle and substrate damage that are inherent to the top-down approach. The bottom-up strategy is a four-stage process. Firstly, a clean Si(001) surface is passivated with a monolayer of H. This "H-resist" layer is subsequently patterned at the level of removing individual H atoms from the surface by applying controlled voltage pulses to an STM tip in tunnelling contact with the surface. The third stage of the process is to expose the patterned H-resist surface to phosphine ($PH_3$) gas, allowing individual $PH_3$ molecules to bond with the exposed sites of bare Si. The final step in the process is to use MBE to overgrow layers of Si and encapsulate the fabricated P array. Such STM based hydrogen lithography has previously been proposed for the assembly of atomically-ordered device structures; in particular for the fabrication of single-electron integrated circuits.

A completely defect-free area of a low defect density Si(001) surface is optimally-prepared using a standard thermal treatment, described previously. In the Si(001)2×1 surface there are rows of paired Si—Si atoms (dimers). After exposure to atomic H at a substrate temperature of ~600 K a near uniform coverage of the monohydride phase, where one H atom bonds to each Si atom, occurs. Should a combination of monohydride and dihydride phases occurs (i.e., one monohydride dimer adjacent to a single dihydride species) we get, a H:3×1 reconstruction. A surface of purely monohydride phase can be formed by using a slightly higher substrate temperature during H-dosing.

An area of a hydrogen passivated Si(001) surface can be patterned using an STM tip. In particular, two hydrogen atoms can be removed from this surface by "pulsing" an STM tip to −7 V and 1 nA for ~1 ms at two locations above the H passivated surface. These pulses have caused the desorption of two individual H atoms from the surface, exposing two surface Si atoms. Each of these Si atoms has an electron in a "dangling bond" orbital. The dangling bonds present reactive sites for the adsorption of chemical species such as phosphine—in fact the sticking coefficient of $PH_3$ to the clean silicon surface is very close to unity. The effectiveness of the H resist as a barrier to phosphine adsorption is demonstrated by the uniform H coverage after $PH_3$ dosing except at the previously desorbed sites. There is a characteristic increase of ~0.05 nm in the height of the protrusion after phosphine dosing. This increase, which was seen reproducibly at a number of sites, confirms the adsorption of a $PH_3$ molecule and corresponds to the difference between the exposed silicon dangling bond and the adsorbed phosphine.

The final step, currently underway, is the encapsulation of the phosphorus qubits in a crystalline lattice of silicon. The main difficulty in this step is to ensure the P atoms incorporate into the Si crystal and remain in an ordered array. The most direct route to achieving this is to desorb the H resist from the surface by heating to ~825 K followed by epitaxial Si growth over the P array. A possible concern with this level of heating is the potential to induce lateral surface diffusion of the P atoms in the array. However there is evidence that the phosphorus atom in $PH_x$ (x=2,3) molecules, which has a single bond to the silicon, incorporates into the silicon=surface over the lower temperature range of 620-720 K.

Experimental Demonstration of Single Qubit Rotation

We now describe an experimental demonstration of the ability to perform and measure using SETs, a single qubit rotation with a P—$P^+$ charge qubit. This experiment is also used to determine the coherence time $T_2$ of the qubit. It is a direct analogue of the landmark experiment performed by Nakamura et al [Y. Nakamura, Y. A. Paskin and J. S. Tsai, Nature 398, 786 (1999)] to measure quantum oscillations in superconducting qubits.

Figure 18:
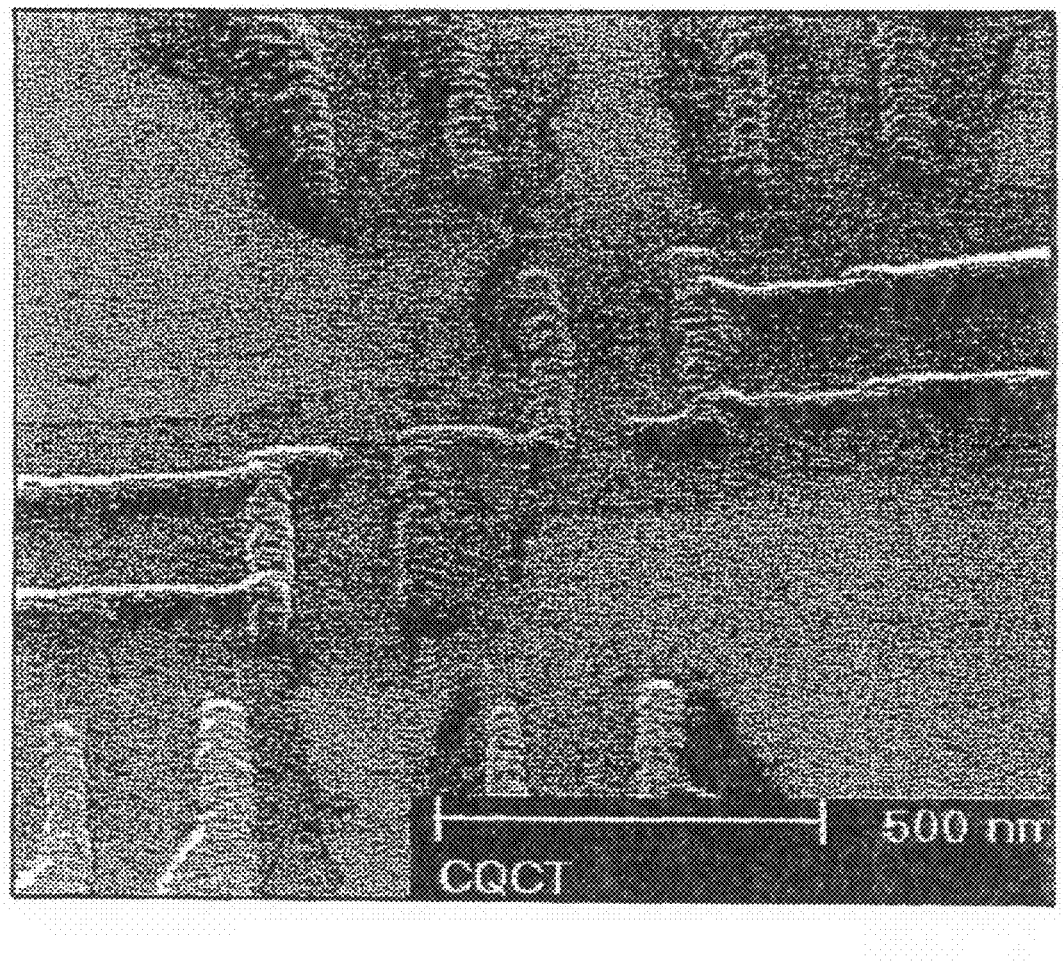
FIG. 18 is an SEM image showing two SETs (a "twin-SET" device) which can be operated at a frequency up to 500 MHz, which is the frequency range required to perform charge qubit read-out.
Figure 19:
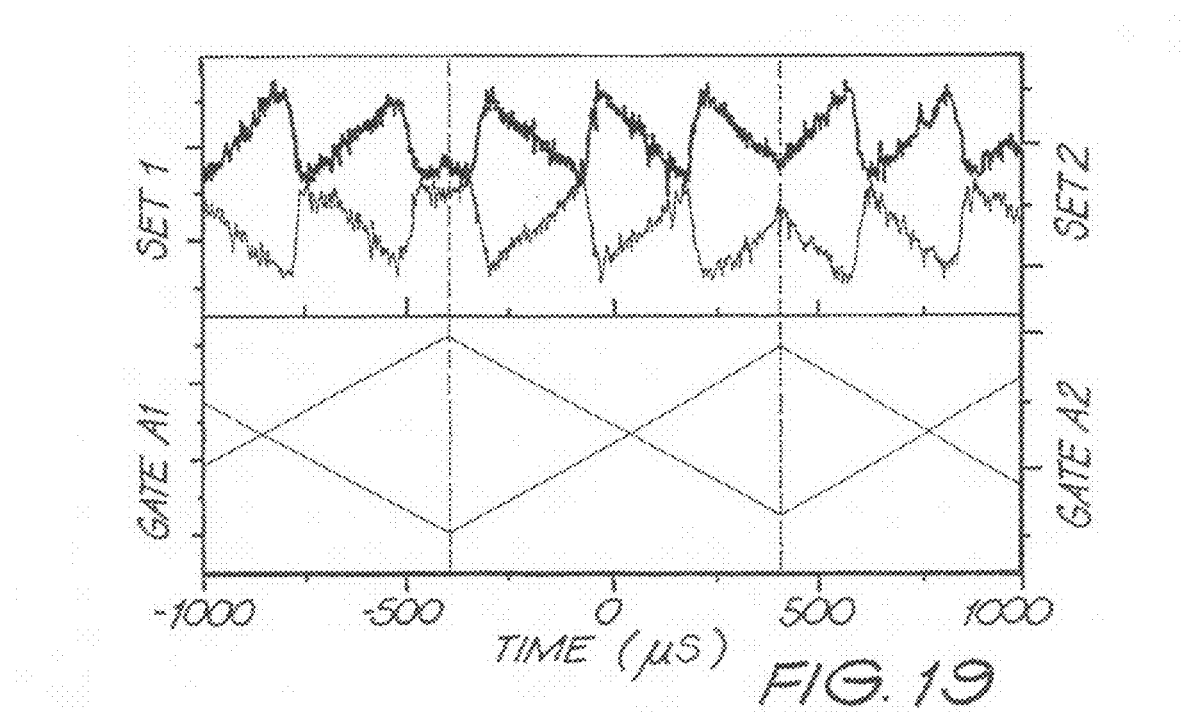
FIG. 19 is experimental data obtained with a device like that shown in FIG. 18. The data shows the current through SET-1 and SET-2 as single electrons are transferred between two metallic islands located between the SETs.

The experiment requires an ability to measure the transfer of a single electron charge between two P donors on a timescale shorter than the relaxation time of the system, $T_{dissipation} = T_1$. This measurement can be made significantly more reliable by using the cross-correlated outputs of two SETs, as described by Buehler et al [T. M. Buehler et al., cond-mat/0207597 (2002)]. An example of a twin-SET device used for such cross-correlation measurements is shown in FIG. 18. FIG. 19 shows data obtained using this device, which shows that both SETs respond to the transfer of single electrons between two metallic islands located between the SETs. Of particular note is the fact that the SETs are measuring the charge transfer in a "single shot" measurement, and that the measurements are occurring on the microsecond timescale.

Figure 20:
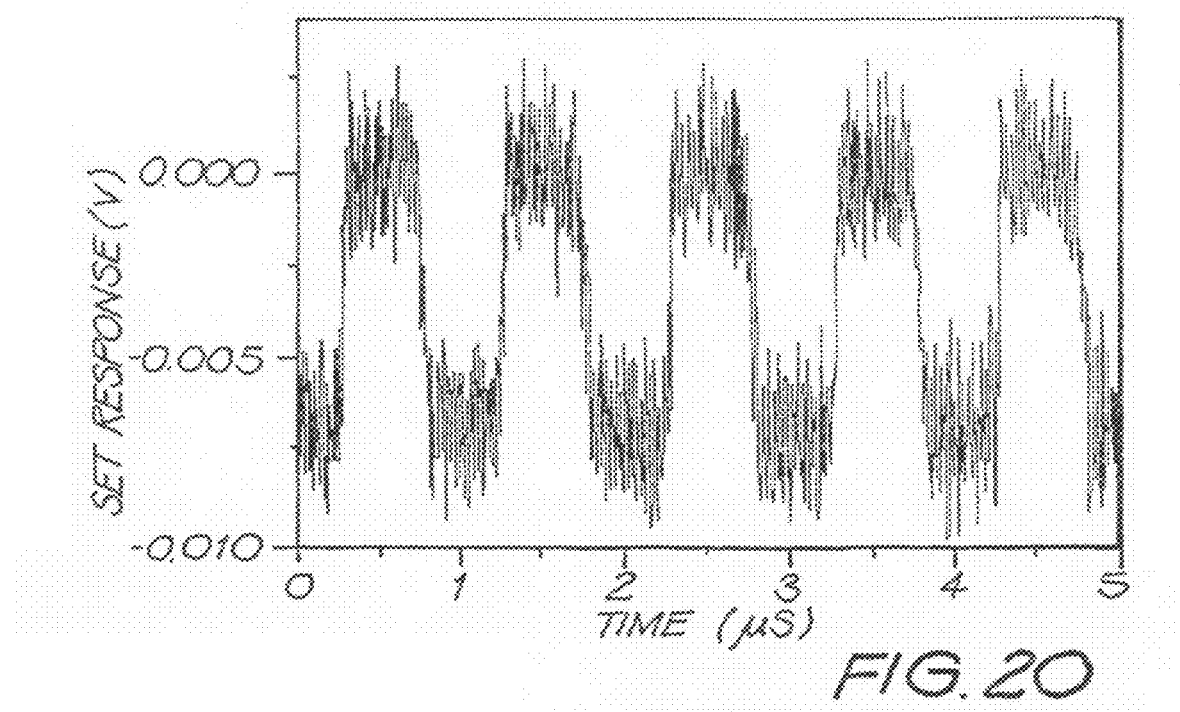
FIG. 20 is experimental data obtained with a device like that shown in FIG. 18. The SET can respond to a changing potential (or charge movement) on a timescale of 100 ns, which is expected to be less than the relaxation time $T_1$ for the qubit. This indicates that charge qubit read-out should be possible with such a device.

The limitation on the speed of SET charge position readout is set by the shot-noise within the SET, and corresponds to a minimum required read-out time $t_{min}$, given by $(t_{min})^{1/2} = 1.2 \times 10^{-6} e/\Delta q$, where $\Delta q$ is the change of charge that is detected. Based on measurements obtained by Buehler et al (2002), we find $t_{min}$=10 ns for our P—P$^+$ system. This is confirmed experimentally, as shown in FIG. 20, which shows that equivalent values of Δq to our P—P$^+$ system, when simulated using the device of FIG. 18, can be detected on timescales of around 100 ns. We note that we expect relaxation times $T_{dissipation}$ to exceed this timescale by an order of magnitude, or greater.

The proposed experiment to perform coherent qubit rotations, and read-out the result, is described schematically in FIG. 17.

Figure 3A:
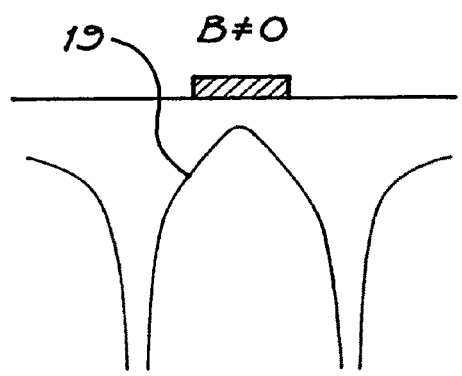
FIG. 3(a) is a potential diagram of the P—P$^+$ charge qubit showing the effect on the barrier of a non zero voltage on the B-gate.

In this proposed experiment a single P—P$^+$ qubit is carefully controlled by the external S and B gates, and measured at precisely defined intervals to determine the effect of decoherence on the quantum evolution of the system. In order to describe the physics of the experiment we will concentrate on an ideally fabricated P—P$^+$ qubit as shown in FIG. 3a.

The experiment is carried out in several stages.

Stage 1: Localisation/Initialization

At initial time T=0, the S-gate is set at or near the point $S_0$=−0.1 V (or lower), which will localise the electron in the left eigenstate $|\Psi(T=0)\rangle = |L\rangle$.

Stage 2: S-Gate Pulse

If we now pulse the S-gate swiftly to zero, with a fall-time of $T_{fall}$ (assumed to be short), the system is forced into a superposition of the $S_0$=0 eigenstates (symmetric and antisymmetric states):

$$|\Psi(T_{fall})\rangle = |L\rangle = \frac{1}{\sqrt{2}}(|S\rangle + |A\rangle).$$

Stage 3: Rabi Evolution

While $S_0$=0 the system is allowed to evolve through its natural Rabi transitions $|S\rangle \leftrightarrow |A\rangle$ for a time $T_{pulse}$. The state becomes:

$$|\Psi(T_{fall}+T_{pulse})\rangle = \frac{1}{\sqrt{2}}\left(e^{-iE_S T_{pulse}/\hbar}|S\rangle + e^{-iE_A T_{pulse}/\hbar}|A\rangle\right)$$

$$= \frac{1}{\sqrt{2}} e^{-iE_S T_{pulse}/\hbar}\left(|S\rangle + e^{-i\Delta E_{SA} T_{pulse}/\hbar}|A\rangle\right).$$

Stage 4: S-Gate Pulse

The S-gate is pulsed swiftly back to the original T=0 value over a time $T_{rise}$, and the state, in terms of the localized $S_0 \neq 0$ eigenstates, becomes:

$$|\Psi(T_{fall}+T_{pulse}+T_{rise})\rangle =$$
$$\frac{1}{\sqrt{2}}e^{-iE_S T_{pulse}/\hbar}\left(\frac{1}{\sqrt{2}}[|L\rangle+|R\rangle] + e^{-i\Delta E_{SA} T_{pulse}/\hbar}\frac{1}{\sqrt{2}}[|L\rangle-|R\rangle]\right) =$$
$$\frac{1}{2}e^{-iE_S T_{pulse}/\hbar}\left([1+e^{-i\Delta E_{SA} T_{pulse}/\hbar}]|L\rangle + [1-e^{-i\Delta E_{SA} T_{pulse}/\hbar}]|R\rangle\right)$$

As long as $T_{pulse} \gg T_{fall/rise}$ we obtain essentially a state of the form:

$$|\Psi(T_{fall}+T_{pulse}+T_{rise})\rangle = C_L(T_{pulse})|L\rangle + C_R(T_{pulse})|R\rangle.$$

Stage 5: Measurement

Switching on the SET and measuring the state will give a left or right localized state as determined by the distributions:

$$P_{L,R}(T_{pulse}) = |C_{L,R}(T_{pulse})|^2 = 2\left[1 \pm \cos\frac{\Delta E_{SA} T_{pulse}}{\hbar}\right].$$

Repeating the process many times for each $T_{pulse}$ will result in a measurement of the Rabi oscillations, and the decoherence time.

The hierarchy of time scales is important to consider. The controlling scale is of course the decoherence time. Although we do not know this before the measurement, we expect this to be of the order of 1-10 ns based on the GaAs measurement. Taking this range as our lower bound, we therefore require $T_{Rabi}$<1 ns in order to see Rabi oscillations. If we use the Nakamura experimental parameters as a guide, we can set $T_{Rabi}$=100 ps and use fast pulse generators with $T_{rise/fall}$=30 ps.

To the extent that we have described single qubit dynamics in section 2 a time dependent analysis can be carried out on the results expected from realistic pulse shapes. Furthermore, the first P—P$^+$ devices will not be ideally or symmetrically gated and will require detailed characterization, possibly using an extra S-gate.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A quantum device, comprising:
   an electrically inert solid semiconductor substrate within which there is;
   a charge qubit comprising a pair of dopant atoms having a net charge and an electric field having two potential wells, wherein the two potential wells are located adjacent respective dopant atoms;
   and wherein a location of the net charge in the electric field having two potential wells defines a logical state of the charge qubit;
   and wherein a first gate is located over a potential barrier between the two potential wells to control a barrier height; and
   at least one second gate is located to control relative shapes and sizes of the two potential wells, wherein the semiconductor substrate and the dopant atoms are selected to create a system equivalent to an artificial H$_2^+$ molecule.

2. A quantum device according to claim 1, wherein the logical state of the charge qubit is defined by a the location of a single electron in one of the two potential wells.

3. A quantum device according to claim 1, wherein the logical state of the charge qubit is defined by lowest symmetric or antisymmetric molecular states.

4. A quantum device according to claim 1, wherein spacing between the dopant atoms is up to 200 nm.

5. A quantum device according to claim 4, wherein the spacing between the dopant atoms is in a the range of 20 to 100 nm.

6. A quantum device according to claim 1, wherein the two dopant atoms are buried in the substrate to a depth up to 200 nm.

7. A quantum device according to claim 6, wherein the two dopant atoms are buried in the substrate to a depth in a range of 5 to 50 nm.

8. A quantum device according to claim 1, wherein the semiconductor substrate is coated with an insulating layer.

9. A quantum device according to claim 8, wherein the insulating layer is $SiO_2$.

10. A quantum device according to claim 1, wherein gate electrodes are placed on a surface of the substrate above the dopant atoms to allow for external control of charge wavefunctions, wherein the first gate is a 'barrier' gate or B-gate.

11. A quantum device according to claim 10, wherein the at least one second gate is a 'potential off-set', 'symmetry' or S-gate.

12. A quantum device according to claim 11, wherein suitable biasing of the first and second gates allows one qubit logic operation to be performed.

13. A quantum device according to claim 9, wherein one or more charge detection devices are provided on a surface of the substrate for charge qubit readout and to confirm initialization of the charge qubit.

14. A quantum device according to claim 13, wherein the one or more charge detection devices is a sensitive field-effect transistor or a single electron transistor (SET).

15. A quantum device according to claim 1, wherein a configuration comprising two dopant atoms, surface gates and surface charge detection devices is repeated many times on a single silicon chip, allowing for scale-up to a many charge qubit processor.

16. A quantum device according to claim 15, wherein the device is cooled to ensure that the dopant atoms are not thermally ionized and to minimize coupling of the charge qubits to an environment.

17. A quantum device according to claim 16, wherein the device is cooled to 4K or below.

* * * * *

UNITED STATES PATENT AND TRADEMARK OFFICE
CERTIFICATE OF CORRECTION

PATENT NO.         : 8,148,715 B2
APPLICATION NO.    : 12/660085
DATED              : April 3, 2012
INVENTOR(S)        : Hollenberg et al.

It is certified that error appears in the above-identified patent and that said Letters Patent is hereby corrected as shown below:

Please delete Patent 8148715 in its entirety and insert Patent 8148715 in its entirety as shown on the attached pages.

Signed and Sealed this
Twenty-fourth Day of September, 2013

Teresa Stanek Rea
*Deputy Director of the United States Patent and Trademark Office*

(12) United States Patent
Hollenberg et al.

(10) Patent No.: US 8,148,715 B2
(45) Date of Patent: *Apr. 3, 2012

(54) SOLID STATE CHARGE QUBIT DEVICE

(75) Inventors: Lloyd Christopher Leonard Hollenberg, Richmond (AU); Andrew Steven Dzurak, Darlinghurst (AU); Cameron Wellard, Nth. Carlton (AU); Alexander Rudolf Hamilton, Forestville (AU); David J. Reilly, Allawah (AU); Gerard J. Milburn, St. Lucia (AU); Robert Graham Clark, Balgowah Heights (AU)

(73) Assignee: Qucor Pty. Ltd., New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/660,085

(22) Filed: Feb. 19, 2010

(65) Prior Publication Data

US 2011/0049475 A1 Mar. 3, 2011

Related U.S. Application Data

(63) Continuation of application No. 10/524,951, filed on Dec. 8, 2005, now Pat. No. 7,732,804.

(51) Int. Cl.
H01L 31/00 (2006.01)
(52) U.S. Cl. .............. 257/14; 257/9; 257/24; 257/288; 257/E29.168; 257/E45.005; 257/E49.003; 977/933
(58) Field of Classification Search ............. 257/9, 14, 257/24, 288, E29.168, E45.005, E49.003; 977/933
See application file for complete search history.

(56) References Cited

U.S. PATENT DOCUMENTS 6,369,404 B1 * 4/2002 Kane ...................... 257/14
7,732,804 B2 * 6/2010 Hollenberg et al. ......... 257/14

* cited by examiner

*Primary Examiner* — Jay C Kim
(74) *Attorney, Agent, or Firm* — Wood, Phillips, Katz, Clark & Mortimer

(57) ABSTRACT

This invention concerns a quantum device, suitable for quantum computing, based on dopant atoms located in a solid semiconductor or insulator substrate. In further aspects the device is scaled up. The invention also concerns methods of reading out from the devices, initializing them, using them to perform logic operations and making them.

17 Claims, 18 Drawing Sheets

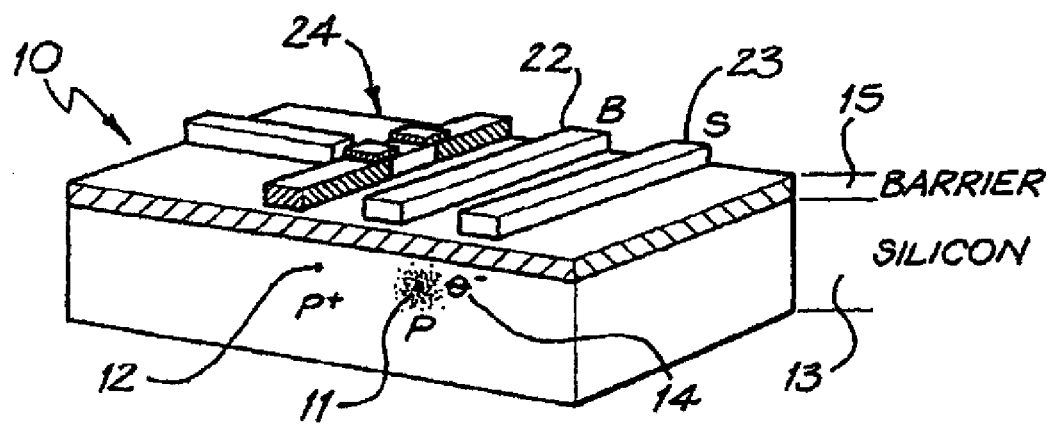

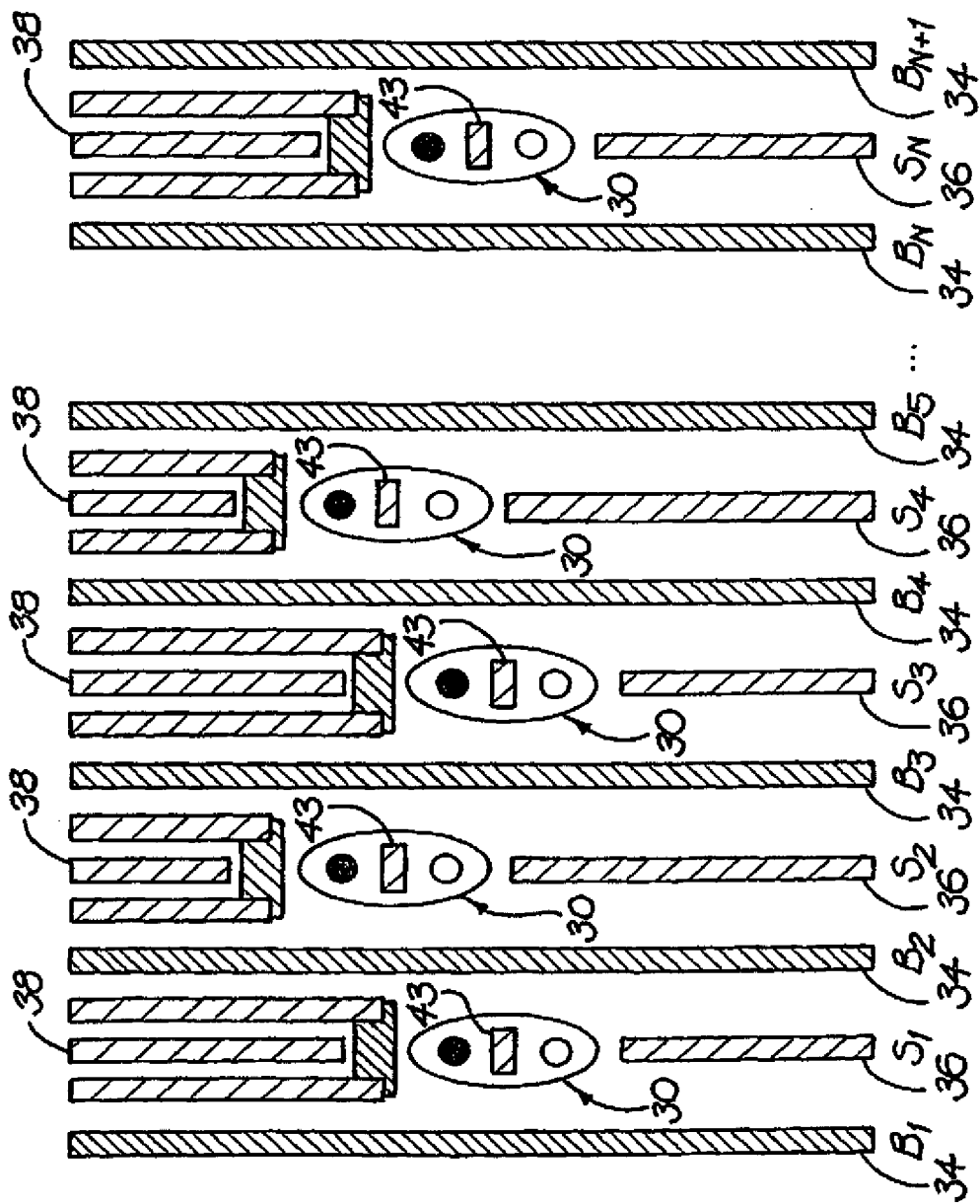

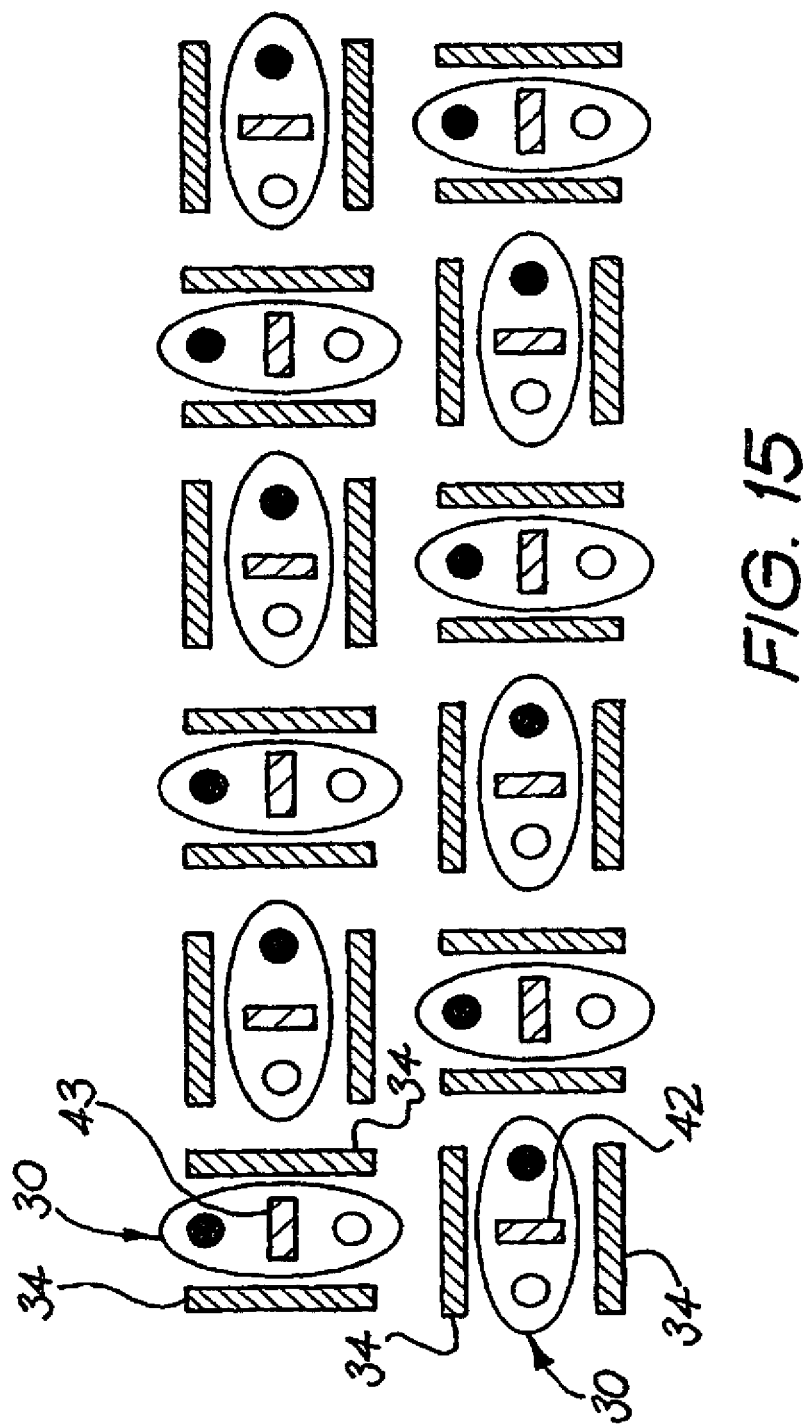

SOLID STATE CHARGE QUBIT DEVICE

CROSS REFERENCE TO RELATED APPLICATION

This application is a continuation of Utility application Ser. No. 10/524,951, filed Dec. 8, 2005 now U.S. Pat. No. 7,732,804.

TECHNICAL FIELD

This invention concerns a quantum device, suitable for quantum computing, based on dopant atoms located in a solid semiconductor or insulator substrate. In further aspects the device is scaled up. The invention also concerns methods of reading out from the devices, initializing them, using them to perform logic operations and making them.

BACKGROUND ART

There are a number of existing proposals for quantum computing (QC) based on charge qubits in the solid-state. There is also the Kane proposal for a real spin quantum device based upon phosphorus donor atoms in silicon. Proposals relevant to this invention are now presented in chronological order:
Logical devices implemented using quantum cellular automata,
P. D. Tougaw and C. S. Lent, J. Appl. Phys. 75, 1818 (1994).
Conditional quantum dynamics and logic gates,
A. Barenco, D. Deutsch, Ekert and Josza, *Phys. Rev. Lett.* 74, 4083 (1995).
Minimal energy requirements in communication,
R. Landauer, *Science* 272, 1914 (1996).
Coupled quantum dots as quantum XOR gate,
J. A. Brum and P. Hawrylak, *Superlattices and Microstr.* 22, 431 (1997).
Quantum information in semiconductors: Noiseless encoding in a quantum-dot array,
P. Zanardi and F. Rossi, *Phys. Rev. Lett.* 81, 4752 (1998).
Quantum computation with quantum dots,
D. Loss and D. P. DiVincenzo, *Phys. Rev. A* 57, 120 (1998).
A silicon-based nuclear spin quantum computer,
B. E. Kane, *Nature* 393, 133 (1998).
Microwave spectroscopy of a quantum-dot molecule,
T. H. Oosterkamp, T. Fujisawa, W. G. van der Wiel, K. Ishibashi, R. V. Hijman, S. Tarucha and L. P. Kouwenhoven, *Nature* 395, 873 (1998).
Dephasing in open quantum dots,
A. G. Huibers, M. Switkes, C. M. Marcus, K. Campman and A. C. Gossard, *Phys. Rev. Lett.* 81, 200 (1998).
Coupled quantum dots as quantum gates,
G. Burkard, D. Loss and D. P. DiVincenzo, *Phys. Rev. B* 59, 2070 (1999).
Quantum gates by coupled asymmetric quantum dots and CNOT-gate operation,
T. Tanamoto, *Phys. Rev. A* 61, 022305 (2000).
Coherent properties of a two-level system based on a quantum-dot photodiode,
A. Zrenner, E. Beham, S. Stufler, F. Findeis, M. Bichler and G. Abstrieter, *Nature* 418, 612 (2002).
High coherent solid-state qubit from a pair of quantum dots,
Xin-Qi Li and YiJing Yan, quant-ph/0204027 (2002).
Two-electron quantum dots as scalable qubits,
J. H. Jefferson, M. Feam, D. L. J. Tipton and T. P. Spiller, quant-ph/0206075 (2002).

The potential of quantum information processing relies on one of the most fragile resources in nature—quantum entanglement. Even without the destructive influence of environmental decoherence a practical quantum computer requires hundreds, if not thousands of gates to perform useful tasks. Since a system of qubits can never be totally isolated from the environment, error-correcting schemes must be incorporated in the design and encoding of the qubits, further increasing the number of qubits required.

The real challenge is to prove the principle of QC in a technology which is inherently scalable. This does not simply mean the ability to make a large number of interconnected qubits. The concept of scalability requires that the error probability per qubit be kept below some threshold determined by fault tolerant implementations. What that threshold actually is depends on the particular implementation and the physical origin of decoherence.

DISCLOSURE OF THE INVENTION

The invention is a quantum device comprising a pair of dopant atoms located in an otherwise electrically inert solid substrate, such as a semiconductor or insulator, in which it is possible to ionise the dopant atoms. The dopant may be an electron donor or an electron acceptor. The two dopants produce a double-well electric potential and a charge qubit is realised by the location of one or more electrons or holes within this potential.

In one example a pair of phosphorus (P) atoms are located in a silicon (Si) substrate. Ionisation of one of the donor electrons creates a P—$P^+$ system, equivalent to an artificial $H_2^+$ molecule. The logical states of the charge qubit is formed by either the location of a single electron in one or other well of the double-well potential, or by the lowest symmetric and antisymmetric molecular states. The spacing between the P atoms may be up to 200 nm. More specifically it may be in the range 20 to 80 nm. The basic qubit and definition of logical states can be expressed in terms of left and right localized states with respect to the double-well potential, or interms of delocalized molecular states.

The two P atoms may be buried up to 200 nm below the surface of the device. More specifically they may be buried in the range 5 to 50 nm.

The silicon substrate may be coated with an insulating layer, such as $SiO_2$, to isolate the donor electrons from any surface electrodes.

Gate electrodes may be placed on the surface of the substrate above the donor atoms to allow for external control of the charge wavefunctions. A first gate may be located over the potential barrier, between the two wells, to control the barrier height, this gate is known as the 'barrier' gate or B-gate. Another gate, or more than one gate, may be provided for elsewhere to control the relative shapes and sizes of the two wells, this gate is known as the 'potential off-set', 'symmetry' or S-gate. Suitable biasing of these gate electrodes may allow one qubit logic operations, such as the quantum NOT operation, to be performed.

One or more charge detection devices may also be provided on the surface of the substrate for qubit readout and to confirm initialization of qubits. The charge detection device may be a sensitive field-effect transistor, or it may be a single electron transistor (SET).

The configuration described, comprising two P atoms, surface gates and read-out SETs may be repeated many times on a single silicon chip, allowing for scale-up to a many qubit processor.

The entire device may be cooled well-below room temperature to ensure that the donors are not thermally ionised and to minimise coupling of the charge qubits to the environment. More specifically it may be cooled to liquid helium temperatures of 4K or below.

In contrast with real spin qubits, a charge qubit can couple strongly to fluctuating local charge environments. This kind of coupling leads to fluctuations in the relative energies of the charge qubits and thus will be largely responsible for dephasing errors.

In comparison with existing charge qubit proposals based upon quantum dots (listed above) the P—P$^+$ charge qubit is the lowest filling quantum dot possible, with the simplest quantum-substructure. In particular, the potential wells that confine the electrons are created by single ionic potentials, rather than by lithographically patterned electrodes or clusters of atoms. For these reasons we expect the P—P$^+$ system to suffer less from decoherence than the larger quantum dot charge qubits.

It is interesting to compare directly the real-spin Kane proposal [B. E. Kane, Nature 393, 133 (1998)] with this pseudo-spin P—P$^+$ proposal. In the charge qubit case we sensibly want the system to be cooled as far as is possible to minimize environmental coupling, but we do not necessarily require a magnetic field. The decoherence of the charge qubit system will be much faster than the real-spin qubit, however, the intrinsic "clock speed" of the charge qubit is also much faster. In the case of the Kane design the CNOT gate is implemented adiabatically—the clock speed is therefore restricted to the nuclear flipping frequency, of order kHz. In the P—P$^+$ case the barrier gate may be used to tune the natural clock speed down to the level of fast pulse technology, of order GHz or faster.

Since we are no longer dealing with nuclear spin states, isotopic impurities (e.g. Si$^{29}$) will not affect the charge qubit. Therefore, one can use standard Si wafers in the fabrication process. Although we will use the P-doped Si model throughout this proposal, there is no intrinsic restriction to the P:Si system. Alternatives such as Si-doped GaAs would also be possible.

Furthermore, since the Coulomb interaction acts over a longer range than spin-spin interactions, the charge qubit devices can be made larger than their spin-based counterparts. In particular, P donors in the Kane architecture are ideally placed 20 nm apart, while the donor separation for charge qubits could be as large as 200 nm with the appropriate choice of substrate and gate potentials. This increased scale makes nanofabrication considerably easier.

Given that the fabrication process is very similar, the main advantage of the real-spin over the charge qubit is the long decoherence times. However, the trade-off is in the measurement process: measurement of the charge state qubit is considerably easier to perform than the single-spin measurement scheme as envisaged by Kane.

In another aspect, the invention is a quantum device comprising two pairs of dopant atoms, each located in a solid substrate such that two double-well potentials are created, and two charge qubits are formed by the location of one or more electrons within the double-well potentials. And where, one or more gates above the substrate control electron tunneling between the two qubits. And where, by suitable biasing of these and other gate electrodes, two-qubit logic operations, such as the quantum SWAP operation, may be performed.

In another aspect, the invention is a quantum device comprising two pairs of dopant atoms, each located in a solid substrate such that two double-well potentials are created, and two charge qubits are formed by the location of one or more electrons within the double-well potentials. And where, one or more gates above the substrate controls the Coulomb interaction between the two qubits. And where, by suitable biasing of these and other gate electrodes, two-qubit logic operations, such as the quantum CNOT or CPHASE operation, may be performed.

In another aspect, the invention is a quantum device comprising more than one of the devices comprising two pairs of donor atoms, arranged adjacent each other, and having gates to enable interaction between each adjacent pair.

In a further aspect the invention is a method of reading out the logic state of a qubit (defined in the localized logic basis) from such a quantum device, comprising the steps of:
  (i) Biasing the S-gate to a non-zero value to define a known relaxed state, for which the SET has been previously calibrated;
  (ii) Turning on the SET;
  (iii) Waiting for a period of time for the system to relax to the relaxed state;
  (iv) Monitoring SET current during the waiting period to determine whether a change of state occurs, or not;
  (v) Inferring the state before step (i) from the behaviour of the SET current monitored during step (iv).

In a further aspect the invention is a method of initializating the logic state of each qubit in such a quantum device, comprising the steps of:
  (i) Biasing the S-gate to a non-zero value to define a known relaxed state;
  (ii) Waiting for a period of time for the system to relax to the relaxed state.

In a further aspect the invention is a method of using such a quantum device to perform quantum computations, comprising typical steps which include:
  (i) Initializing each qubit in the quantum device;
  (ii) Using a suitable quantum algorithm to carry out one-qubit and two-qubit operations on the qubits in the device via an appropriately timed sequence of control gate biasing;
  (iii) Reading out the logical states of the qubits.

In a further aspect the invention is a method of making such a quantum device, comprising the steps of:
  (i) creating a resist mask for implantation of an array of one or more pairs of dopant atoms into a semiconductor substrate;
  (ii) implanting one dopant ion through each hole in the mask to form an array of buried-atom qubits;
  (iii) fabricating conducting electrodes above each implanted pair of donor atoms to serve as a B gate, an S gate and a SET;
  (iv) annealing the device to a temperature sufficient to remove implant lattice damage and activate the dopant—this step may occur either immediately before or after step (iii);
  (v) pre-initializing each pair of donor atoms to remove one of the electrons.

In a further aspect the invention is a method of making such a quantum device, comprising the steps of:
  (i) passivating a clean semiconductor surface;
  (ii) patterning the passivated surface to open an array of holes;
  (iii) exposing the resulting surface to donor atoms, perhaps in the form of dopant-bearing molecules;
  (iv) overgrowing the dopant atom array with further layers of the semiconductor and annealing if necessary;
  (v) coating the surface with an insulating layer if necessary;

(vi) fabricating conducting electrodes above each implanted pair of donor atoms to serve as a B gate, an S gate and a SET;

(vii) pre-initializing each pair of donor atoms to remove one of the electrons.

BRIEF DESCRIPTION OF THE DRAWINGS

Some examples of the invention will now be described with reference to the accompanying drawings, in which:

FIG. 1(a) is a pictorial view of a P—$P^+$ charge qubit; FIG. 1(b) is an elevational view of the charge qubit; and FIG. 1(c) is a plan view of the charge qubit.

Figure 2A:
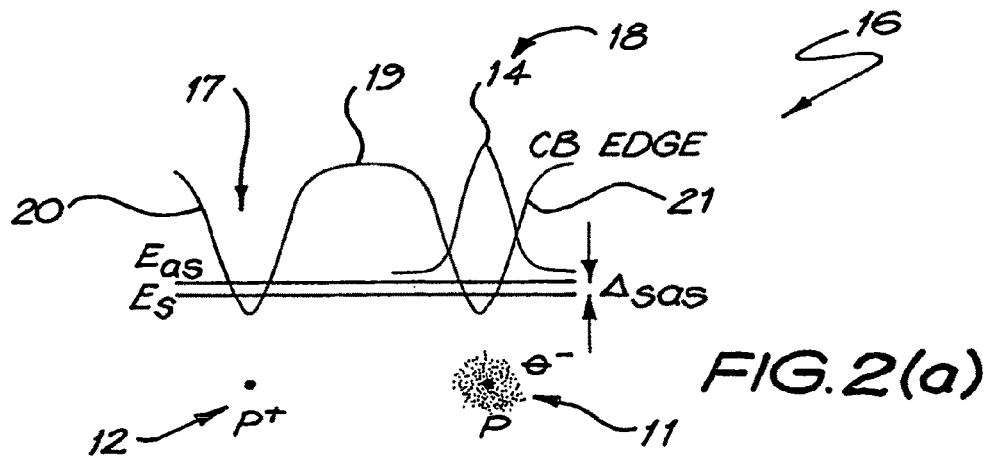
FIG. 2(a) is a potential diagram showing the double-well potential created by the charge qubit.
Figure 2B:
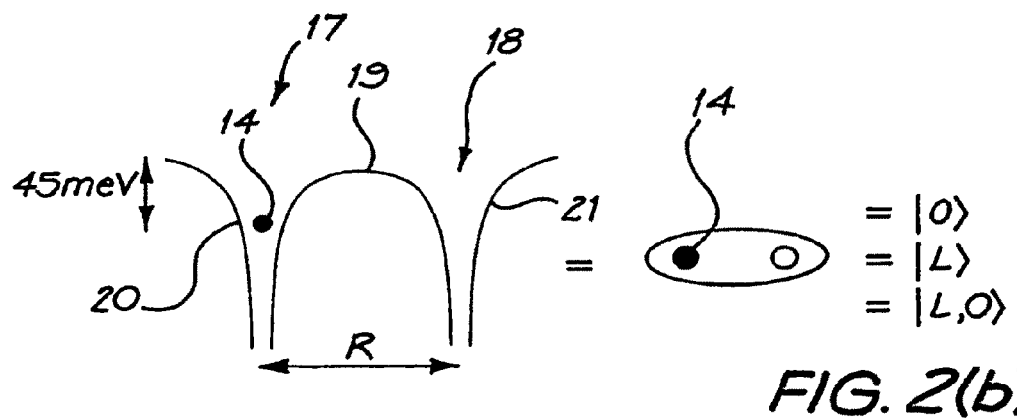
FIG. 2(b) is a potential diagram of the P—P$^+$ charge qubit with a black dot representing a localised electron state in the left hand well of the double-well potential.
Figure 2C:
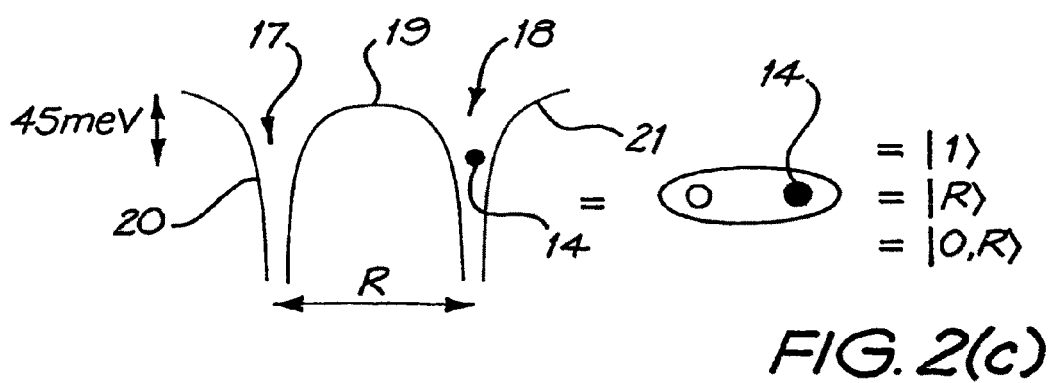
FIG. 2(c) is a potential diagram of the P—P$^+$ charge qubit with a black dot representing a localized electron state in the right hand well of the double-well potential.

FIG. 2(a) is a potential diagram showing the double-well potential created by the charge qubit; FIG. 2(b) is a potential diagram of the P—$P^+$ charge qubit with a black dot representing a localised electron state in the left hand well of the double-well potential; and FIG. 2(c) is a potential diagram of the P—$P^+$ charge qubit with a black dot representing a localized electron state in the right hand well of the double-well potential.

Figure 3B:
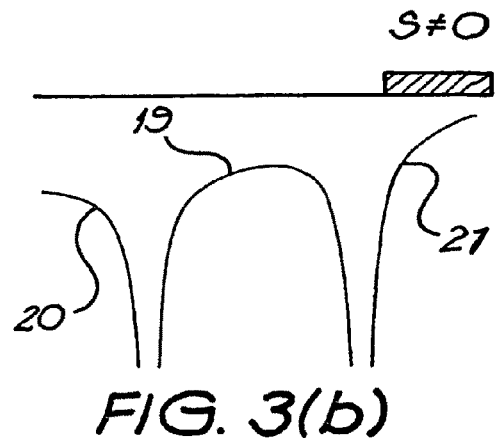
FIG. 3(b) is a potential diagram of the P—P$^+$ charge qubit showing the effect on the double-well of a non zero voltage on the S-gate.

FIG. 3(a) is a potential diagram of the P—$P^+$ charge qubit showing the effect on the barrier of a non zero voltage on the B-gate; FIG. 3(b) is a potential diagram of the P—$P^+$ charge qubit showing the effect on the double-well of a non zero voltage on the S-gate.

Figure 4B:
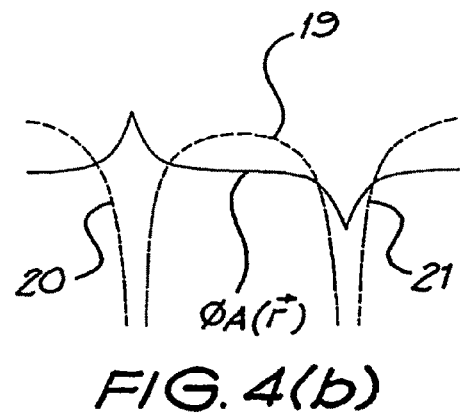
FIG. 4(b) is a potential diagram of an anti-symmetric molecular orbital wave function.

FIG. 4(a) is a potential diagram of a symmetric molecular orbital wave function; FIG. 4(b) is a potential diagram of an anti-symmetric molecular orbital wave function.

FIG. 5 is a graph showing the ungated tunnelling rate, expressed as frequency f, against the separation R, in units of Bohr radius, a.

FIG. 6 is a graph of the wave functions energies (E) against bias on the S-gate, and includes associated diagrams of the effect on the double-well potential.

Figure 7A:
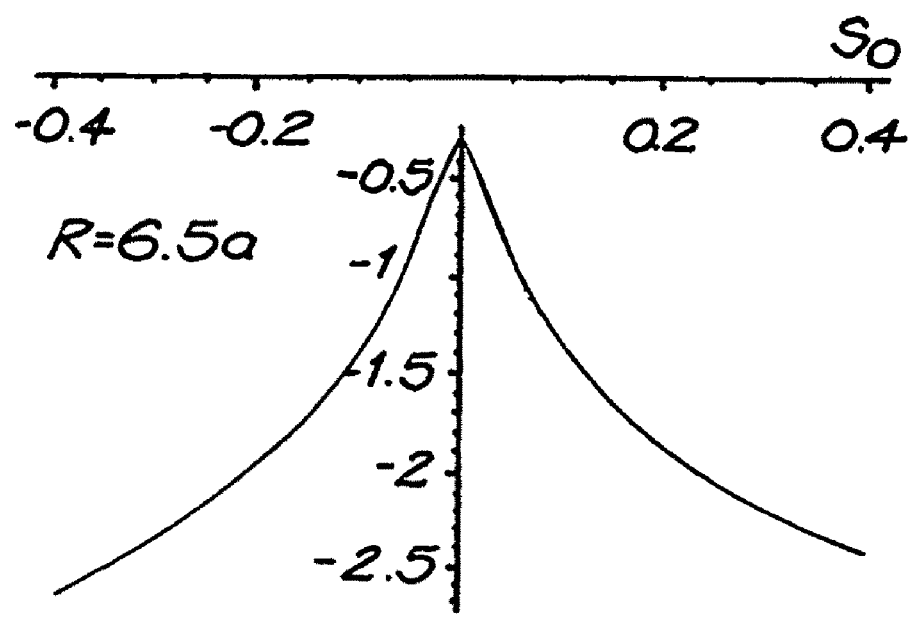
Figure 7B:
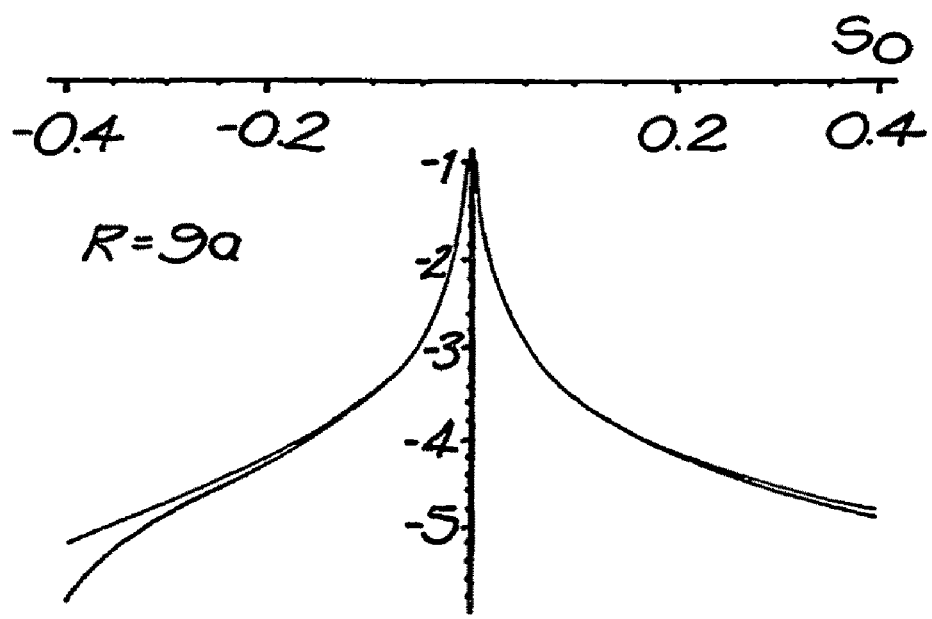

FIG. 7(a) is a logarithmic plot of the amount of non-logic state contamination in the ground and first excited states for a donor spacing R=6.5 a; FIG. 7(b) is a logarithmic plot of the amount of non-logic state contamination in the ground and first excited states for a donor spacing R=9 a.

FIG. 8 is a graph showing Energy gap vs. $\Delta B$ around point $B_0 = -0.46884$, $S_0 = 0$.

FIG. 9 is a plan view of coupled qubits in the SWAP configuration.

Figure 10A:
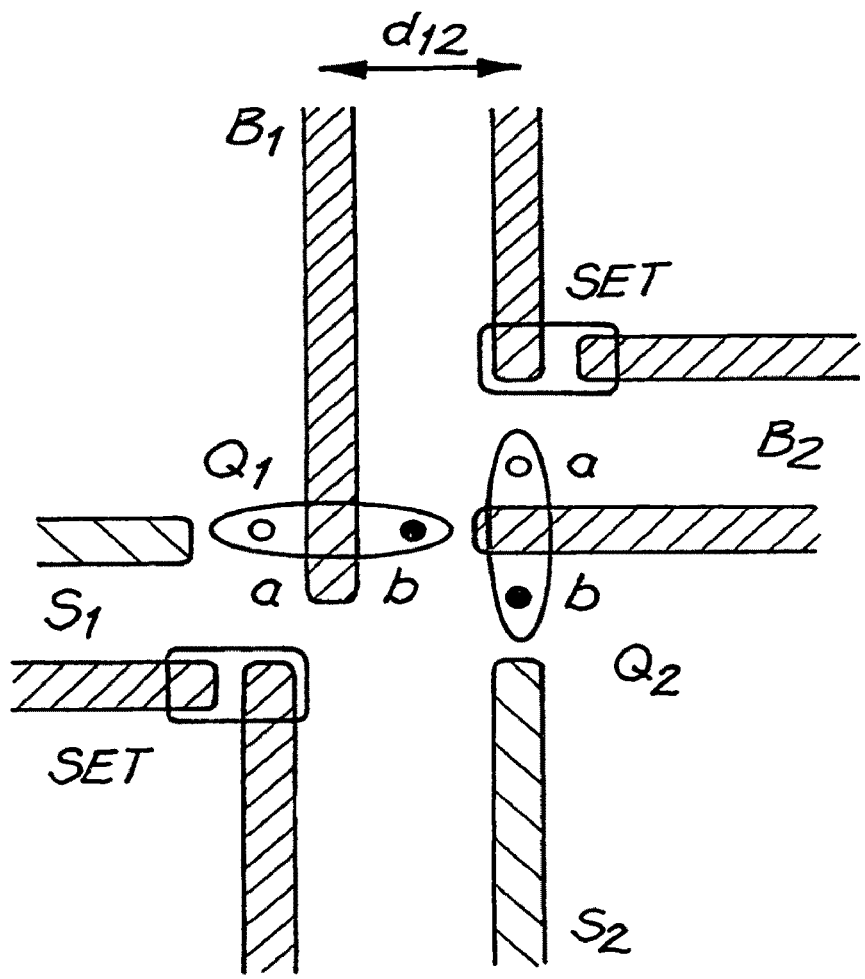
FIG. 10(a) is a plan view of coupled qubits in the CNOT configuration.
Figure 10B:
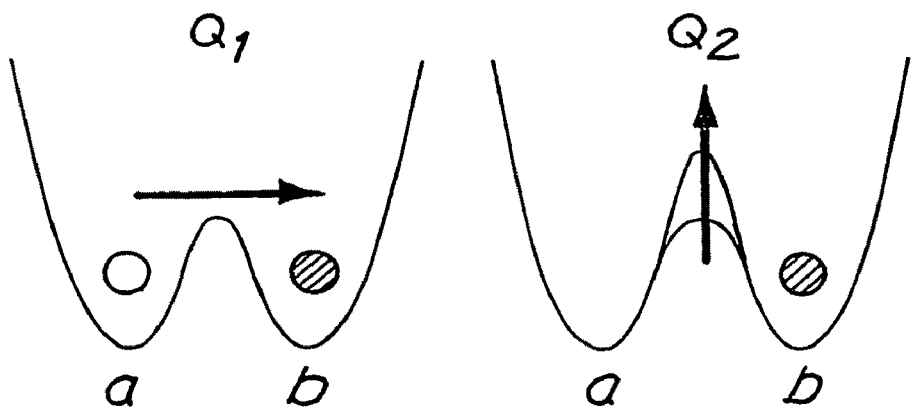
FIG. 10(b) is a diagram showing the effect of the state of qubit $Q_1$ on the barrier height of $Q_2$

FIG. 10(a) is a plan view of coupled qubits in the CNOT configuration; FIG. 10(b) is a diagram showing the effect of the state of qubit $Q_1$ on the barrier height of $Q_2$.

Figure 11A:
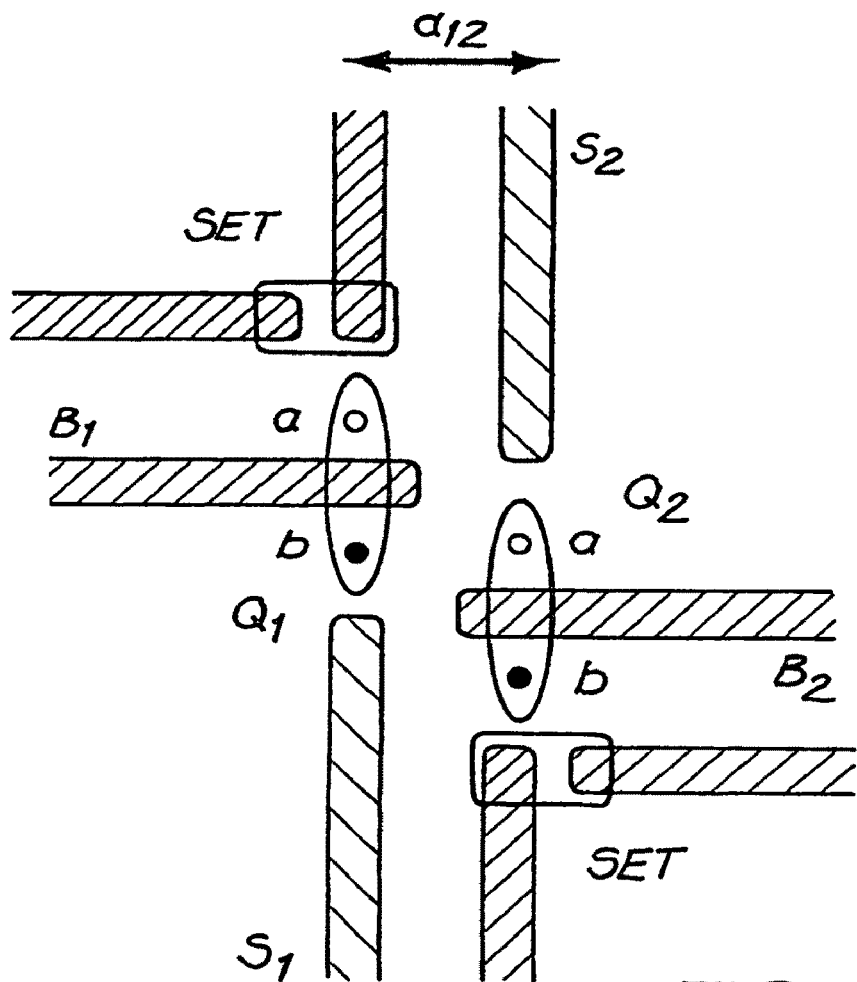
FIG. 11(a) is a plan view of coupled qubits in the staggered configuration.
Figure 11B:
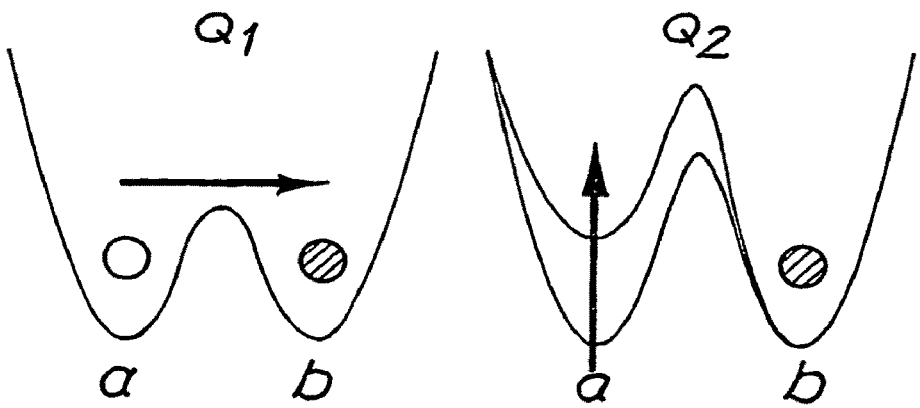
FIG. 11(b) is a diagram showing the effect of the state of qubit $Q_1$ on the potential symmetry seen by $Q_2$.

FIG. 11(a) is a plan view of coupled qubits in the staggered configuration; FIG. 11(b) is a diagram showing the effect of the state of qubit $Q_1$ on the potential symmetry seen by $Q_2$.

Figure 12A:
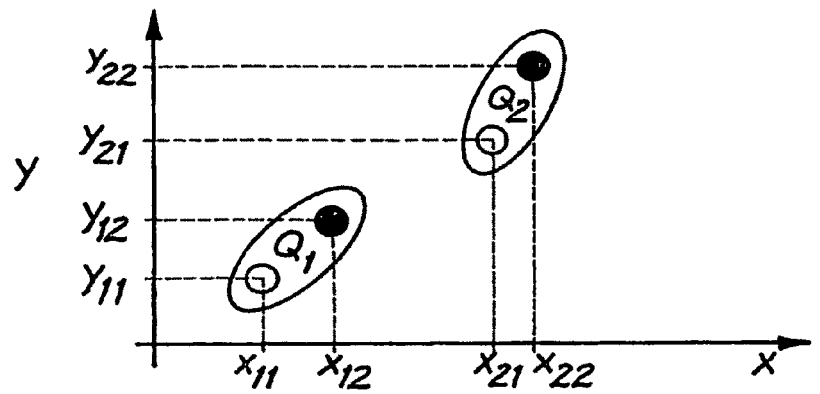
FIG. 12(a) is a two dimensional representation of two coupled ungated qubits in an arbitrary configuration.
Figure 12B:
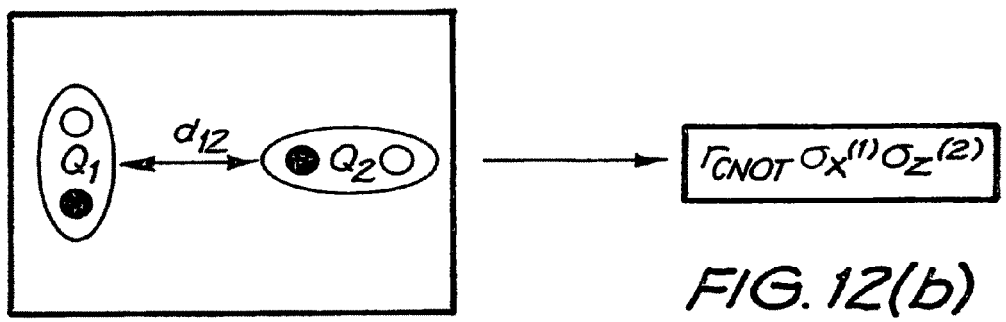
FIG. 12(b) is a two dimensional representation of two coupled ungated qubits in the CNOT configuration.
Figure 12C:
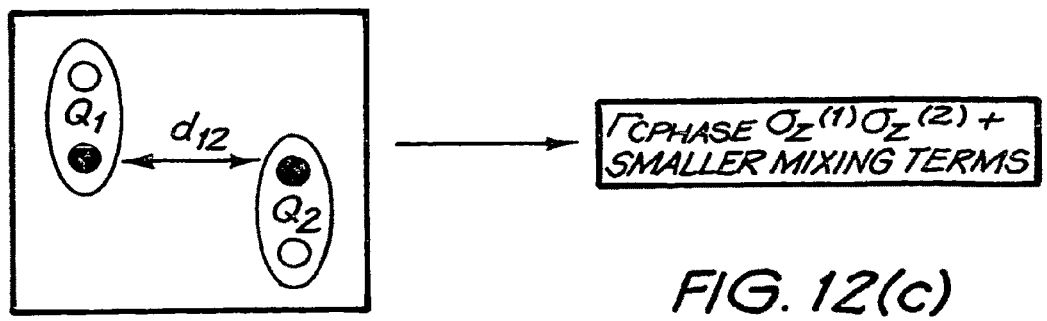
FIG. 12(c) is a two dimensional representation of two coupled ungated qubits in the CPHASE configuration.

FIG. 12(a) is a two dimensional representation of two coupled ungated qubits in an arbitrary configuration; FIG. 12(b) is a two dimensional representation of two coupled ungated qubits in the CNOT configuration; and FIG. 12(c) is a two dimensional representation of two coupled ungated qubits in the CPHASE configuration.

FIG. 13 is a plan view of N-qubit architecture based on the SWAP configuration.

FIG. 14 is a plan view of N-qubit architecture based on the staggered CPHASE configuration.

FIG. 15 a plan view of one of many possible N-node quantum cellular automata networks, which could be constructed using the P—$P^+$ qubit.

FIG. 16 is a schematic flow chart showing the readout/initialization process.

Figure 17A:
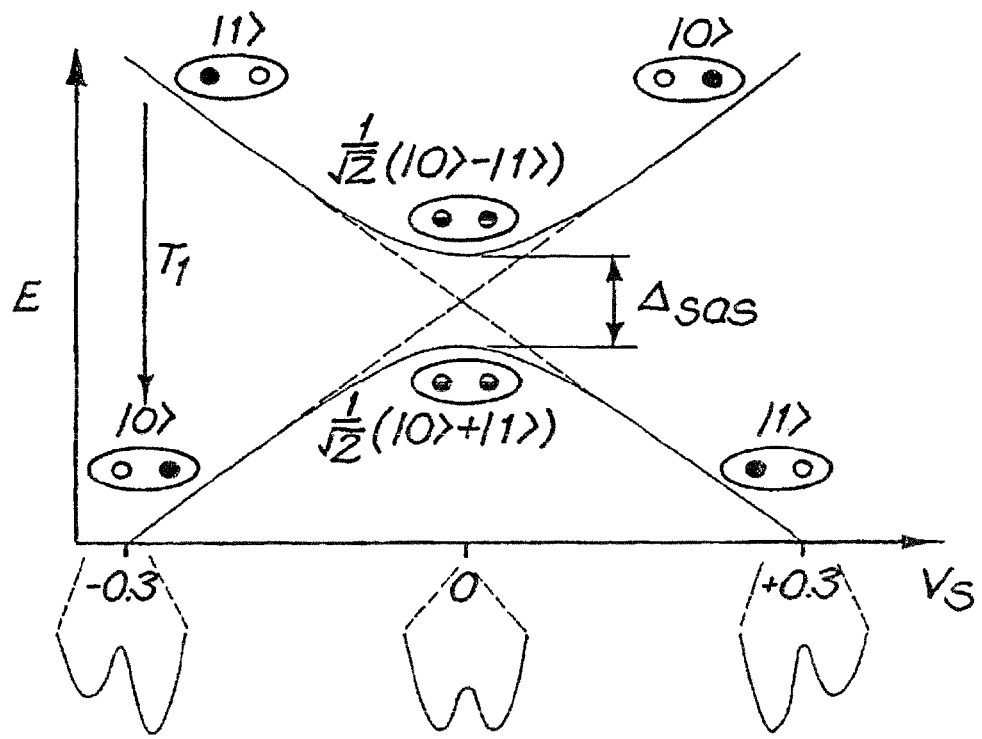
FIG. 17(a) is a diagram showing the effect of a varying S-gate potential on the eigenstates of a single qubit.
Figure 17B:
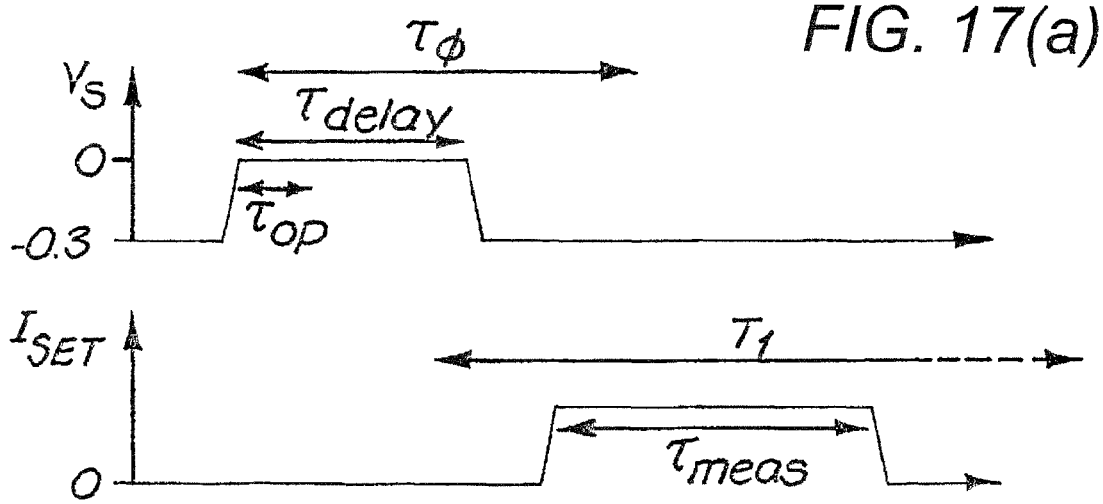
FIG. 17(b) is a pulse-timing diagram showing the sequence of pulses on the S-gate and the SET in order to study coherent one-qubit rotations.

FIG. 17(a) is a diagram showing the effect of a varying S-gate potential on the eigenstates of a single qubit; FIG. 17(b) is a pulse-timing diagram showing the sequence of pulses on the S-gate and the SET in order to study coherent one-qubit rotations.

FIG. 18 is an SEM image showing two SETs (a "twin-SET" device) which can be operated at a frequency up to 500 MHz, which is the frequency range required to perform charge qubit read-out.

FIG. 19 is experimental data obtained with a device like that shown in FIG. 18. The data shows the current through SET-1 and SET-2 as single electrons are transferred between two metallic islands located between the SETs.

FIG. 20 is experimental data obtained with a device like that shown in FIG. 18. The SET can respond to a changing potential (or charge movement) on a timescale of 100 ns, which is expected to be less than the relaxation time $T_1$ for the qubit. This indicates that charge qubit read-out should be possible with such a device.

Figure 21A:
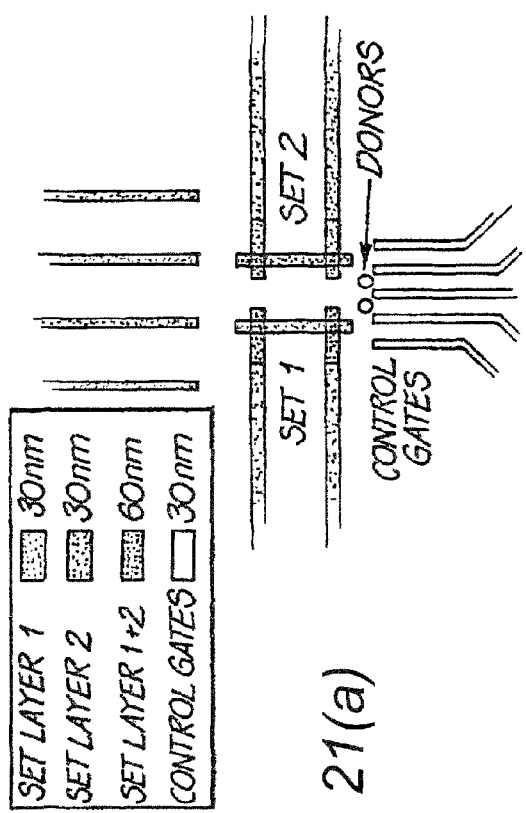
FIG. 21(a) is a schematic of a device with two implanted donors, two read-out SETs, and a series of five gates which can be used as B-gates and S-gates to control the donors.
Figure 21B:
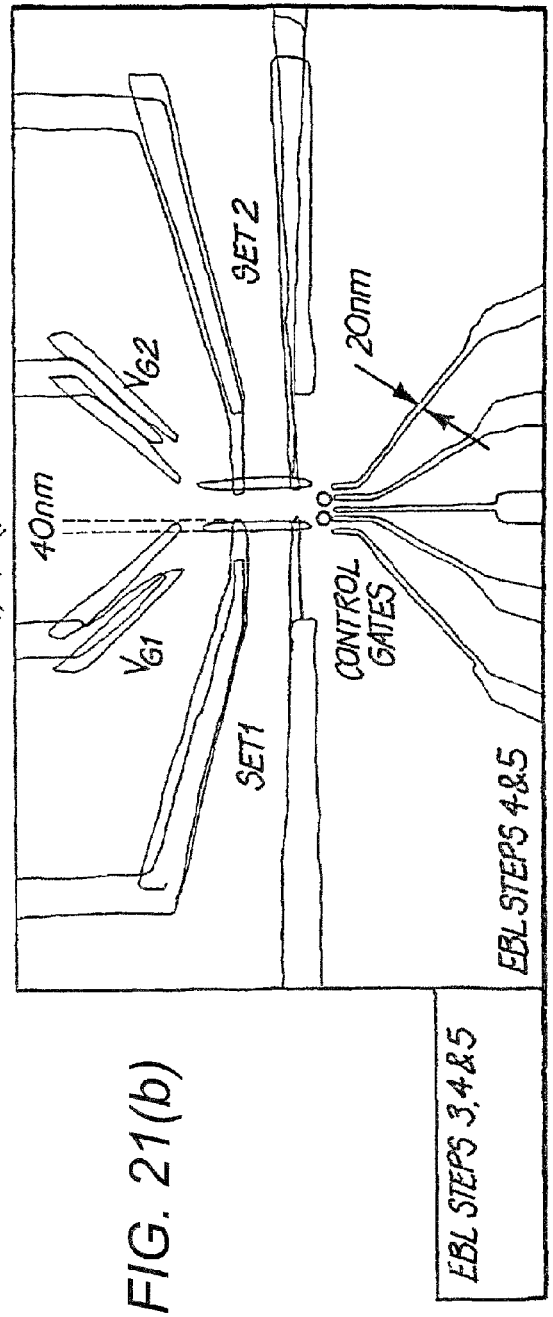
FIG. 21(b) is an SEM image of such a device that has been fabricated using a top-down production process, in which clusters of P ions have been implanted at the sites marked with circles. This device can be used for charge qubit proof-of-principle experiments.

FIG. 21(a) is a schematic of a device with two implanted donors, two read-out SETs, and a series of five gates which can be used as B-gates and S-gates to control the donors; FIG. 21(b) is an SEM image of such a device that has been fabricated using a top-down production process, in which clusters of P ions have been implanted at the sites marked with circles. This device can be used for charge qubit proof-of-principle experiments.

Figure 22A:
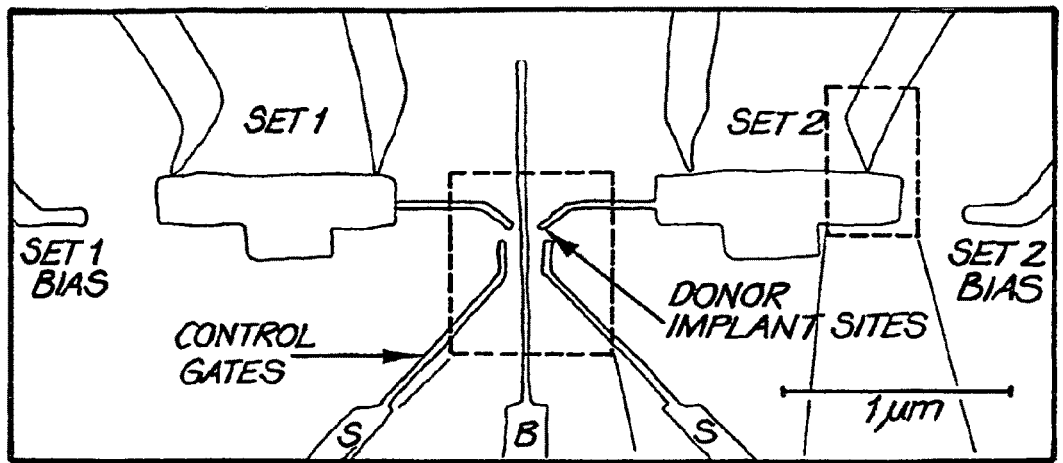
FIG. 22(a) is an SEM image of a device suitable for one qubit proof-of-principle experiments. This device has been fabricated using a 'top-down' ion implantation process. The device incorporates three surface gates (labeled S, B, S) for qubit control and also two surface coupling electrodes which capacitively couple the buried P donors to the SET island electrodes.
Figure 22B:
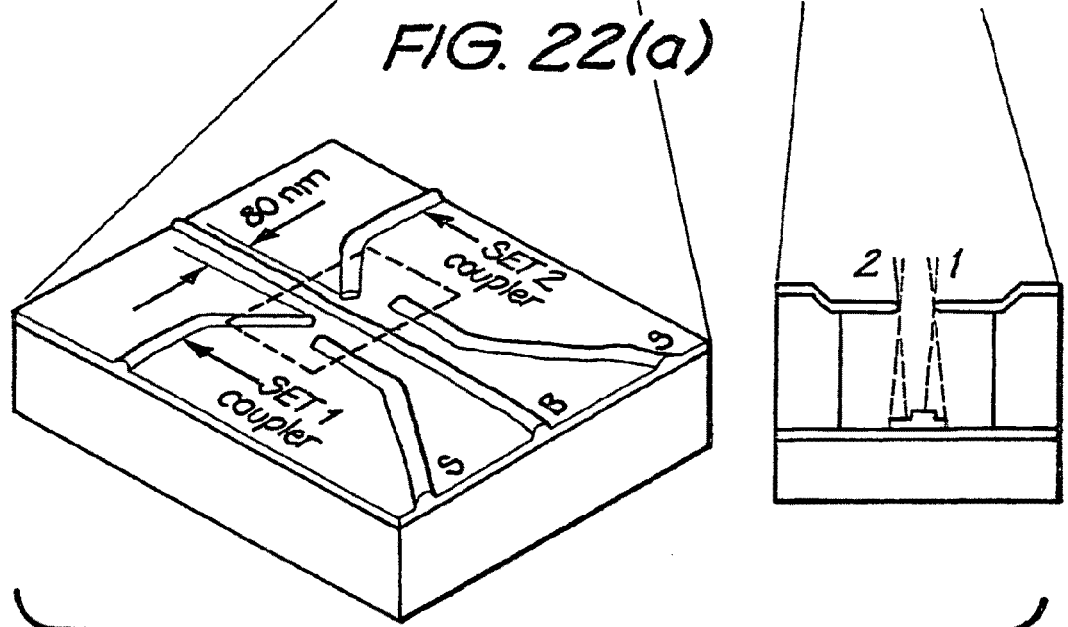
FIG. 22(b) is an expanded view of the central region.
Figure 22C:
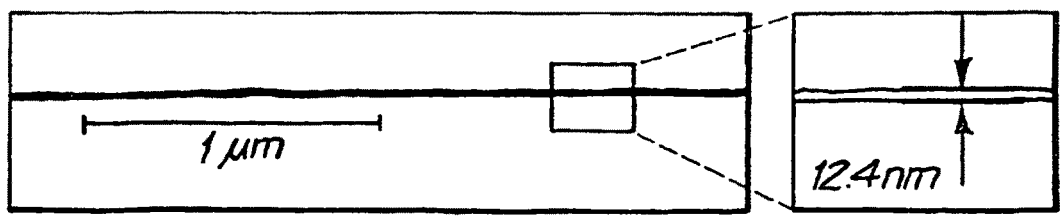
FIG. 22(c) shows narrow Ti/Au gate metallisations of just 12 nm, fabricated using electron beam lithography.
Figure 1A:
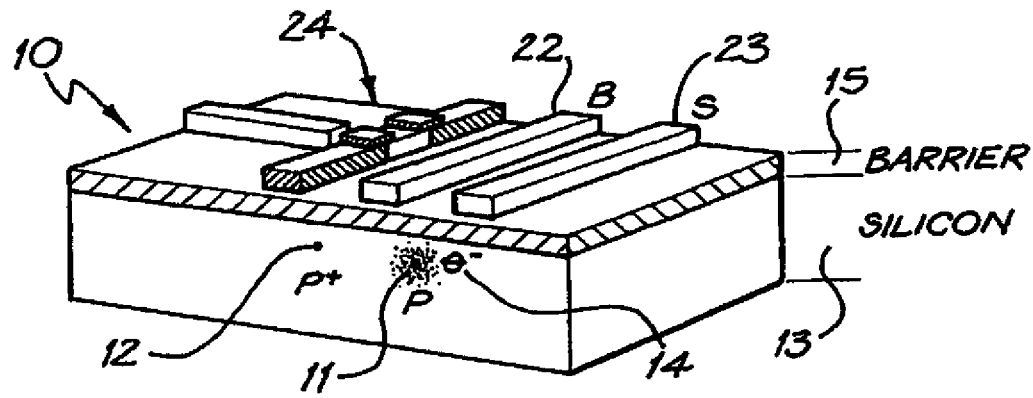
Figure 1B:
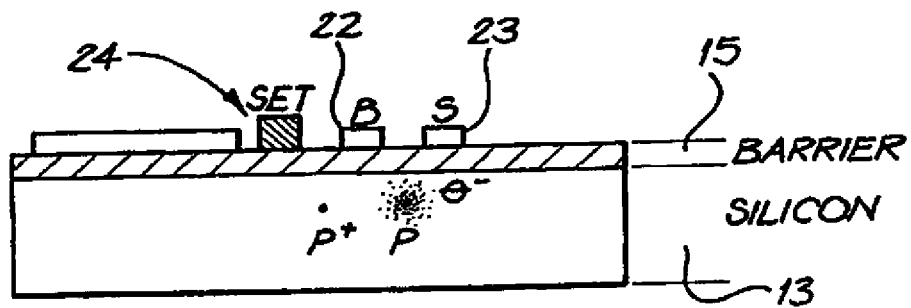
Figure 1C:
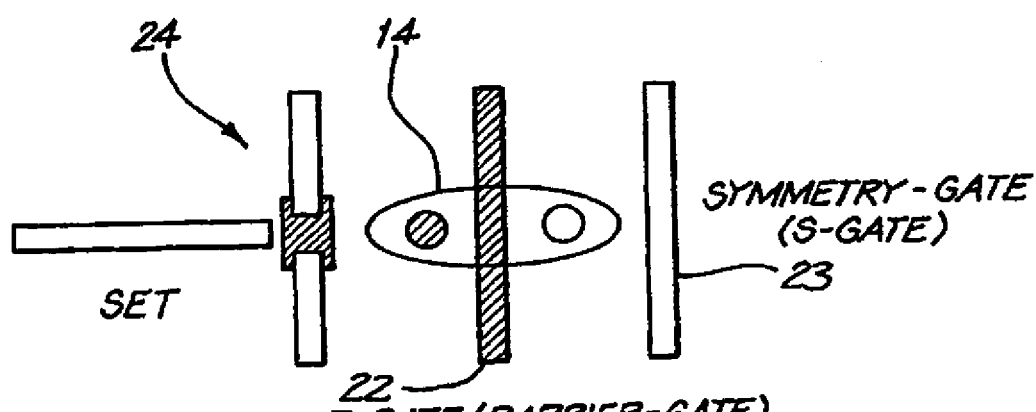
Figure 2A:
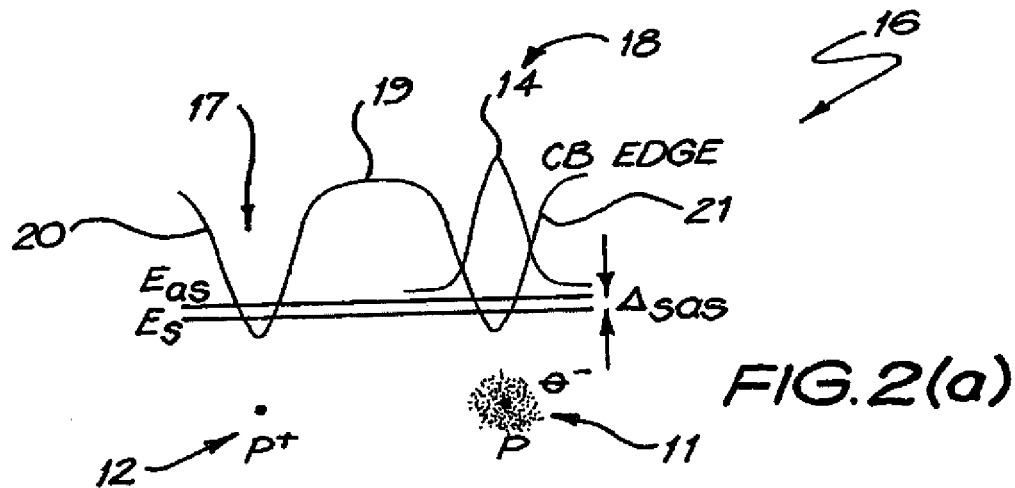
Figure 2B:
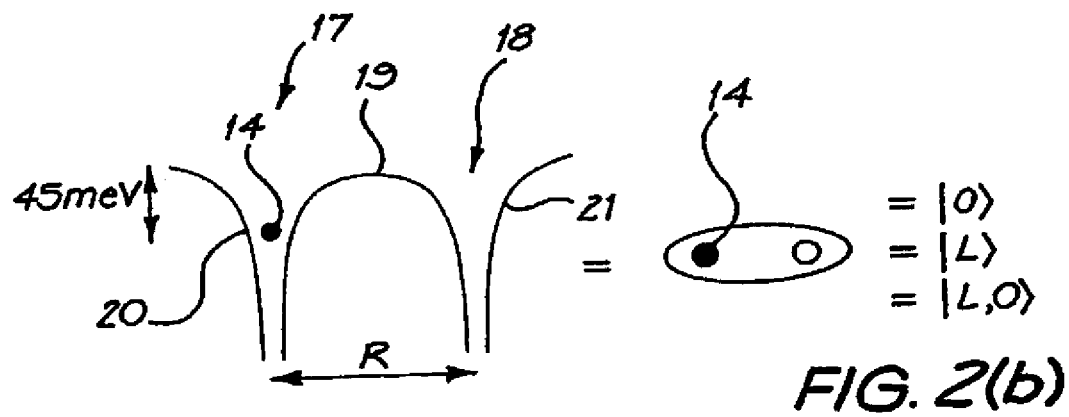
Figure 2C:
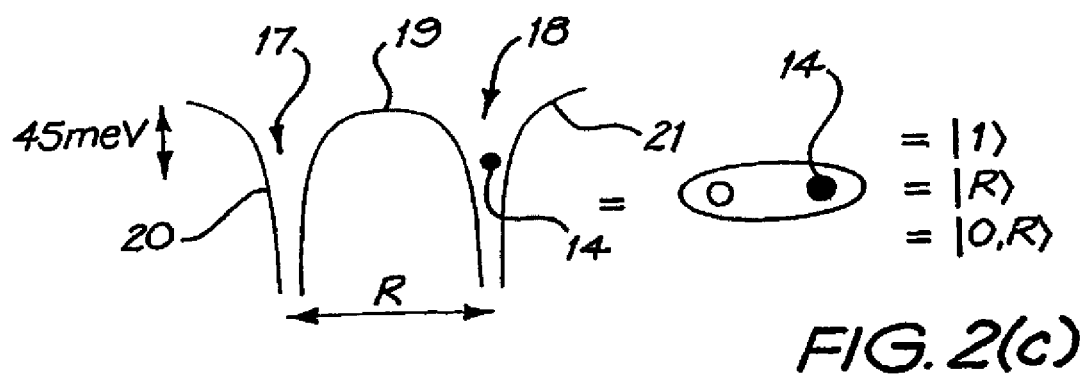
Figure 3A:
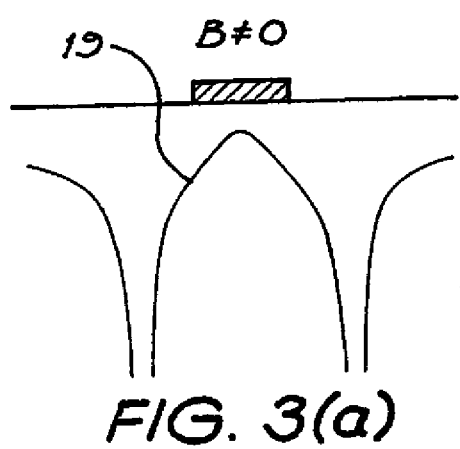
Figure 3B:
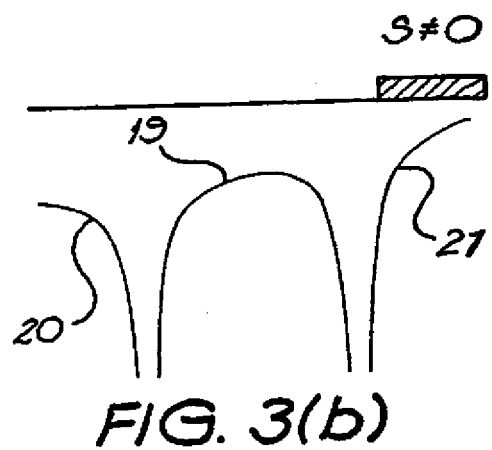
Figure 4A:
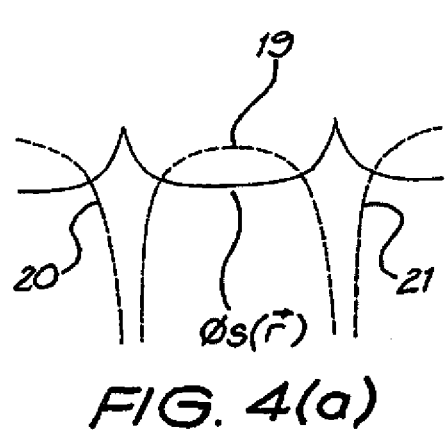
Figure 4B:
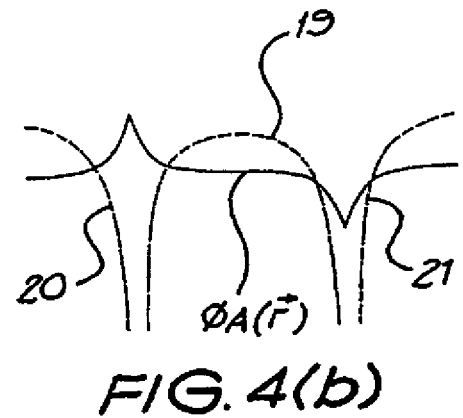
Figure 5:
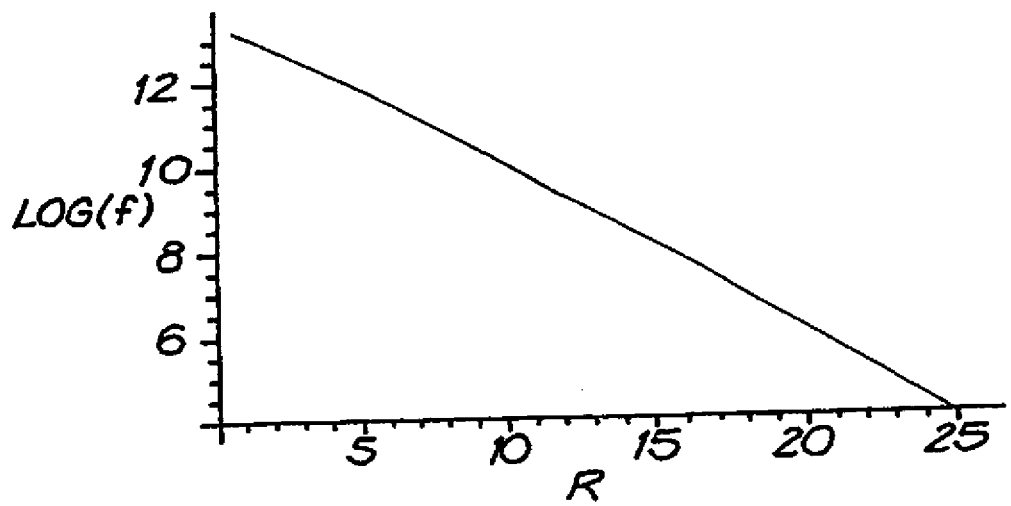
Figure 6:
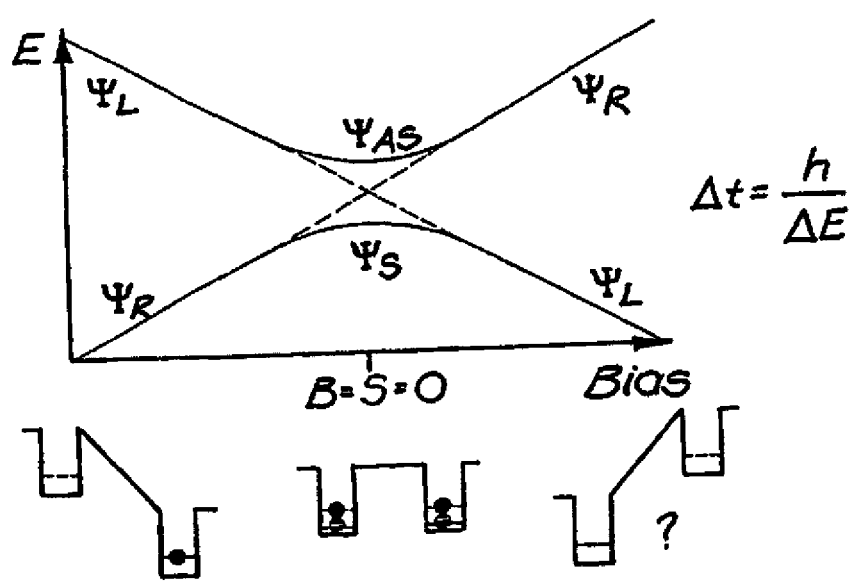
Figure 7A:
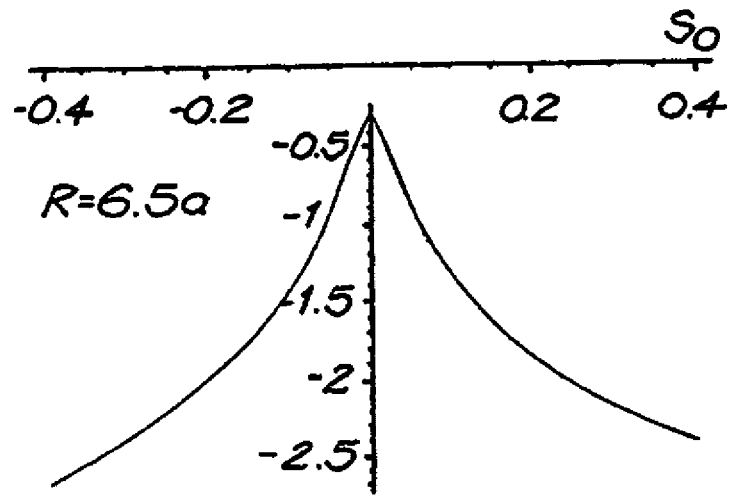
Figure 7B:
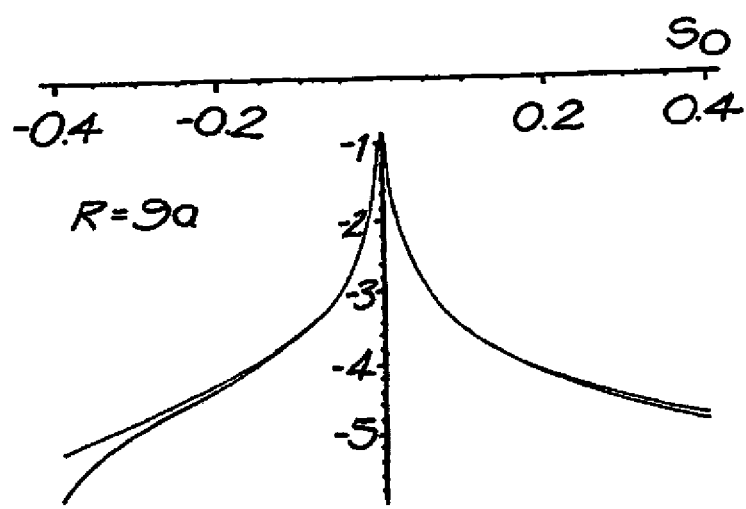
Figure 8:
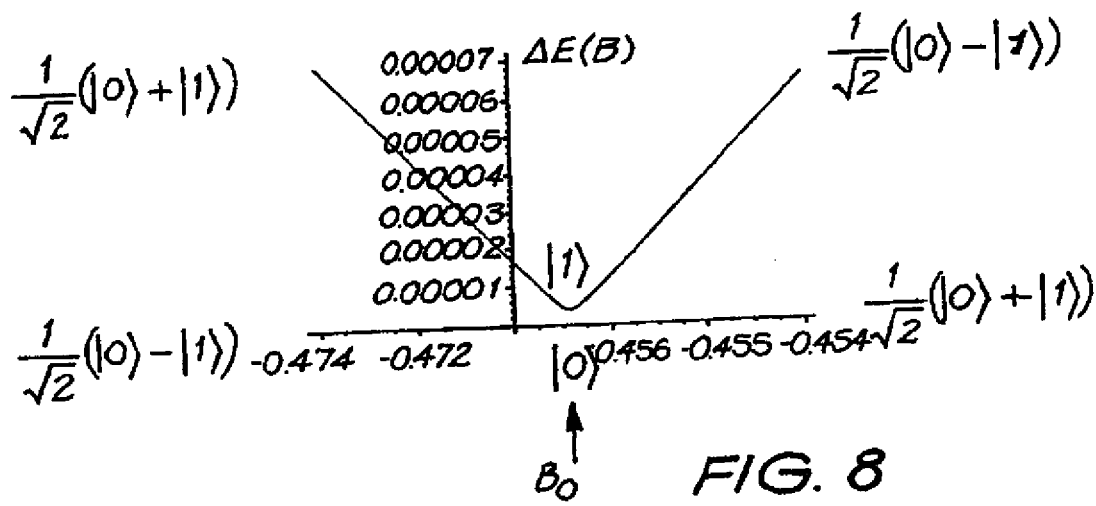
Figure 9:
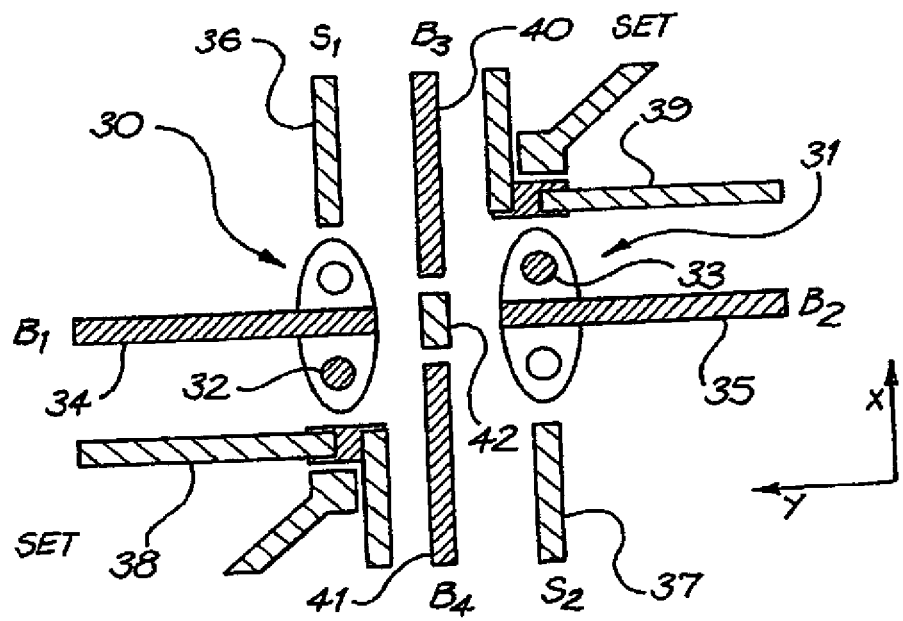
Figure 10A:
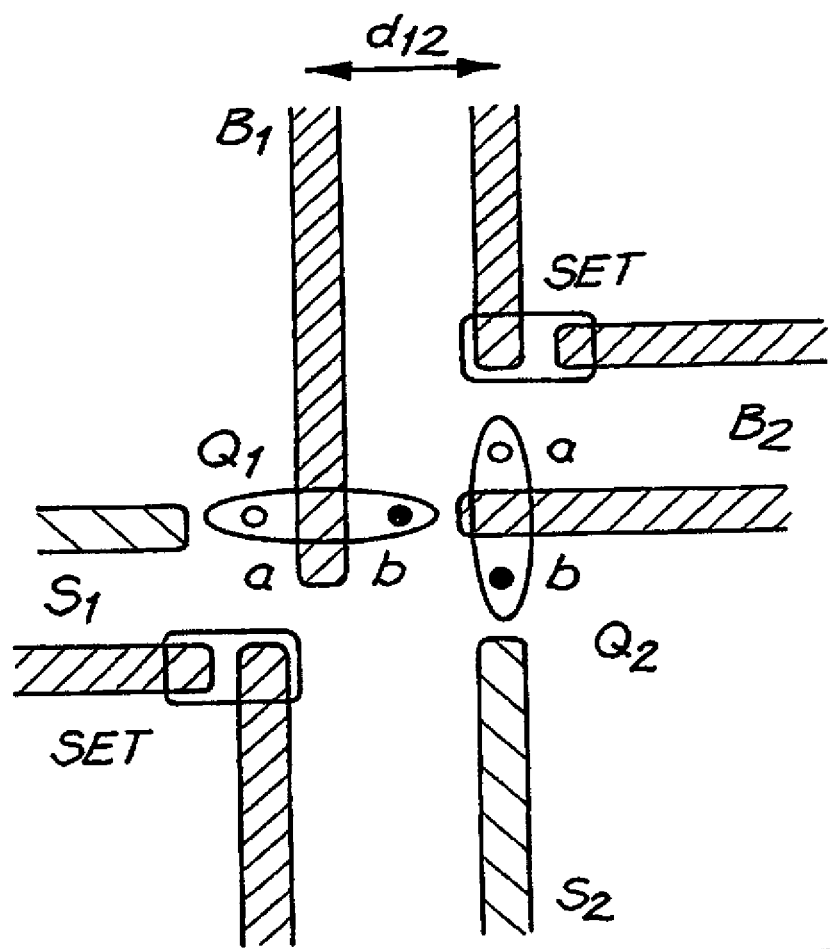
Figure 10B:
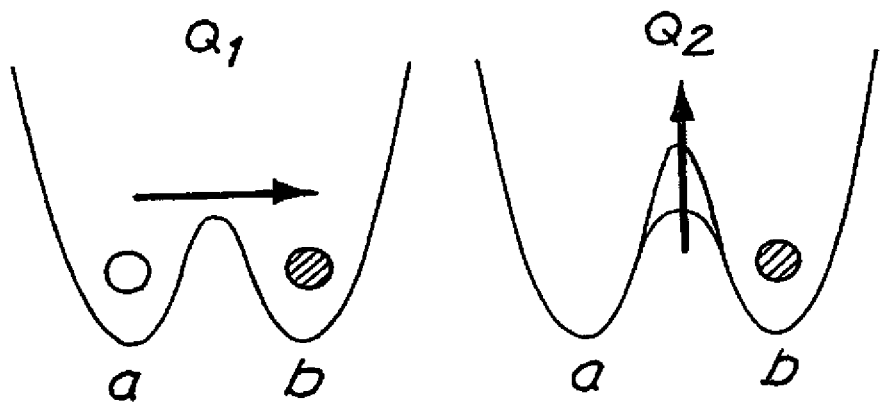
Figure 11A:
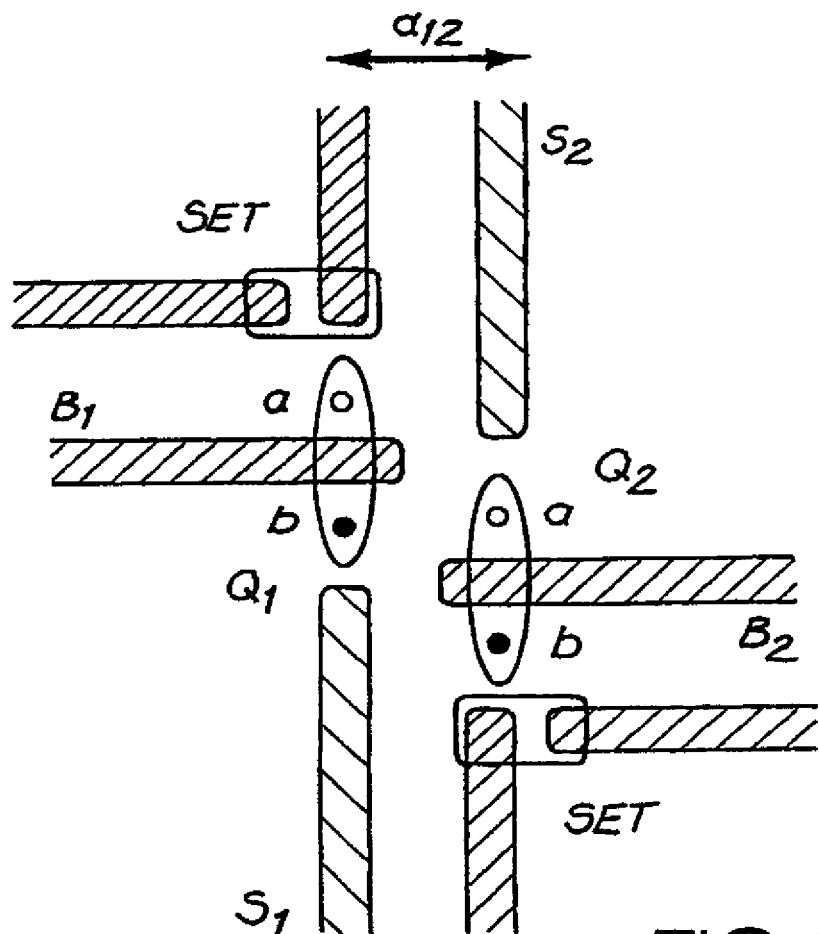
Figure 11B:
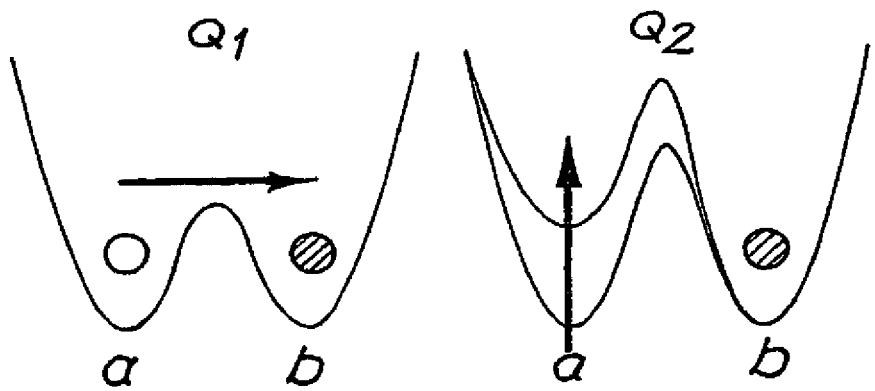
Figure 12A:
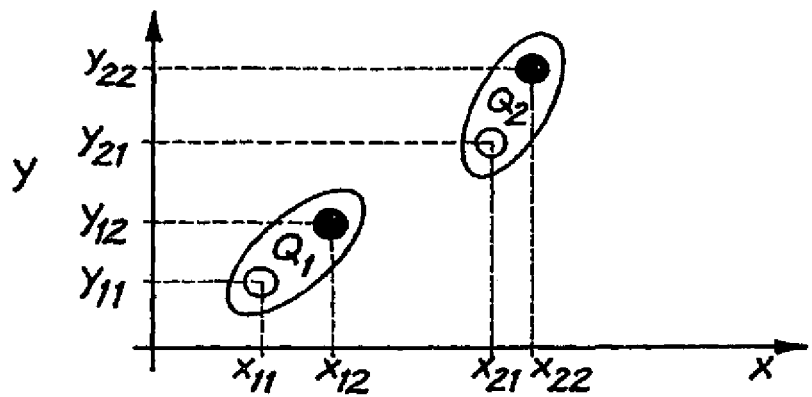
Figure 12B:
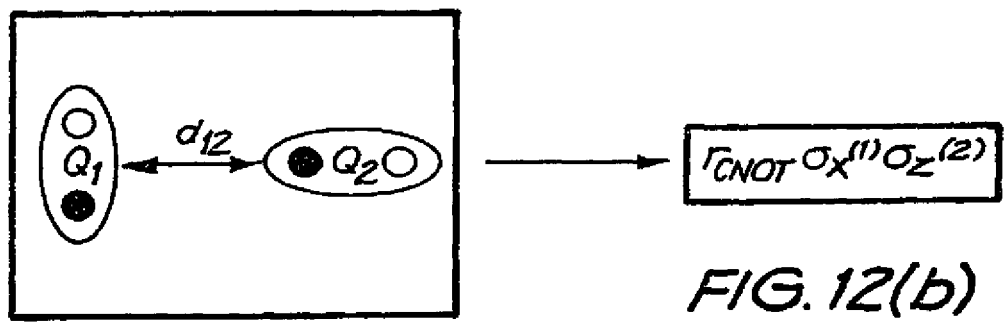
Figure 12C:
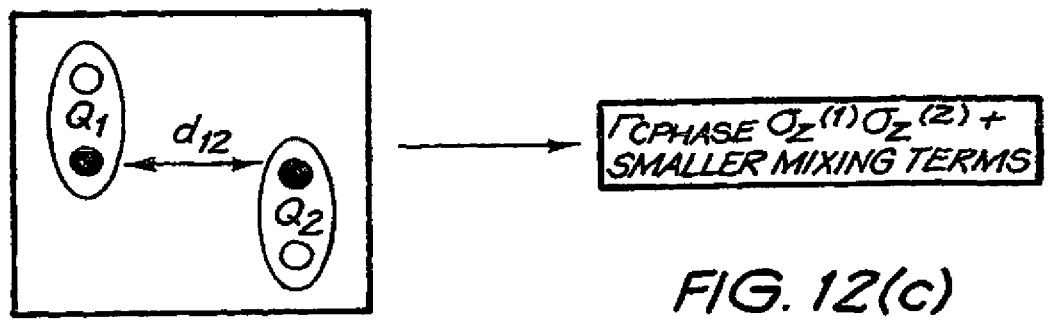
Figure 13:
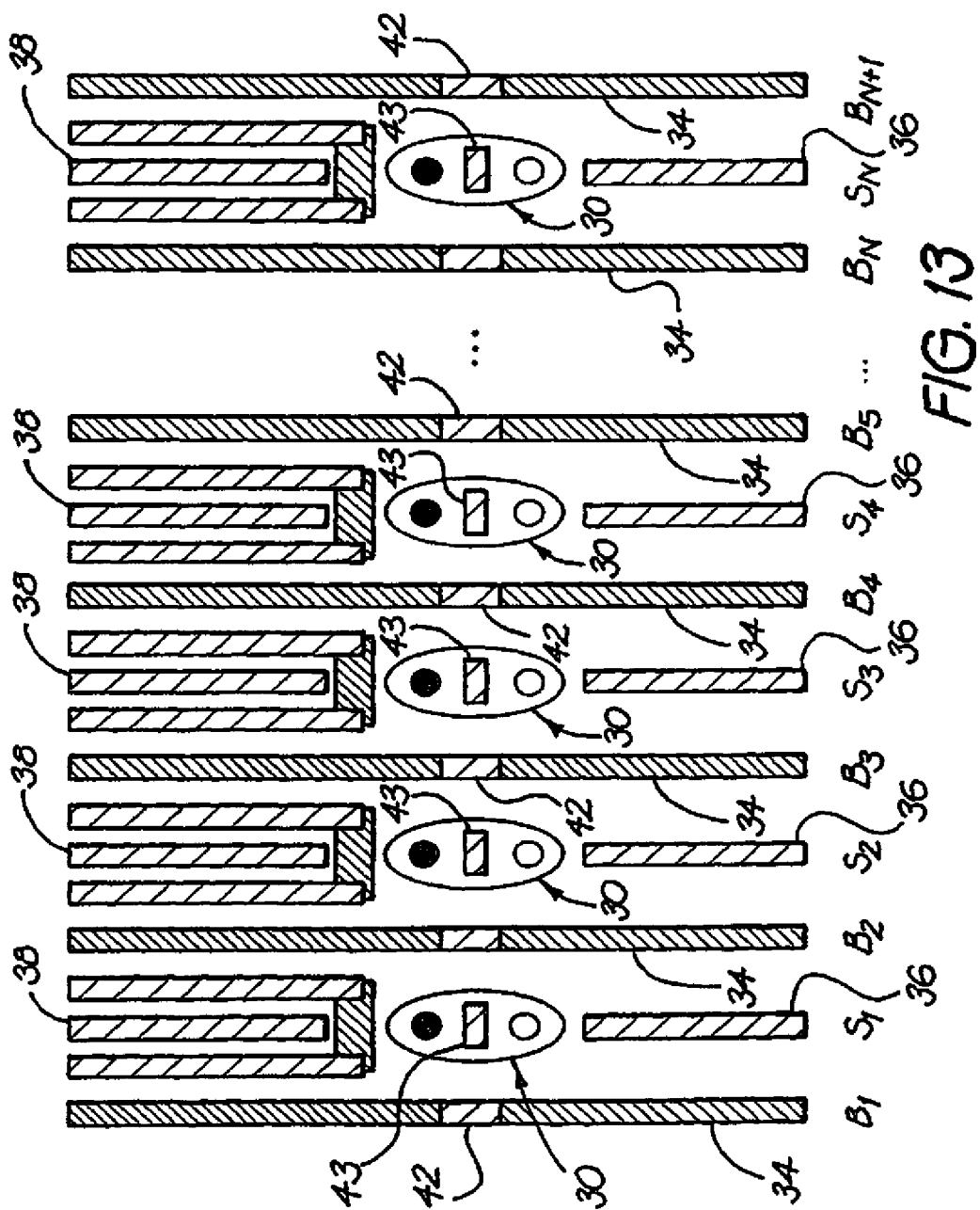
Figure 16:
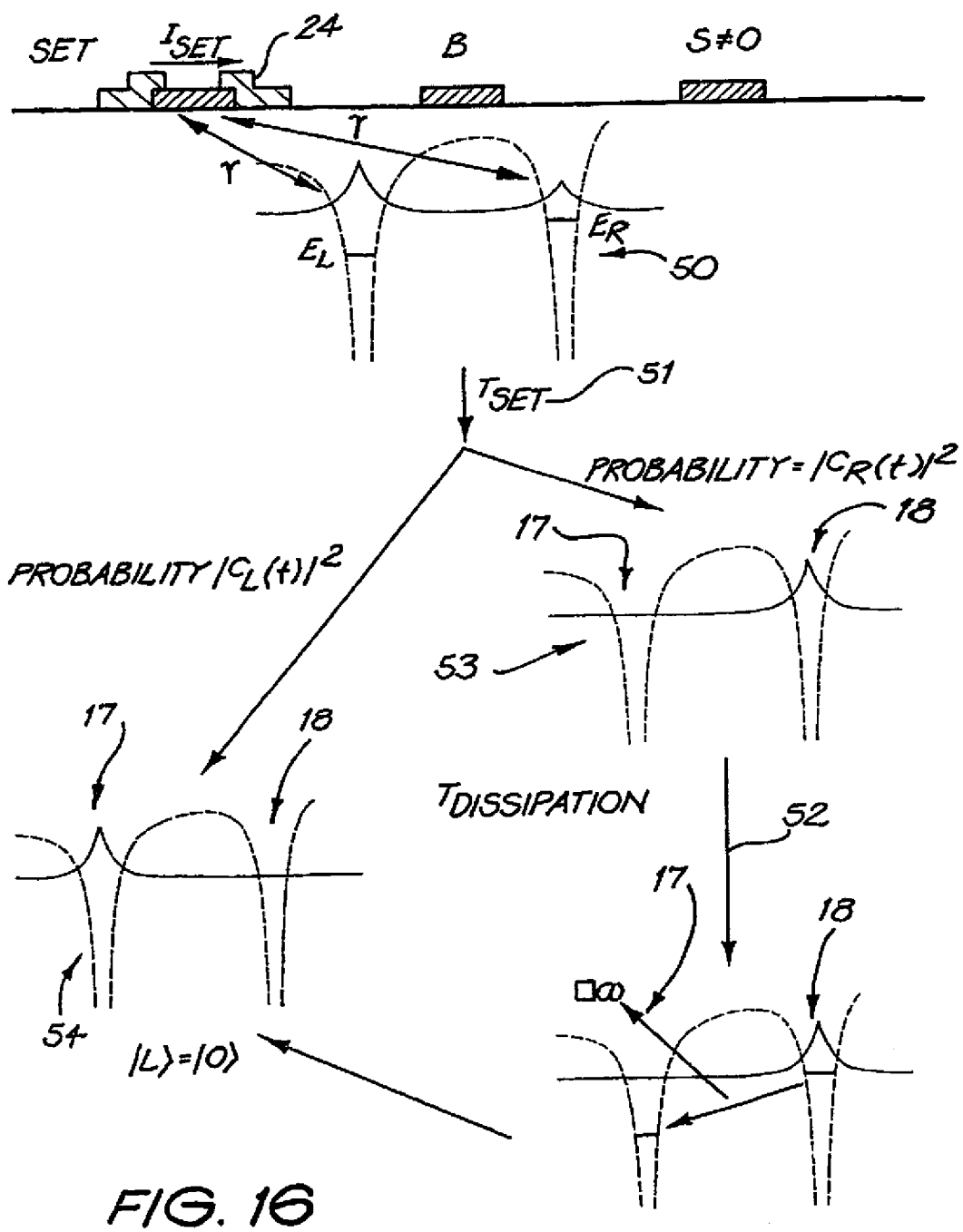
Figure 17A:
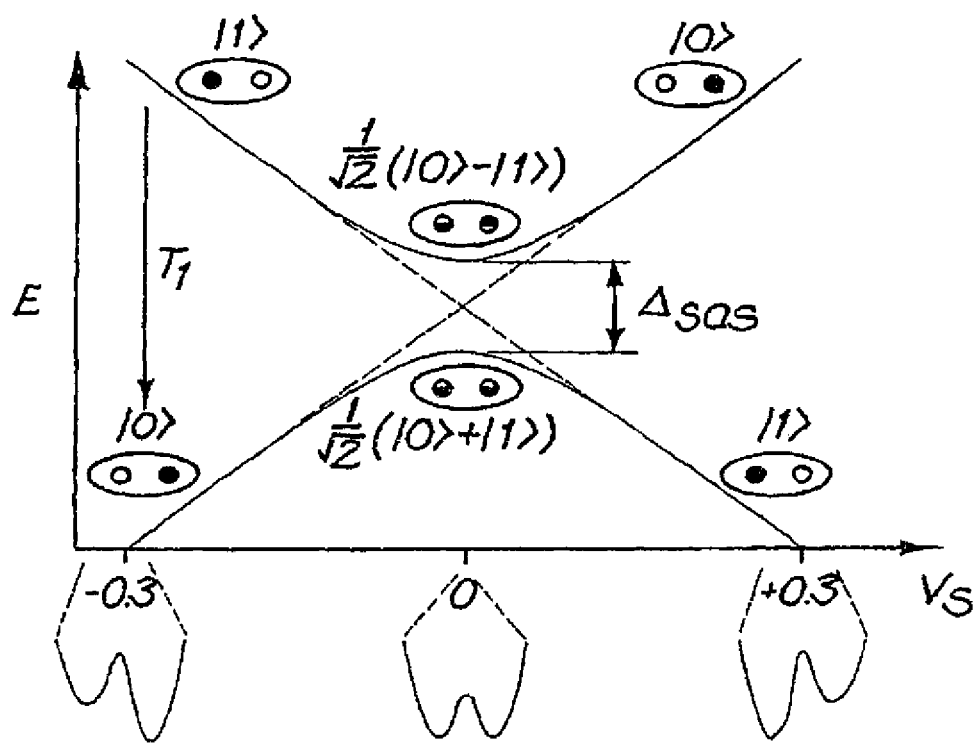
Figure 17B:
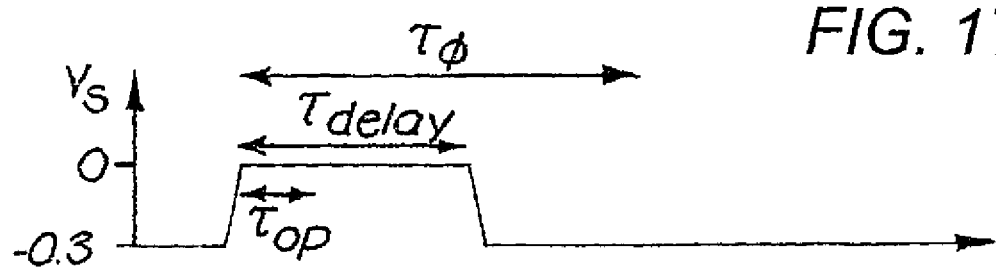
Figure 17B:
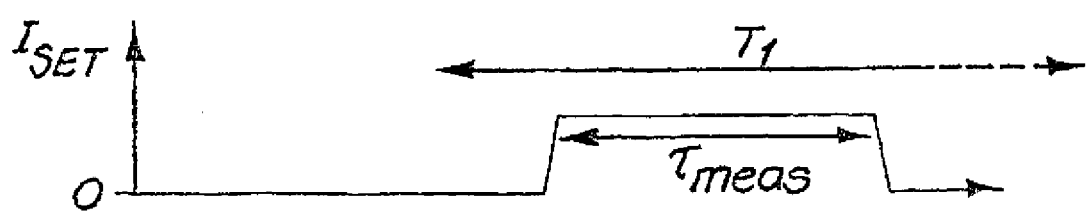
Figure 18:
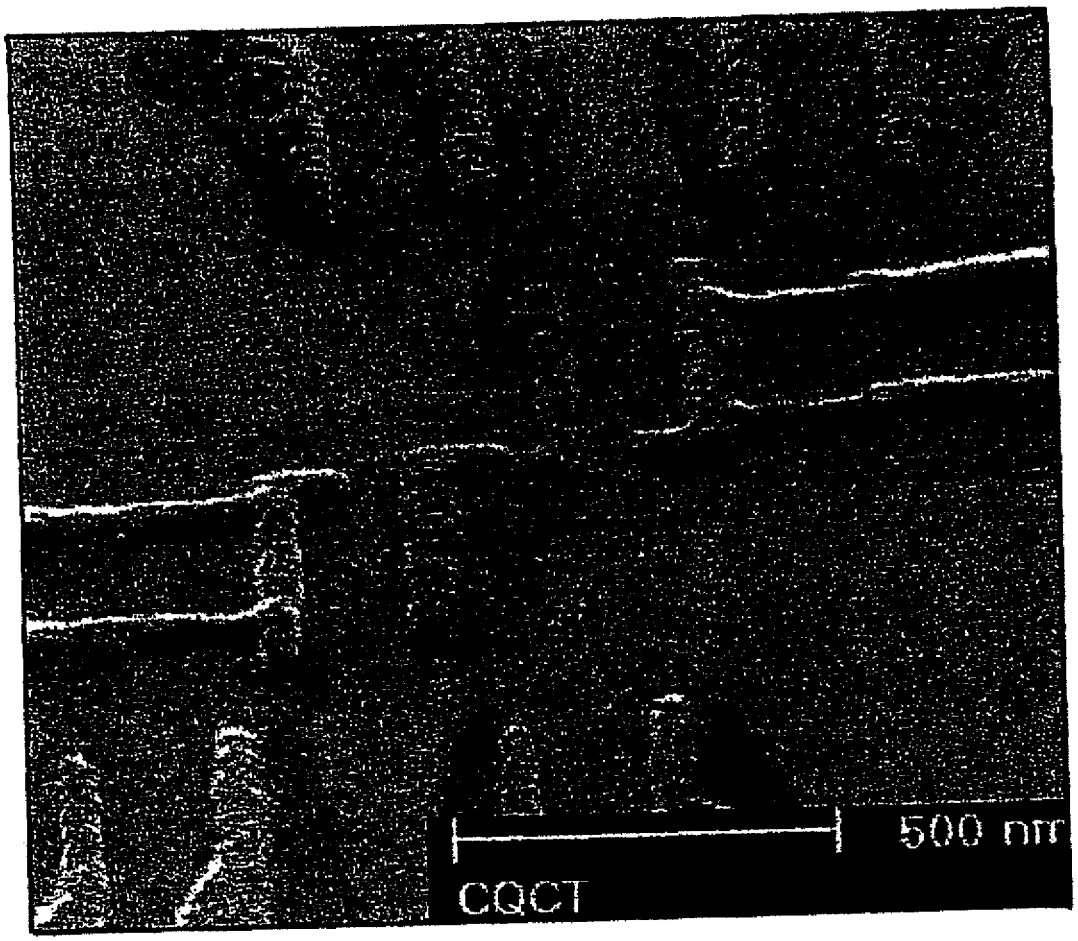
Figure 19:
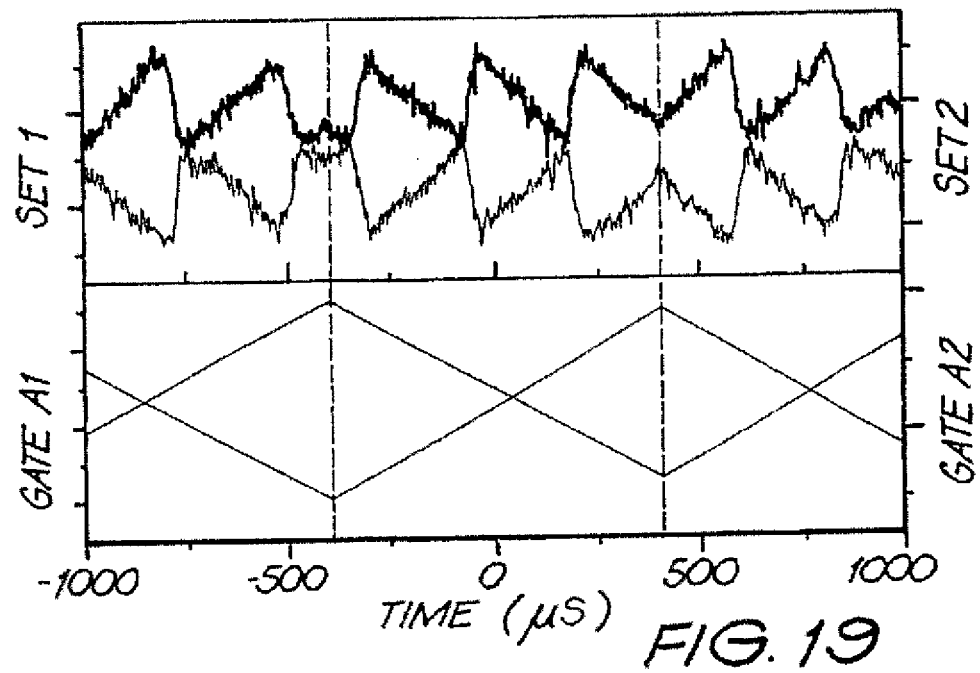
Figure 20:
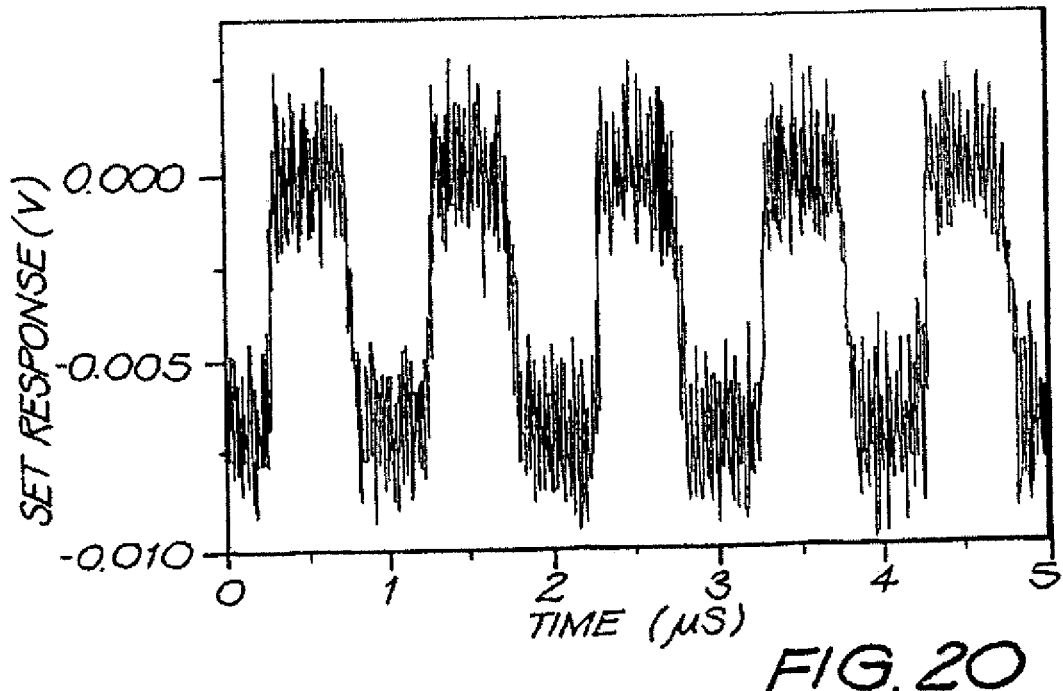
Figure 21A:
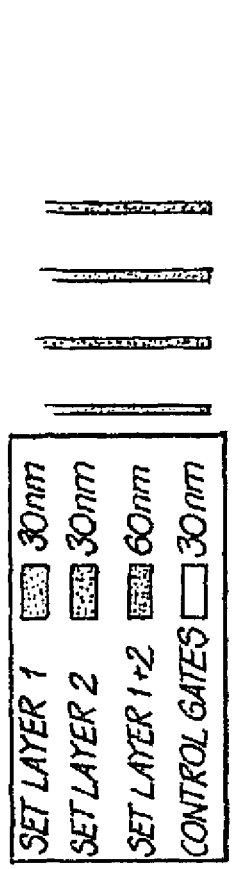
Figure 21B:
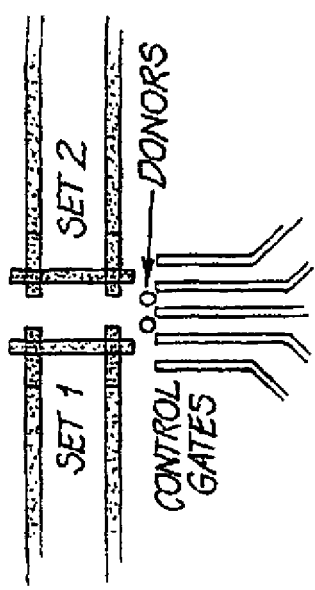
Figure 21B:
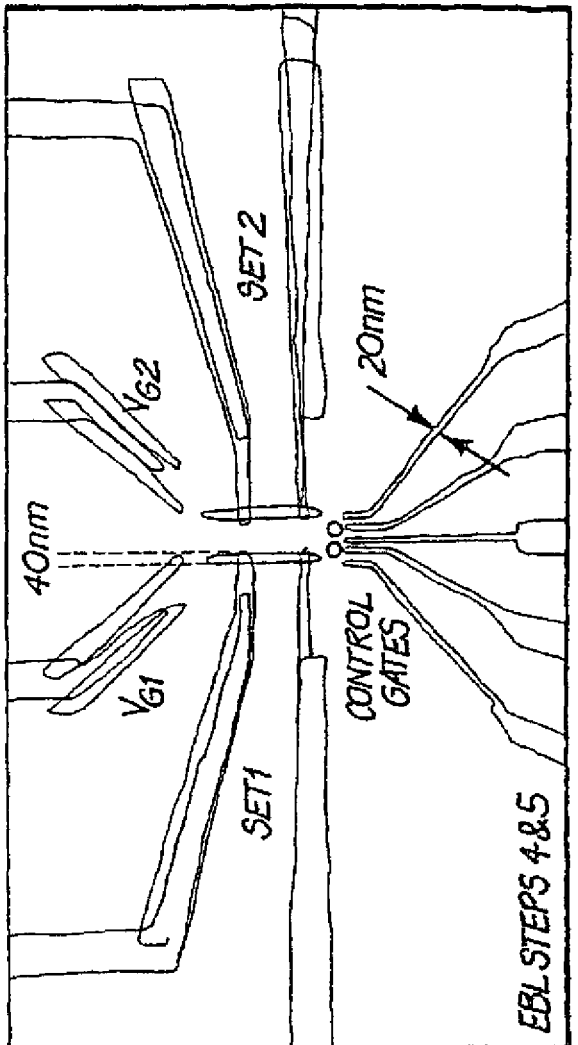
Figure 22A:
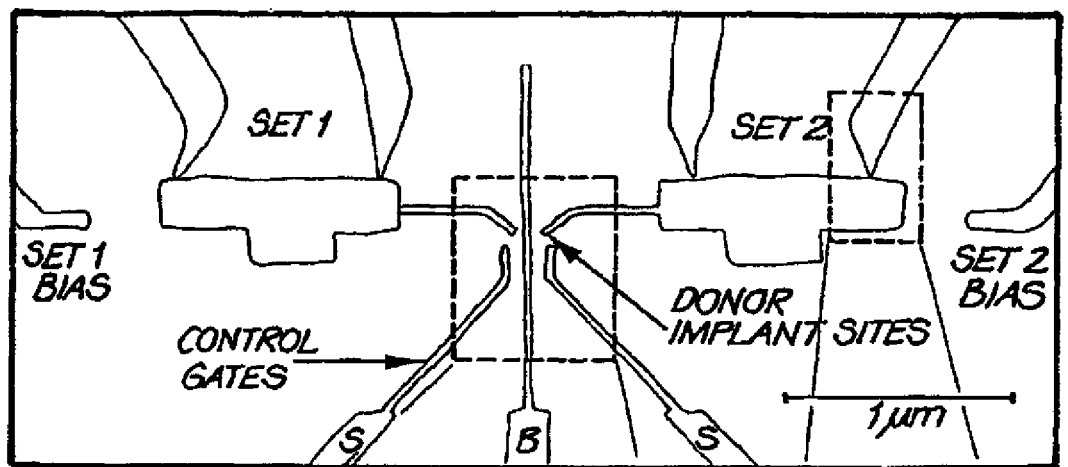
Figure 22B:
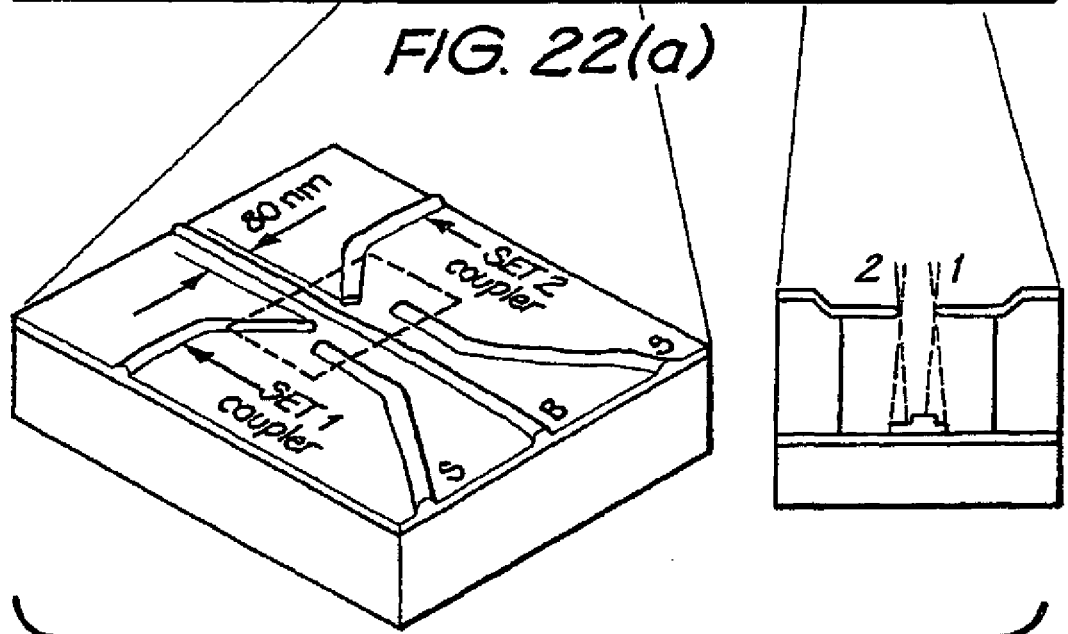
Figure 22C:
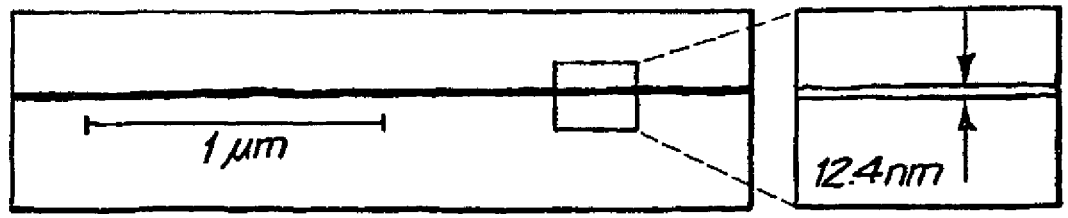

FIG. 22(a) is an SEM image of a device suitable for one qubit proof-of-principle experiments. This device has been fabricated using a 'top-down' ion implantation process. The device incorporates three surface gates (labeled S, B, S) for qubit control and also two surface coupling electrodes which capacitively couple the buried P donors to the SET island electrodes. FIG. 22(b) is an expanded view of the central region. FIG. 22(c) shows narrow Ti/Au gate metallisations of just 12 nm, fabricated using electron beam lithography.

BEST MODES OF THE INVENTION

The P—$P^+$ Charge Qubit

Referring first to FIGS. 1 and 2, a charge qubit 10 is based on electrons localized by two donor P atoms 11 and 12 buried in a silicon substrate 13. Each qubit comprises an "artificial molecule" P—$P^+$ system in which a single electron 14 remains. The other donor electron must previously be removed from the system by an ionization process, such as electric field induced ionization produced by suitable gate biaising. Gates placed above the buried P—$P^+$ system, on a non-conducting barrier layer 15 allow for external control.

The remaining electron 14 exists in a double-well potential 16, in one or other of the wells. In the potential diagrams the double-well potential 16 has a left-hand well 17 and a right hand well 18. Between the wells is a potential barrier 19, and there are potential barriers 20 and 21 outside the wells. A basic qubit and definition of logical states in terms of left 17 and right 18 localized states with respect to the double-well potential 16 is shown in FIG. 2(b) and FIG. 2(c), respectively. In order to facilitate discussion of coupled qubit systems we also introduce the occupation number definition such as 'L⟩=|0⟩=|L,0⟩ etc.

A barrier gate (B-gate) 22 placed between the two P atoms is used to exert control over the height of barrier 19. A potential off-set, or symmetry (S-gate) 23 is placed nearby. A SET 24 is provided for readout.

FIG. 3 illustrates the basic external control over the intra-qubit potential via the B and S gates. FIG. 3(a) shows the effect of a non-zero voltage on the B gate, note in particular that barrier 19 is raised. FIG. 3(b) shows the effect of a non-zero voltage on the S gate, note in particular the raised right-hand shoulder 21, the asymmetrical barrier 19 and the reduced left-hand shoulder 20.

The P—$P^+$ charge qubit is the lowest filling quantum dot possible, with the simplest quantum-substructure. For this reason we expect the P—$P^+$ system to suffer less from decoherence than the larger quantum dot qubits. On the other hand, a charge qubit can couple strongly to fluctuating local charge environments. This kind of coupling leads to fluctuations in the relative energies of the charge qubits and thus will be responsible for dephasing errors.

In the pseudo-spin P—P$^+$ proposal, the system should be cooled as far as is possible to minimize environmental coupling. The decoherence of the charge qubit system will be fast, however, the intrinsic "clock speed" of the charge qubit is much faster. The barrier gate will be required to tune the natural clock speed down to the level of fast pulse technology, of order GHz.

Since we are not dealing with nuclear spin states, isotropic impurities (e.g. Si$^{29}$) will not affect the charge qubit. Therefore, one can use standard wafers in the fabrication process.

Single Qubit Dynamics
Ungated Qubit

In this section we discuss control over single qubit dynamics via external gate biases. Essentially we need to be able to initialize the qubit and perform arbitrary rotations. The first problem is the fast natural tunneling rate of the system for typical donor separations. This is also a problem for two-qubit gates.

To get first order estimates of the tunneling rates and gate control over the dynamics for the single qubit system we consider the P—P$^+$ system using the usual effective Bohr radius of $a=a_B{}^*$ appropriate to P-donor electrons in silicon. In the case of zero gate potentials the Hamiltonian in this effective-mass approach is taken to be:

$$H_0 = \frac{-\hbar^2}{2m}\vec{\nabla}^2 - \frac{e^2}{|\vec{r}-R/2|} - \frac{e^2}{|\vec{r}+R/2|},$$

where the origin is placed mid-way between the donor nuclei along the x-axis. The eigenstates of this Hamiltonian are known exactly, so we have constructed the basis of states $\{\phi_i(\vec{r};R)\}$ with i=1 . . . N (the dependence on separation distance is manifest). In FIGS. 4(a) and (b) shows the first two lowest energy states, $\phi_S(\vec{r};R)$ and $\phi_A(\vec{r};R)$, corresponding to symmetric and anti-symmetric configurations respectively. In the absence of external gate potentials the energy difference between these states $\Delta E(R)=E_S(R)-E_A(R)$ determines the tunneling rate. The dependence on the tunneling rate with donor separation for zero gate bias is shown in FIG. 5—normally this rate is very fast, but with appropriate gate bias this system can be controlled.

In terms of these two lowest zero-gate eigenstates the computational space is given by:)

$$|0\rangle \leftrightarrow \psi_L(\vec{r}),$$

$$|1\rangle \leftrightarrow \psi_R(\vec{r}).$$

At zero-gating, the logic states are given in terms of the eigenstates of the system as:

$$|0\rangle \leftrightarrow \psi_L(\vec{r}) = \frac{1}{\sqrt{2}}(\varphi_S(\vec{r}) + \varphi_A(\vec{r})),$$

$$|1\rangle \leftrightarrow \psi_R(\vec{r}) = \frac{1}{\sqrt{2}}(\varphi_S(\vec{r}) - \varphi_A(\vec{r})).$$

We note here that the logic states can also be defined in terms of the de-localised states $\phi_S(\vec{r};R)$ and $\phi_A(\vec{r};R)$.

Gated Qubit

Now we consider the placement of gates according to the single-gate configuration of FIG. 1(c): a B-gate 22 controlling the barrier height, and as S-gate 23 which allows us to raise and lower the potential asymmetrically. The spatial dependence of the gate potentials, $V_S(\vec{r})$ and $V_B(\vec{r})$, in the silicon substrate can be conveniently calculated using the TCAD Poisson solver (gate geometry, widths etc). In effect we add to the Hamiltonian terms of the form:

$$H_0 \to H = \frac{-\vec{\nabla}^2}{2m} - \frac{e^2}{|\vec{r}-R/2|} - \frac{e^2}{|\vec{r}+R/2|} + S(t)V_S(\vec{r}) + B(t)V_B(\vec{r}),$$

where the time-dependent pulse profiles S(t) and B(t) describe the time evolution (scaling) of the gate biases.

The structure of the lowest two states in B—S space is complicated. Around the zero-gate point, B=S=0, the situation is fairly clear, and is shown in FIG. 6 as the conditions for minimum energy gap between the first two states. The ground state is this symmetric state and the excited state is the anti-symmetric state. As we change the S-gate voltage adiabatically the states evolve to localized states as shown to the right and left.

Loss in fidelity due to "state-leakage" will occur if the logic states (localized states) are not exact eigenstates of the Hamiltonian. This effect should be minimized by positioning the P-donors far enough apart, and applying the appropriate S-gate voltage. At $S_0=0$ the first two states are equal combinations of the localized states. At $|S_0|=0.1$ volts or higher the qubits are quite accurately defined by the localized states.

In order to be able to describe the dynamics of the gated P—P$^+$ qubit we need the effective Hamiltonian in the computation sub-space. First, we consider the eigenstates of the system when the gate strengths B and S are non zero. From the exact treatment of the unperturbed system we construct the Hamiltonian matrix with respect to N basis states to obtain the matrix:

$$H_{\alpha\beta}(R)|_{i,j}=\langle\phi_i(\vec{r};R)|H|\phi_j(\vec{r};R)\rangle.$$

Diagonalization of this matrix for non-zero gate strengths gives a new energy gap between the lowest states $\Delta E(R,S,B)$. This is of course a non-trivial functional dependence given that the potentials are described by TCAD simulation in the first place. Nevertheless, we have solved the system for R=9.0 a for various gate potentials.

Effective Hamiltonians and Qubit Rotations

We need to find the regions in (B,S) space where single qubit operations in the lowest two states are feasible, that is the tunneling rate can be controlled and slowed down. To this end we compute the effective Hamiltonian for deviations $(\Delta B(t), \Delta S(t))$ about a given point $(B_0,S_0)$. In general this will be of the form:

$$H_Q = h_0(t) + h_x(t)\sigma_x + h_z(t)\sigma_z,$$

where $$h_0(t)=\epsilon_0(S_0,B_0)+\epsilon_S(S_0,B_0)\Delta S(t)+\epsilon_B(S_0,B_0)\Delta B(t)$$

$$h_x(t)=X_0(S_0,B_0)+X_S(S_0,B_0)\Delta S(t)+X_B(S_0,B_0)\Delta B(t).$$

$$h_z(t)=Z_0(S_0,B_0)+Z_S(S_0,B_0)\Delta S(t)+Z_B(S_0,B_0)\Delta B(t)$$

The all-pervading dependence on R has been suppressed. In Table 1 we list the values of the effective Hamiltonian coefficients calculated in the hydrogenic approximation.

This form for $H_Q$ makes it convenient to study the dynamics of the qubit using NMR type pulses, where the rise time of the pulses are very short in comparison to their duration.

Clearly, we can see how the function $h_x(t)$ controls qubit rotations and its composition in terms of the S and B potentials. No matter how we define our computational basis, a $\pi/2$ rotation $\exp(-i\pi\sigma_x/2)$ is implemented by balancing the coefficient of $\sigma_z$ to zero and then allowing the system to evolve for a time $\tau_{op}$ with the $\sigma_x$ coefficient non-zero. Changing the basis from localized states to delocalized states induces the transformation $\sigma_x \leftrightarrow \sigma_z$ so care must be taken on this point.

The main question is the limitation on the operation time—the natural frequency of the un-gated system (FIG. 5) is very fast for donor separations up to R=10 a so we need to find gating operations to slow the tunnelling rate down. We can achieve the balance conditions by suitable control over $\Delta B(t)$ and $\Delta S(t)$ pulses: $h_z(\Delta B^*, \Delta S^*) \equiv 0$ and $h_x(\Delta B^*, \Delta S^*) \equiv 0$. This gives:

$$\Delta S^* = \frac{X_0 Z_B - X_B Z_0}{X_B Z_S - X_S Z_B}$$

and $$\Delta B^* = \frac{X_S Z_0 - X_0 Z_S}{X_B Z_S - X_S Z_B}.$$

The values of $\Delta B^*$ and $\Delta S^*$ for three gate configurations $(B_0, S_0)$ are given in Table 2. We examine first how a $\pi/2$ rotation $\exp(-i\pi\sigma_x/2)$ may be applied by B-gate control. This is carried out by maintaining $h_z=0$ for $\Delta B(t) \neq \Delta B^*$ using:

$$\Delta S = \frac{-(Z_0 - Z_B \Delta B)}{Z_S},$$

which gives:

$$h_x(\Delta B) = \frac{1}{Z_S}[(X_0 Z_S - Z_0 X_S) + (X_B Z_S + Z_B X_S)\Delta B].$$

The timing of the $\Delta B$ pulse can now be read off from:

$$\tau_{op} = \frac{\hbar\pi}{2}|h_x(\Delta B)|^{-1}$$

$$= \frac{\hbar\pi}{2} Z_S[(X_0 Z_S - Z_0 X_S) + (X_B Z_S + Z_B X_S)\Delta B]^{-1},$$

(recall that $h_x$ is in units of 45 meV). In Table 3 the voltage pulse magnitudes required for the different gate configurations $(B_0, S_0)$ and donor separations (R=9 a) are given for pulse times: $\tau_{op}=1$ ns and $\tau_{op}=0.1$ ns. In each of the cases the voltages required are feasible, demonstrating that the single qubit operation time can be controlled.

In FIG. 8 we show the situation around the configuration $B_0=-0.46884$, $S_0=0$.

The non-zero B-gate case deserves some comment. First, in an ideally symmetric qubit/gate geometry, one does not expect a minimum to develop as the barrier height is increased when S=0. In fact as the barrier is raised, by making B(t) more negative, the response of the first two states will be different—the dependence of the energies of the first two states on B-gate voltage is to first order linear, but with different slopes. Hence, at some point the energy levels will cross. Any asymmetry in the system will effectively introduce a coupling between the states creating an avoided crossing. The calculations involve rounding errors, and so the cross-over becomes an avoided crossing, and we obtain the behaviour as seen in FIG. 8. A straightforward LCAO calculation using a symmetric barrier potential confirms this.

Indeed, in an actual device one does not expect to obtain the perfectly symmetric case, and a certain amount of device characterization will need to be carried out to determine the adjustment required on the gate potentials to facilitate operation, as per the estimates given above. The estimates given correspond to specific modelling of the surface gates using the TCAD simulation package. Modifications to the details of gate modelling will change the quantitative details of the numbers quoted in the Tables and Figures.

TABLE 1

Single qubit effective Hamiltonian coefficients for various gate configurations

| | R = 9.0 a |
|---|---|
| $B_0 = 0$ | |
| $S_0 = 0$ | |
| $\epsilon_0$ | −1.2228 |
| $\epsilon_S$ | −1.5414 |
| $\epsilon_B$ | −1.6282 |
| $X_0$ | 0 |
| $X_S$ | 0.4778 |
| $X_B$ | 0 |
| $Z_0$ | −0.0016 |
| $Z_S$ | −0.0044 |
| $Z_B$ | −0.0016 |
| $B_0 = -0.4688$ | |
| $S_0 = 0$ | |
| $\epsilon_0$ | −0.9671 |
| $\epsilon_S$ | −1.4906 |
| $\epsilon_B$ | −1.5947 |
| $X_0$ | 0 |
| $X_S$ | −0.2169 |
| $X_B$ | 0.0059 |
| $Z_0$ | 0 |
| $Z_S$ | 0.4193 |
| $Z_B$ | 0.0034 |
| $B_0 = 0$ | |
| $S_0 = -0.3$ | |
| $\epsilon_0$ | −0.7714 |
| $\epsilon_S$ | −1.4954 |
| $\epsilon_B$ | −1.6137 |
| $X_0$ | 0 |
| $X_S$ | 0.0069 |
| $X_B$ | 0.0039 |
| $Z_0$ | −0.1417 |
| $Z_S$ | 0.4663 |
| $Z_B$ | −0.0032 |

TABLE 2

Gate configurations and balance conditions for single qubit rotations.

| Gate configuration | R = 9.0a |
|---|---|
| $B_0 = 0$, $S_0 = 0$ | $\Delta B^* = -1.00585$ |
| $\varphi_1 = \frac{1}{\sqrt{2}}(\varphi_L + \varphi_R)$ | $\Delta S^* = -2.1 \times 10^{-6}$ |
| $\varphi_2 = \frac{1}{\sqrt{2}}(\varphi_L - \varphi_R)$ | |
| $B_0 = -0.46884$, $S_0 = 0$ | $\Delta B^* = +0.003683$ |
| $\varphi_1 = \varphi_L$ | $\Delta S^* = +0.000101$ |
| $\varphi_2 = \varphi_R$ | |

TABLE 2-continued

Gate configurations and balance conditions for single qubit rotations.

| Gate configuration | R = 9.0a |
|---|---|
| $B_0 = 0$, $S_0 = -0.3$ $\varphi_1 = \varphi_L$ $\varphi_2 = \varphi_R$ | $\Delta B^* = -0.533922$ $\Delta S^* = +0.300349$ |

TABLE 3

Single qubit rotations: pulse timing

| Gate configuration | R = 9.0a |
|---|---|
| $B_0 = 0$, $S_0 = 0$ $\varphi_1 = \frac{1}{\sqrt{2}}(\varphi_L + \varphi_R)$ $\varphi_2 = \frac{1}{\sqrt{2}}(\varphi_L - \varphi_R)$ | $\tau_{op} = 0.1$ ns $\Delta B = -1.0060$ $\Delta S = +0.0005$ $\tau_{op} = 1$ ns $\Delta B = -1.00587$ $\Delta S = -4.59 \times 10^{-5}$ |
| $B_0 = -0.46884$, $S_0 = 0$ $\varphi_1 = \varphi_L$ $\varphi_2 = \varphi_R$ | $\tau_{op} = 0.1$ ns $\Delta B = +0.0336$ $\Delta S = -0.0001$ $\tau_{op} = 1$ ns $\Delta B = +0.00667$ $\Delta S = +7.66 \times 10^{-5}$ |
| $B_0 = 0$, $S_0 = -0.3$ $\varphi_1 = \varphi_L$ $\varphi_2 = \varphi_R$ | $\tau_{op} = 0.1$ ns $\Delta B = -0.4752$ $\Delta S = +0.3008$ $\tau_{op} = 1$ ns $\Delta B = -0.52805$ $\Delta S = +0.30039$ |

Two Qubit Gates

The coupling of qubits can proceed in a number of ways. Three basic coupling schemes, the first involving a direct external-gate controlled tunneling interaction—the "SWAP" configuration—and the other two an indirect qubit-controlled coupling based on the Coulomb interaction between neighbouring qubits—the "CNOT" and "CPHASE" configurations—are shown in FIGS. 9, 10 and 11 respectively.

SWAP Gate Operation

Referring to FIG. 9, two pairs of charge qubits 30, 31 in the SWAP configuration are located parallel to each other in a substrate. Each individual qubit 30, 31 is constructed as set out in the description of the P—P$^+$ charge qubit above, each having a single electron 32, 33 remaining in the P—P$^+$ system, a B-gate 34, 35, a S-gate 36, 37 and a SET 38, 39. The diagram shows the S-gates 36, 37 and the SETs 38, 39 in diagonally opposite ends, but they could equally both be on the same side.

Inter-qubit gates are also provided to control electrons tunnelling between the two qubits. Two further B-gates 40, 41 are provided between and parallel to the two qubits 30, 31. Together, these B-gates 40, 41 extend the length of the qubits 30, 31 and their associated gates, except for a via-gate 42 that separates them and lies directly between the two qubits 30, 31. The via-gate 42 prevents diagonal transitions between the two qubits 30, 31.

These gates are relatively straightforward to understand at the level of the single qubit dynamics described above (modulo the double |R>occupancy step). Essentially the swap occurs by controlling the inter-qubit barrier gates $B_3$ (40) and $B_4$ (41) while the intra-qubit dynamics are static by balance of $B_1$ (34) and $B_2$ (35). Assuming we are working in a left-right localization basis (w.r.t. the x-axis) the qubit computational states are labelled (interchangeably):

$$|0\rangle = |L\rangle = |L,0\rangle$$

$$|1\rangle = |R\rangle = |0,R\rangle$$

The notation $|L,0\rangle$ and $|0,R\rangle$ pave the way for a doubly occupied qubit $|L,R\rangle$, which will occur as an intermediate state in the SWAP process. Starting with an arbitrary state of the two qubit system, $|\Psi_i\rangle = |\psi\rangle_1 \otimes |\psi\rangle_2$, we wish to effect the SWAP operation on its components:

$$|0\rangle|0\rangle \rightarrow |0\rangle|0\rangle$$

$$|0\rangle|1\rangle \rightarrow |1\rangle|0\rangle$$

$$|1\rangle|0\rangle \rightarrow |0\rangle|1\rangle$$

$$|1\rangle|1\rangle \rightarrow |1\rangle|1\rangle$$

By appropriate gate control, the evolution of the initial the two qubit state, $|\Psi_i\rangle = |\psi\rangle_1 \rangle |\psi \otimes_2$, occurs in the following sequence (schematic):

$$|\Psi_i\rangle = (\alpha_1|L,0\rangle_1 + \beta_1|0,R\rangle_1) \otimes (\alpha_2|L,0\rangle_2 + \beta_2|0,R\rangle_2)$$

$$\rightarrow \alpha_1\alpha_2|L,0\rangle_1|L,0\rangle_2 + \alpha_1\beta_2|L,0\rangle_1|0,R\rangle_2 + \beta_1\alpha_2|0,R\rangle_1|L,0\rangle_2 + \beta_1\beta_2|0,R\rangle_1|0,R\rangle_2$$

$$B_3\downarrow \quad B_3\downarrow \quad B_3\downarrow \quad B_3\downarrow$$

$$\rightarrow \alpha_1\alpha_2|L,0\rangle_1|L,0\rangle_2 + \alpha_1\beta_2|L,R\rangle_1|0,0\rangle_2 + \beta_1\alpha_2|0,0\rangle_1|L,R\rangle_2 + \beta_1\beta_2|0,R\rangle_1|0,R\rangle_2$$

$$B_4\downarrow \quad B_4\downarrow \quad B_4\downarrow \quad B_4\downarrow$$

$$\rightarrow \alpha_1\alpha_2|L,0\rangle_1|L,0\rangle_2 + \alpha_1\beta_2|0,R\rangle_1|L,0\rangle_2 + \beta_1\alpha_2|L,0\rangle_1|0,R\rangle_2 + \beta_1\beta_2|0,R\rangle_1|0,R\rangle_2$$

$$|\Psi_f\rangle = \alpha_1\alpha_2|L,0\rangle_1|L,0\rangle_2 + \alpha_1\beta_2|0,R\rangle_1|L,0\rangle_2 + \beta_1\alpha_2|L,0\rangle_1|0,R\rangle_2 + \beta_1\beta_2|0,R\rangle_1|0,R\rangle_2$$

By symmetry one expects transitions such as $$|0,R\rangle_1|0,R\rangle_2 \xrightarrow{B_3} |0,0\rangle_1|0,2R\rangle_2$$

not to occur: although the actual electrons in this state will be exchanged when $B_3$ is switched on, the product state remains effectively the same. If there is some residual asymmetry which generates this transition, a background magnetic field could be used to polarize the electrons and stop this transition through Pauli blocking.

Coulomb-Coupled Gate Operations

FIG. 10 represents a configuration which is based on an indirect qubit-controlled coupling. In this CNOT configuration the two qubits $Q_1$, $Q_2$ are oriented perpendicular in a substrate. Again, each individual qubit has an associated electron, B-gate$B_1$, $B_2$, S-gate $S_1$, $S_2$ and SET that perform the same functions as previously described. The SETs are shown in diagonally opposite corners of the configuration but this is not a requirement. The B-gate $B_1$ of the first qubit $Q_1$, and the S-gate $S_2$ of the second qubit $Q_2$ occupy the remaining diagonally opposite corners, with the S-gate $S_1$ of the first qubit $Q_1$ and the B-gate $B_2$ of the second qubit $Q_2$ now in parallel. Note that the SET and S-gate $S_2$ of the right qubit $Q_2$ could be swapped without loss of generality.

FIG. 11 represents a further indirect qubit-controlled coupling configuration. In this CPHASE configuration the two qubits $Q_1$, $Q_2$ and their respective gates are arranged as described in FIG. 9, but there is no B-gate between the two qubits and the two qubits are offset (or staggered) vertically with respect to each other.

For both the CNOT gate (FIG. 10) and the CPHASE gate (FIG. 11) an additional barrier gate could also be located between the two qubits $Q_1$ and $Q_2$, running the full length of the device. In the case of the CNOT, the central barrier gate would be parallel with and between gates $B_1$ and $S_2$. In the case of the CPHASE, the central barrier gate would be parallel with and between gates $S_1$ and $S_2$. The purpose of this central barrier gate would be to inhibit direct electron tunneling between the two qubits $Q_1$ and $Q_2$, in a manner analogous with the barrier gates 40, 41 and 42 in the SWAP gate (FIG. 9).

The CNOT and CPHASE gates, as defined above, rely on the Coulomb interaction between electrons in the qubits. Understanding the gate operation quantitatively requires a lengthy computation of the four-donor, two-electron system. However, we can make good estimates based on some simple constructions.

First we take the qubit positions as defined in FIG. 12 (x-y plane only for clarity) below: in the ith qubit, the jth donor atom is located at $\vec{R}_{ij}=(x_{ij},y_{ij},z_{ij})$. The effective molecular Hamiltonian for the two electron system is then:

$$H = H_0^{(1)} + H_0^{(2)} + H_{int},$$

where $$H_0^{(1)} = \frac{-\hbar^2}{2m}\vec{\nabla}_1^2 - \frac{e^2}{|\vec{r}_1 - \vec{R}_{11}|} - \frac{e^2}{|\vec{r}_1 - \vec{R}_{12}|},$$

$$H_0^{(2)} = \frac{-\hbar^2}{2m}\vec{\nabla}_2^2 - \frac{e^2}{|\vec{r}_2 - \vec{R}_{21}|} - \frac{e^2}{|\vec{r}_2 - \vec{R}_{22}|},$$

$$H_{int} = \frac{e^2}{|\vec{r}_1 - \vec{r}_2|} - \frac{e^2}{|\vec{r}_1 - \vec{R}_{21}|} - \frac{e^2}{|\vec{r}_1 - \vec{R}_{22}|} - \frac{e^2}{|\vec{r}_2 - \vec{R}_{11}|} - \frac{e^2}{|\vec{r}_2 - \vec{R}_{12}|}.$$

In order to obtain gate operation characteristics, at least to the level of the effective hydrogenic approximation used in the single-gate case, we would need to diagonalize the Hamiltonian as given, with respect to a complete two-electron basis. An outline of these calculations is given below, however, we note here that such calculations, while a useful guide, are probably not going to give very much quantitative insight into the actual charge qubit coupling taking place in the solid-state environment. For that one needs the full Bloch-wave treatment, which is beyond the scope of this proposal.

The simple LCAO approach is to define a basis of states in which each electron is localized about one of the qubits (and is therefore distinguishable). Symmetric and anti-symmetric single electron qubit wavefunctions can be defined as:

$$\psi_{\pm}^{(i)}(\vec{r}_i) = \frac{1}{\sqrt{2(1 \pm \Delta^{(i)})}}[\varphi_{1S}(\vec{r}_i - \vec{R}_{i1}) \pm \varphi_{1S}(\vec{r}_i - \vec{R}_{i2})],$$

where the overlap integral, $\Delta^{(i)}$ is given by (1S orbitals real):

$$\Delta^{(i)} = \int d^3\vec{r}\, \varphi_{1S}(\vec{r}_i - \vec{R}_{i1})\varphi_{1S}(\vec{r}_i - \vec{R}_{i2}).$$

The basis for the two-qubit system $\{\Psi_\alpha : \alpha = 1 \ldots 4\}$ is then constructed from these single electron qubit states:

$$\Psi_\alpha(\vec{r}_1, \vec{r}_2) = \psi_{\pm}^{(1)}(\vec{r}_1) \otimes \psi_{\pm}^{(2)}(\vec{r}_2).$$

The two-electron molecular Hamiltonian, in the presence of B and S is then diagonalised with respect to this basis. Details of the gate operation, pulse timing and so forth can be computed in ever increasing levels of approximation.

In lieu of this lengthy exercise, we give an estimate of the coupling expected for various inter-qubit separations from a semi-classical calculation. In the localized basis $\{|L\rangle, |R\rangle\}$ a potential affecting the barrier height as a B-gate corresponds to $\sigma_x$ pseudo-spin operator, while S-gate type effects correspond to $\sigma_z$. Hence the effective interaction between qubits in the CNOT configuration of FIG. 12(b), and the CPHASE configuration of FIG. 12(c) will be dominated by $\Gamma_{CNOT}\sigma_x^{(1)}\sigma_x^{(2)}$ and $\Gamma_{CPHASE}\sigma_z^{(1)}\sigma_z^{(2)}$ interactions respectively. A preliminary calculation based on bringing a positive charge of 1e to $d_{12}=10$-$20$ a from the qubit gives a value of $\Gamma = 10^{-4}$-$10^{-5}$ (in 45 meV units). This in turn gives a coupled qubit operation time of $T_{12} \approx 0.1$-$1$ ns.

Scaleable N-Qubit Architectures

Based on the two gate configurations presented above, we generalize the SWAP and CPHASE gates to scaled up N-gate architectures.

N-SWAP Gate Architecture

FIG. 13 represents a N-qubit architecture, where the qubits 30 are in the N-SWAP configuration with each qubit 30 oriented parallel in a substrate to create a row of N qubits. Each individual qubit 30 is constructed substantially as set out in the description of the P—P$^+$ charge qubit above, with each qubit 30 having a single electron released from a P atom, a S-gate 36 and a SET 38. Each pair of S-gates 36 and SETs 38 extend out of opposite ends of one qubit 30 in parallel with it. Between each pair of adjacent qubits, and on the ends of the row, a B-gate 34 is provided that extends the length of the qubits and their respective gates. A via-gate 42 is provided in the centre of the B-gate 34 and is in line with the centres of the qubits 30. A further via-gate 43 is provided in the centre of each qubit 30.

N-CPHASE Gate Architecture

FIG. 14 also represents a N-qubit architecture, but the qubits 30 are in an alternate staggered CPHASE configuration. This configuration is substantially identical to that described in FIG. 13, but with two differences. Firstly, the qubits 30, while still in parallel are now arranged on two different levels with the qubits 30 in the row now alternating between the two levels. Secondly, no via-gate is provided in the centre of the B-gates 34.

Quantum Cellular Automata Network

An example of a N-node quantum cellular automa network is depicted in FIG. 15. Each individual qubit 30 is constructed substantially as set out in the description of the P—P$^+$ charge qubit above, with the addition of a via-gate 43 provided in between the two P atoms of each qubit 30. The two rows of qubits 30 are placed on top of one another such that the qubits are also vertically aligned. In this formation, each qubit is placed in the substrate perpendicular to each qubit that it is adjacent to and is not diagonally adjacent. On either side of each qubit 30, a B-gate 34 is also provided.

The inherent scalability of the charge qubit (and indeed the spin qubit) allows one to define a N-qubit quantum cellular automata (NQCA) network, as shown in FIG. 15. The operation of such a device is, not as clear as the NCPHASE or NSWAP networks, however, the design permits general computation in terms of generation of entanglement followed by carefully defined measurement sequences. NQCAs might also be useful in defining heuristic quantum algorithms in local analogies to classical neural networks.

Decoherence: Dissipation and Dephasing

One of the advantages of spin qubits over the pseudo-spin charge qubits is the longer decoherence times expected of spin degrees of freedom in the solid-state. The charge qubit is expected to decohere much faster—however, as the analysis in this proposal have shown the inherent gate operation times are also commensurately faster. Below we give some estimates for times associated with various sources of decoherence, and show that the condition $T_{deco} \gg T_{op}$ for quantum computation can be feasibly maintained. This conclusion is supported by the measurement of the decoherence time in GaAs quantum dots of about 1 ns, which can be considered to be a strong lower bound on the decoherence in the P—P$^+$ case given the fact that the charge qubit is less exposed to environmental fluctuations than GaAs quantum dots.

Phonon Mechanisms:

For typical operational time scales (ns) the energy gap between the qubit states is about $10^{-2}$ meV, which is comparable to the ambient thermal energy of $k_B T=0.0086$ meV at T=100 mK. However, only phonon modes with wavelengths of the order of the electron orbit will couple appreciably. For intra-qubit donor distances (defining the electron orbit size) of R=10 a to 50 a, the corresponding phonon energies are about $10^4$ times larger: $E_{phonon}$=13-67 meV. The occupation of these modes at T=100 mK will be negligible, and so presumably will be their effect on dissipation.

An estimate of the effect of phonons on dephasing can be obtained based on the qubit interacting with an environment of acoustic phonons—represented by a bath of harmonic oscillators (Leggett et al, RMP 1987 etc). We follow the analysis of Tanamoto (PRA 61, (2000) p022305) for the case of quantum dots in a-SiO$_2$. The spectral function J(w) has contributions from Ohmic and super-Ohmic parts; the latter of which is probably the most relevant at T=100 mK, and is given in the Debye approximation by:

$$\frac{1}{4\pi} J_{so}(\omega) = \frac{\gamma^2}{4\pi \hbar \rho c^5} \omega^3.$$

For a tunneling frequency of $\omega_0$ an estimate for the fastest damping rate of the under-damped coherent oscillations with the bath at T=0 is:

$$\Gamma_{so} = \frac{1}{4\pi} J_{so}(\omega_0) = \frac{\gamma^2}{4\pi \hbar \rho c^5} \omega_0^3,$$

where the parameters for Si are $\gamma$=9.5 eV (deformation potential), $\rho$=2329 kg/m$^3$ (density), and c=9.04×10$^3$ m/s (speed of sound). The shortest decoherence time (i.e. not using the renormalized tunneling rate for lack of microscopic physics) is estimated from $T_{phonon}=1/\Gamma_{so}$. Taking a bare tunneling time of $T_{op}$=0.1 ns as our base operational time, we obtain $T_{phonon}$=324 ns, indicating that a large number of gate operations could be performed before phonon induced decoherence becomes an issue.

Gate Fluctuations and Johnson Noise:

The effect of gate fluctuations is expected to be another source of decoherence for the charge qubit. An analysis of Johnson noise can be carried out using the Master equation approach [C. Wellard and L. C. L. Hollenberg, J. Phys. D 35, 2499 (2002)]. Fluctuations in the S and B-gate voltages are introduced stochastically as:

$$\Delta V_S dt = \sqrt{\lambda_S} dW_S(t)$$

$$\Delta V_B dt = \sqrt{\lambda_B} dW_B(t)$$

The factors $\lambda_S$ and $\lambda_B$ scale the fluctuations and are given by the Johnson formula (assuming effective resistance and temperature of the gates are the same):

$$\lambda_{S,B} = \frac{R k_B T}{\pi}.$$

Taking a $\pi/2$ rotation (dominated by the S-gate voltage) as a typical example of a gate operation, the dominant off-diagonal contribution to the density matrix is $$\rho_{od}(t) = e^{-\lambda_S^{-1} \lambda_S \pi t^2 / 2\hbar^2},$$

from which we obtain an estimate of the dephasing time due to Johnson noise in the gates:

$$T_{Johnson} = \frac{2\hbar^2}{R k_B T} \frac{\pi}{X_S^2} \approx \frac{4.3 \times 10^{-4}}{RT} s.$$

For typical operational parameters, T~10 K and R~50Ω, we obtain $T_{Johnson}=O(\mu s)$. It should be noted that typically, a full-scale calculation of the decoherence, which does not rely on the Master equation approach would get a softer dependence for short time.

This analysis agrees with the more detailed approach taken by Barret and Milburn [S. Barrett and G. J. Milburn, cond-mat/0302238]

Charge Traps:

As a result of the fabrication process the inadvertent presence of charge traps is another possible source of unwanted environmental interaction. In particular, traps at the Si/SiO$_a$ interface may be problematic. In the top-down process, the implantation of the P donors will also create traps, however, annealing after P implantation is expected to reduce the density of crystal imperfections to a level where the mean distance between charge traps is much larger than the intra-qubit distance. In many cases, the presence of a charge-trap will give rise to a loss of fidelity rather than decoherence, since the trap is essentially a static modification of the crystal potential. Problems remain, however, if tunneling between traps, or between traps and gates or SETs, can occur on timescales commensurate with the qubit dynamics, since this dynamic process will lead to decoherence.

Readout and Initialization

A basic process for both readout and initialization is outlined below and summarized in FIG. 16. The S-gate 23 is biased to a non-zero value, to define a well known relaxed state 50. The SET 24 is then turned on 51, and the system will either fall in the left 17 or right 18 of the localised states of the double-well potential. While waiting a certain period 52 for the system to relax to a relaxed state, the current of the SET 24 is monitored to determine whether a change in state occurs or not (and compared to previously calibrated values). If the system had initially fallen into the right 18 localised state 53, it will eventually relax to the left 17 localised state 54. Since the state was actually in a localised state prior to this transition, the change in SET current will be detected. Based on whether or not a change of state is detected in the SET current, the initial state of the system can be inferred.

Readout

For definiteness we consider readout of localized qubit states with the S-gate 23 non-zero. A general state at time t will be of the form:

$$|\Psi(t)\rangle = C_L(t)|L\rangle + C_R(t)|R\rangle.$$

We wish to collapse the superposition to $|L\rangle$ or $|R\rangle$, with probabilities $|C_L(t)|^2$ and $|C_R(t)|^2$ respectively. By turning the SET 24 "on" the P—P$^+$ system will decohere strongly due to the fluctuating source-drain current and make a transition in time $T_{SET} \ll T_{dissipation}$ to a statistical mixture of the localized eigenstates. In general this initial change in charge density will not be detected in the SET because one of the amplitudes can be arbitrarily small. Leaving the SET "on" for a further period of order of $T_{dissipation}$ will allow the system to relax to the $|L\rangle$ state if it was in the $|R\rangle$ state after time $T_{SET}$. Since the state was actually in a localised state prior to this transition the change in SET current will be detectable.

Pakes et al have calculated SET sensitivity to a single electron moving over 20 nm in the vicinity of the SET giving rise to a 0.36% change in the single electron charging energy.

Initialization

In the readout scheme as shown in FIG. 16 the S-gate is set such that the $|0\rangle = |L\rangle$ is the lower state into which the dissipative process moves the system. The process of initialization to the $|0\rangle$ state is then essentially the same as the readout process. By monitoring the SET current it would be possible to confirm that initialization had been successfully completed.

A similar process of pre-initialization of the charge qubit itself after fabrication of the two donor system would be required to remove one of the electrons. The S-gate voltage would have to be higher in order to ensure an ionization event to the continuum takes place.

Nanofabrication of Donor Arrays

While the use of phosphorus as an electron donor within a silicon substrate is standard in the microelectronics industry, controlled doping of a semiconductor device at the atomic level, as required for the charge qubit described here, is yet to be demonstrated, although recent developments in the fabrication of Si:P spin qubit devices indicate that such precision doping is close at hand. As with Si:P charge qubits, Si:P spin qubits require buried arrays of phosphorus donors with inter-donor spacings in the range 20-50 nm. Due to the weaker nature of the electron-mediated nuclear spin interaction, nuclear spin devices, require very small donor spacings of order 20 nm and may also require positioning accuracy of up to one atomic diameter (0.5 nm) In contrast, a P—P$^+$ charge qubit with an intra-qubit donor spacing R=60 nm still has a single-qubit operation time of 1 MHz and this can be made faster with the application of a positive B-gate voltage. Furthermore, due to the long-range nature of the Coulomb interaction, the inter-qubit donor spacing can be made large, possibly up to $d_Q$~100 nm.

Fabrication of metallic and polymer resist features on the level 20-50 nm is achieveable using existing semiconductor lithographic approaches such as electron beam lithography and, more recently, extreme-ultra-violet (EUV) lithography. Such techniques, when combined with ion implantation, provide a top-down approach to array fabrication.

The primary limitation of top-down array fabrication is inaccuracy of P donor placement due to the statistical phenomenon of ion straggle. While such errors can probably be corrected by appropriate calibration of the control gate voltages a preferred option is to use a bottom-up fabrication approach, which offers atomic-level positional accuracy. Both the top-down and bottom-up approaches were developed for the fabrication of Si:P spin qubit devices and a review is given in A. S. Dzurak et al., Quantum Information and Computation 1, 82 (2001).

Although the discussion below refers to controlled doping of Si with P, it is applicable, with minor modifications, to the doping of Si with any atom capable of acting as a single electron donor, such as other group-V elements including arsenic and antiminum. It is also possible to envisage the use of an alternate charge neutral background matrix, such as gallium arsenide, with an appropriate single electron donor, such as silicon.

Top-Down Fabrication

Top-down fabrication approaches involve the patterning of larger structures using lithographic techniques. For the creation of P—P$^+$ donor arrays in Si we must fabricate a mask structure, capable of blocking the entry of P$^+$ ions of energy 1-20 keV, with appropriately spaced holes allowing entry of the P$^+$ ions at the desired array positions. Electron-beam sensitive organic resists (such as poly-methyl-methacrylate—PMMA) with thicknesses in the range 20-200 nm are capable of blocking keV ions. These organic resists may also be patterned using high-resolution electron beam lithography (EBL) to create via holes with diameters below 10 nm. Metallic surface gate structures of thickness 20-50 nm are also capable of blocking keV ions and can be combined with organic resists in composite mask structures. Such approaches are capable of producing 10 nm via holes with centre-to-centre spacings (R) down to around 30 nm. Larger spacings of R~100 nm are easily achievable. It is therefore possible to create masks for the implantation of any desired P—P$^+$ charge qubit array.

Once a mask structure with an appropriate array of small apertures has been created, one ion must be delivered to each cell in the array. It is therefore necessary to localise (or focus) the ion beam to a diameter smaller than the required donor spacing R. The localised beam would be moved from one cell to the next after a single P ion had been delivered, in a step-and-repeat approach ["Method and system for introducing an ion into a substrate", PCT/AU02/01150].

One way to achieve such ion beam localisation is through the use of a phosphorus focused ion beam (FIB) system. The same FIB system used to deliver the P ions could also be used to image registration markers on the chip, so as to ensure that ions are delivered accurately at the array sites. Alternatively the P$^+$ beam may be localised by collimating it with a nanomachined aperture in a mask that can be moved accurately with respect to the sample. If the nanomachined aperture is machined from the cantilever of a scanned-probe atomic force microscope (AFM) system, the AFM could be used to locate the array sites and then offset appropriately to position its aperture at the relevant cell.

Once the ion beam has been positioned at the appropriate cell, using either a FIB or nanomachined cantilever, the beam flux must be controlled so that only one P$^+$ ion enters the substrate. Such single ion implantation control can be achieved by utilising on-chip ion impact detectors, capable of electrically registering the entry of a single ion into the Si substrate. When an ion passes through an aperture at an array site and enters the substrate, it will dissipate its energy partly through the creation of electron-hole pairs in the i-Si. The electrons and holes will drift in the applied electric field, resulting in a current pulse in a circuit connected to the detector electrodes. Once one of these pulses is detected, associated circuitry can be used to blank the ion beam, limiting the implantation to just one ion. $P^+$ ions of 10-20 keV, the energy range required to implant donors at depths of ~10 nm, will produce somewhat smaller pulses, due the increased nuclear stopping coefficient for heavier ions.

In order to create the ion-stopping mask containing a nanoscale aperture array, a variety of approaches may be employed. We will discuss these with reference to the construction of a very simple array, containing just two donors (ie. a single charge qubit). Here we consider three approaches, with an increasing degree of accuracy and corresponding process complexity.

The first approach is to form the aperture array (in this case comprising only two apertures) in a single layer of organic resist, such as PMMA, using electron beam lithography (EBL). On-chip detectors are used to register the entry of just two 15 keV $P^+$ ions into the substrate. Following ion implantation the sample is annealed to a temperature of 900 C or above, to remove lattice damage and activate the two P donors. Next, an array of metallic electrodes are fabricated above the donor positions, using EBL and standard metal lift-off. These electrodes serve as the S-gates and B-gates for the charge qubit. Any metal combination capable of lift-off may be used for the gates, such as a Ti/Au bilayer of thicknesses 20 nm/40 nm. Finally, two single electron transistor (SET) devices are fabricated close to the donor sites. These SETs will be used to detect the electron position. The SETs are made from Al, with $Al_2O_3$ tunnel barriers, and are fabricated using EBL with a standard bilayer resist (PMMA/Copolymer) and double-angle shadow evaporation process.

Using the first approach, alignment of the S- & B-gates, and of the SETs, to the donor positions is achieved by registering each stage of EBL to a series of alignment markers deposited on the sample at the start of the process. The accuracy of EBL alignment is system specific and depends on the electron beam spot size and type of alignment marker. In practical terms accuracy better than 20 nm is challenging, however, there is no fundamental reason why accuracies as small as the spot size (below 2 nm on some systems) cannot be achieved. The fact that this approach requires two post-alignment steps means that it will have inherent misalignment accuracies. This will mean that the B- and S-gate voltages for charge qubit operation will need to be determined for each device, using an appropriate calibration procedure.

An example of a one qubit, two P donor device, fabricated by the above method, is shown in FIG. 21. The device has two SETs. By cross-correlating the current from both SETs it is possible to reject spurious signals and confirm true electron transfer between donors. The five gates at bottom are used as B and S-gates and the gate-width of 20 nm allows for an inter-donor spacing, R=60 nm. The alignment between control gates and SETs in this device is better than 20 nm in both x and y directions. This device has about 100 P donors implanted at each site, however, this number can be reduced to one donor per site. The device demonstrates that the architecture described here is physically realisable.

Another example of a one qubit, two P donor device, fabricated by a very similar method, is shown in FIG. 22 and is described further in A. S. Dzurak et al., cond-mat/0306265 (2003). In contrast with the device in FIG. 21, this device uses two coupling electrodes made of Ti/Au metal which are evaporated in the same step as the three control gates (S,B,S). These couplers then connect to the island electrodes of two $Al/Al_2O_3$ SETs in such a way as to provide maximal coupling between the buried P donors and the SETs. The device has registration between buried P donors and surface gates of 50 nm or better. The ends of the coupling electrodes are nominally positioned directly above the buried donors to maximise capacitive coupling. The two SETs on the device are made using a standard $Al/Al_2O_3$ technology. FIG. 22(b) is an expanded view of the central region. This device has two buried clusters of implanted P donors, each with 600 P atoms per cluster, separated by 80 nm. Quasi-periodic electron transfer between the two P-atom clusters, controlled by the surface S-gates, has been demonstrated in these devices, and these electron transfers has been detected by the two SETs on the surface in coincidence measurements. Similar devices have been constructed which have only two P atoms, one at each site, where the P atoms have been configured using electrically-registered single-ion implantation, as described above.

Increased donor positioning accuracy can be achieved using a second, self-alignment approach, as described in R. P. McKinnon et al., *Smart Materials and Structures* 11, 735 (2002). This approach uses the metal S- and B-gates themselves as part of the ion implant mask. Firstly, on-chip ion detectors are fabricated for implant registration. Following this the S- and B-gates are deposited, using EBL and metal lift-off. The sample is then coated with a layer of organic resist (such as PMMA) and a single cross-line is exposed in the PMMA using EBL. Following development of the cross-line, two apertures are produced for ion implantation. Once again, the on-chip detectors are used to limit implantation to only two ions, and then the sample must be annealed to remove damage. Because this anneal step occurs with the control gates in place it places a stringent requirement on the choice of gate-metal. The metal must have a very low diffusion rate through the thin (<5 nm) $SiO_2$ barrier layer at high temperatures of order 900 C. This issue is also of critical importance for the fabrication of MOSFETs with very thin gate oxides for VLSI applications and a number of candidate metals, including W and Ta, have been proposed which have low diffusivities at high temperature. Following the anneal step two SETs are fabricated on the device using an identical process to that described for approach 1. Here the SETs may suffer some misalignment, but this will only modify their charge detection sensitivities.

In a third approach, perfect self-alignment between implanted donors, control gates and readout SETs may be achieved using a trilayer resist process, described previously in T. M. Buehler et al., *Nanotechnology* 13, 686 (2002). Once again, the first step involves the fabrication of on-chip ion detectors. Next, a single line is exposed using EBL in a single layer non-organic resist, such as PMGI, and then developed. This line defines the locus of points where the implanted donors will lie. Following this, a standard bilayer resist (PMMA/Copolymer) is coated above the patterned PMGI, and a second pattern for the gates and SETs is exposed using EBL. The bilayer is then partially developed to open apertures for ion implantation only where the two patterns intersect. Following controlled implantation, limited to only two donors using the on-chip detectors, the bilayer is fully developed to open a cavity in the middle layer and the lower layer of PMGI is fully removed. The gates and SETs are then deposited by evaporating metal through the remaining resist structure from three-separate angles, using a shadow evaporation approach. In this way, the SETs are perfectly aligned to the control gates, and hence the donors. The most established way of fabricating SETs by shadow evaporation is using Al metal, and oxidizing this in a controlled way to form $Al_2O_3$ tunnel barriers. A drawback of this fully aligned approach is that the annealing step, required to remove implant damage, must be performed following the gate and SET deposition. High temperature anneals above 500 C are likely to result in damage of thin $Al_2O_3$ tunnel barriers, while anneals up to 900 C will lead to diffusion of Al through the $SiO_2$ barrier layer. The development of SETs using different metals, with much lower diffusion would therefore be required. Alternatively, a lower temperature annealing process would need to be established.

We note that the fabrication of a two donor device using the first or second approach is already possible. Although the localisation of the implanting ion beam to single sites has not yet been achieved, the use of a standard blanket (unfocused) implant will lead to a 50% yield of ideally-configured devices, with one P donor at each of the two sites. This yield is acceptable for demonstration purposes and makes possible immediately the demonstration of a single charge qubit.

Bottom-Up Fabrication

The bottom-up strategy utilises both scanning tunnelling microscopy (STM) and molecular beam epitaxy (MBE) to create a P qubit array in Si, and does not suffer from the problems of ion implantation straggle and substrate damage that are inherent to the top-down approach. The bottom-up strategy is a four-stage process. Firstly, a clean Si(001) surface is passivated with a monolayer of H. This "H-resist" layer is subsequently patterned at the level of removing individual H atoms from the surface by applying controlled voltage pulses to an STM tip in tunnelling contact with the surface. The third stage of the process is to expose the patterned H-resist surface to phosphine ($PH_3$) gas, allowing individual $PH_3$ molecules to bond with the exposed sites of bare Si. The final step in the process is to use MBE to overgrow layers of Si and encapsulate the fabricated P array. Such STM based hydrogen lithography has previously been proposed for the assembly of atomically-ordered device structures; in particular for the fabrication of single-electron integrated circuits.

A completely defect-free area of a low defect density Si(001) surface is optimally-prepared using a standard thermal treatment, described previously. In the Si(001)2×1 surface there are rows of paired Si—Si atoms (dimers). After exposure to atomic H at a substrate temperature of ~600 K a near uniform coverage of the monohydride phase, where one H atom bonds to each Si atom, occurs. Should a combination of monohydride and dihydride phases occurs (i.e., one monohydride dimer adjacent to a single dihydride species) we get, a H:3×1 reconstruction. A surface of purely monohydride phase can be formed by using a slightly higher substrate temperature during H-dosing.

An area of a hydrogen passivated Si(001) surface can be patterned using an STM tip. In particular, two hydrogen atoms can be removed from this surface by "pulsing" an STM tip to −7 V and 1 nA for ~1 ms at two locations above the H passivated surface. These pulses have caused the desorption of two individual H atoms from the surface, exposing two surface Si atoms. Each of these Si atoms has an electron in a "dangling bond" orbital. The dangling bonds present reactive sites for the adsorption of chemical species such as phosphine—in fact the sticking coefficient of $PH_3$ to the clean silicon surface is very close to unity. The effectiveness of the H resist as a barrier to phosphine adsorption is demonstrated by the uniform H coverage after $PH_3$ dosing except at the previously desorbed sites. There is a characteristic increase of ~0.05 nm in the height of the protrusion after phosphine dosing. This increase, which was seen reproducibly at a number of sites, confirms the adsorption of a $PH_3$ molecule and corresponds to the difference between the exposed silicon dangling bond and the adsorbed phosphine.

The final step, currently underway, is the encapsulation of the phosphorus qubits in a crystalline lattice of silicon. The main difficulty in this step is to ensure the P atoms incorporate into the Si crystal and remain in an ordered array. The most direct route to achieving this is to desorb the H resist from the surface by heating to ~825 K followed by epitaxial Si growth over the P array. A possible concern with this level of heating is the potential to induce lateral surface diffusion of the P atoms in the array. However there is evidence that the phosphorus atom in $PH_x$ (x=2,3) molecules, which has a single bond to the silicon, incorporates into the silicon=surface over the lower temperature range of 620-720 K.

Experimental Demonstration of Single Qubit Rotation

We now describe an experimental demonstration of the ability to perform and measure using SETs, a single qubit rotation with a P—$P^+$ charge qubit. This experiment is also used to determine the coherence time $T_2$ of the qubit. It is a direct analogue of the landmark experiment performed by Nakamura et al [Y. Nakamura, Y. A. Paskin and J. S. Tsai, Nature 398, 786 (1999)] to measure quantum oscillations in superconducting qubits.

The experiment requires an ability to measure the transfer of a single electron charge between two P donors on a timescale shorter than the relaxation time of the system, $T_{dissipation}=T_1$. This measurement can be made significantly more reliable by using the cross-correlated outputs of two SETs, as described by Buehler et al [T. M. Buehler et al., cond-mat/0207597 (2002)]. An example of a twin-SET device used for such cross-correlation measurements is shown in FIG. 18. FIG. 19 shows data obtained using this device, which shows that both SETs respond to the transfer of single electrons between two metallic islands located between the SETs. Of particular note is the fact that the SETs are measuring the charge transfer in a "single shot" measurement, and that the measurements are occurring on the microsecond timescale.

The limitation on the speed of SET charge position readout is set by the shot-noise within the SET, and corresponds to a minimum required read-out time $t_{min}$, given by $(t_{min})^{1/2}=1.2\times10^{-6}$ e/$\Delta q$, where $\Delta q$ is the change of charge that is detected. Based on measurements obtained by Buehler et al (2002), we find $t_{min}=10$ ns for our P—$P^+$ system. This is confirmed experimentally, as shown in FIG. 20, which shows that equivalent values of $\Delta q$ to our P—$P^+$ system, when simulated using the device of FIG. 18, can be detected on timescales of around 100 ns. We note that we expect relaxation times $T_{dissipation}$ to exceed this timescale by an order of magnitude, or greater.

The proposed experiment to perform coherent qubit rotations, and read-out the result, is described schematically in FIG. 17.

In this proposed experiment a single P—$P^+$ qubit is carefully controlled by the external S and B gates, and measured at precisely defined intervals to determine the effect of decoherence on the quantum evolution of the system. In order to describe the physics of the experiment we will concentrate on an ideally fabricated P—$P^+$ qubit as shown in FIG. 3a.

The experiment is carried out in several stages.

Stage 1: Localisation/Initialization

At initial time T=0, the S-gate is set at or near the point $S_0=-0.1$ V (or lower), which will localise the electron in the left eigenstate $|\Psi(T=0)\rangle=|L\rangle$.

Stage 2: S-Gate Pulse

If we now pulse the S-gate swiftly to zero, with a fall-time of $T_{fall}$ (assumed to be short), the system is forced into a superposition of the $S_0=0$ eigenstates (symmetric and anti-symmetric states):

$$|\Psi(T_{fall})\rangle = |L\rangle = \frac{1}{\sqrt{2}}(|S\rangle + |A\rangle).$$

Stage 3: Rabi Evolution

While $S_0=0$ the system is allowed to evolve through its natural Rabi transitions $|S\rangle \leftrightarrow |A\rangle$ for a time $T_{pulse}$. The state becomes:

$$|\Psi(T_{fall} + T_{pulse})\rangle = \frac{1}{\sqrt{2}}(e^{-iE_S T_{pulse}/\hbar}|S\rangle + e^{-iE_A T_{pulse}/\hbar}|A\rangle)$$

$$= \frac{1}{\sqrt{2}} e^{-iE_S T_{pulse}/\hbar}(|S\rangle + e^{-i\Delta E_{SA} T_{pulse}/\hbar}|A\rangle).$$

Stage 4: S-Gate Pulse

The S-gate is pulsed swiftly back to the original T=0 value over a time $T_{rise}$, and the state, in terms of the localized $S_0 \neq 0$ eigenstates, becomes:

$$|\Psi(T_{fall} + T_{pulse} + T_{rise})\rangle =$$

$$\frac{1}{\sqrt{2}} e^{-iE_S T_{pulse}/\hbar} \left( \frac{1}{\sqrt{2}}[|L\rangle + |R\rangle] + e^{-i\Delta E_{SA} T_{pulse}/\hbar} \frac{1}{\sqrt{2}}[|L\rangle - |R\rangle] \right) =$$

$$\frac{1}{2} e^{-iE_S T_{pulse}/\hbar} ([1 + e^{-i\Delta E_{SA} T_{pulse}/\hbar}]|L\rangle + [1 - e^{-i\Delta E_{SA} T_{pulse}/\hbar}]|R\rangle)$$

As long as $T_{pulse} \gg T_{fall/rise}$ we obtain essentially a state of the form:

$$|\Psi(T_{fall}+T_{pulse}+T_{rise})\rangle = C_L(T_{pulse})|L\rangle + C_R(T_{pulse})|R\rangle.$$

Stage 5: Measurement

Switching on the SET and measuring the state will give a left or right localized state as determined by the distributions:

$$P_{L,R}(T_{pulse}) = |C_{L,R}(T_{pulse})|^2 = 2\left[1 \pm \cos\frac{\Delta E_{SA} T_{pulse}}{\hbar}\right].$$

Repeating the process many times for each $T_{pulse}$ will result in a measurement of the Rabi oscillations, and the decoherence time.

The hierarchy of time scales is important to consider. The controlling scale is of course the decoherence time. Although we do not know this before the measurement, we expect this to be of the order of 1-10 ns based on the GaAs measurement. Taking this range as our lower bound, we therefore require $T_{Rabi} < 1$ ns in order to see Rabi oscillations. If we use the Nakamura experimental parameters as a guide, we can set $T_{Rabi} = 100$ ps and use fast pulse generators with $T_{rise/fall} = 30$ ps.

To the extent that we have described single qubit dynamics in section 2 a time dependent analysis can be carried out on the results expected from realistic pulse shapes. Furthermore, the first P–P⁺ devices will not be ideally or symmetrically gated and will require detailed characterization, possibly using an extra S-gate.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A quantum device, comprising:
an electrically inert solid semiconductor substrate within which there is;
a charge qubit comprising a pair of dopant atoms having a net charge and an electric field having two potential wells, wherein the two potential wells are located adjacent respective dopant atoms;
and wherein a location of the net charge in the electric field having two potential wells defines a logical state of the charge qubit;
and wherein a first gate is located over a potential barrier between the two potential wells to control a barrier height; and
at least one second gate is located to control relative shapes and sizes of the two potential wells, wherein the semiconductor substrate and the dopant atoms are selected to create a system equivalent to an artificial $H_2^+$ molecule.

2. A quantum device according to claim 1, wherein the logical state of the charge qubit is defined by a the location of a single electron in one of the two potential wells.

3. A quantum device according to claim 1, wherein the logical state of the charge qubit is defined by lowest symmetric or antisymmetric molecular states.

4. A quantum device according to claim 1, wherein spacing between the dopant atoms is up to 200 nm.

5. A quantum device according to claim 4, wherein the spacing between the dopant atoms is in a the range of 20 to 100 nm.

6. A quantum device according to claim 1, wherein the two dopant atoms are buried in the substrate to a depth up to 200 nm.

7. A quantum device according to claim 6, wherein the two dopant atoms are buried in the substrate to a depth in a range of 5 to 50 nm.

8. A quantum device according to claim 1, wherein the semiconductor substrate is coated with an insulating layer.

9. A quantum device according to claim 8, wherein the insulating layer is $SiO_2$.

10. A quantum device according to claim 1, wherein gate electrodes are placed on a surface of the substrate above the dopant atoms to allow for external control of charge wavefunctions, wherein the first gate is a 'barrier' gate or B-gate.

11. A quantum device according to claim 10, wherein the at least one second gate is a 'potential off-set', 'symmetry' or S-gate.

12. A quantum device according to claim 11, wherein suitable biasing of the first and second gates allows one qubit logic operation to be performed.

13. A quantum device according to claim 9, wherein one or more charge detection devices are provided on a surface of the substrate for charge qubit readout and to confirm initialization of the charge qubit.

14. A quantum device according to claim 13, wherein the one or more charge detection devices is a sensitive field-effect transistor or a single electron transistor (SET).

15. A quantum device according to claim 1, wherein a configuration comprising two dopant atoms, surface gates and surface charge detection devices is repeated many times on a single silicon chip, allowing for scale-up to a many charge qubit processor.

16. A quantum device according to claim 15, wherein the device is cooled to ensure that the dopant atoms are not thermally ionized and to minimize coupling of the charge qubits to an environment.

17. A quantum device according to claim 16, wherein the device is cooled to 4K or below.

* * * * *